(12) United States Patent
Funaki et al.

(10) Patent No.: US 6,806,335 B2
(45) Date of Patent: Oct. 19, 2004

(54) POLYMERIC COMPOUND AND RESIN COMPOSITION FOR PHOTORESIST

(75) Inventors: Yoshinori Funaki, Himeji (JP); Kiyoharu Tsutsumi, Himeji (JP); Akira Takaragi, Himeji (JP)

(73) Assignee: Daicel Chemical Industries, Ltd., Osaka (JP)

( * ) Notice: Subject to any disclaimer, the term of this patent is extended or adjusted under 35 U.S.C. 154(b) by 0 days.

(21) Appl. No.: 10/375,129

(22) Filed: Feb. 28, 2003

(65) Prior Publication Data

US 2004/0006189 A1 Jan. 8, 2004

Related U.S. Application Data

(63) Continuation of application No. 09/937,910, filed as application No. PCT/JP01/00515 on Jan. 26, 2001, now Pat. No. 6,552,143.

(30) Foreign Application Priority Data

Feb. 1, 2000 (JP) ........................................ 2000-024527

(51) Int. Cl.[7] .............................................. C08F 124/00
(52) U.S. Cl. ....................... 526/268; 526/266; 526/270; 526/271; 526/280; 526/281; 526/284; 430/270.1
(58) Field of Search ................................ 526/266, 268, 526/270, 271, 280, 281, 284; 430/270.1

(56) References Cited

U.S. PATENT DOCUMENTS 6,063,542 A    5/2000  Hyeon et al.
6,103,845 A    8/2000  Choi et al.
6,114,084 A    9/2000  Kang et al.

FOREIGN PATENT DOCUMENTS

| GB | A2332679 | 6/1999 |
|----|----------|--------|
| JP | 07252324 A | 3/1995 |
| JP | 2776273 B2 | 5/1998 |
| JP | A10218941 | 8/1998 |
| JP | 11-109632 | 4/1999 |
| JP | A11305444 | 11/1999 |
| JP | A11352693 | 12/1999 |

OTHER PUBLICATIONS

N.G. Gaylord et al., J. Polym. Sci., Polymer Letters Edition, vol. 14, pp. 555–559, 1976.

*Primary Examiner*—Helen L. Pezzuto
(74) *Attorney, Agent, or Firm*—Birch, Stewart, Kolasch & Birch, LLP

(57) ABSTRACT

A photoresist polymeric compound includes a monomer unit represented by following Formula (I):

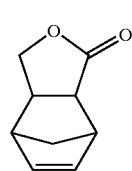

(I)

The polymeric compound may further include at least one of monomer units represented by Formulae (IIa) to (IIg) as described in the specification. The photoresist polymeric compound can exhibit high adhesion to substrates and can highly precisely form fine patterns.

9 Claims, No Drawings

POLYMERIC COMPOUND AND RESIN COMPOSITION FOR PHOTORESIST

This application is a continuation of application Ser. No. 09/937,910, filed on Oct. 19, 2001 now U.S. Pat. No. 6,552,143 and for which priority is claimed under 35 U.S.C. § 120. Application Ser. No. 09/937,910 is the national phase of PCT International Application No. PCT/JP01/00515 filed on Jan. 26, 2001 under 35 U.S.C. § 371. This application also claims priority of application Ser. No. 24527/2000 filed in Japan on Feb. 1, 2000 under 35 U.S.C. § 119. The entire contents of each of the above-identified applications are hereby incorporated by reference.

TECHNICAL FIELD

The present invention relates to a polymeric compound for photoresist, to a resin composition for photoresist containing the polymeric compound, and to a method of manufacturing a semiconductor. Such photoresists are for use in, for example, fine patterning of semiconductors.

BACKGROUND ART

Positive photoresists for use in manufacturing processes of semiconductors must concurrently have different characteristics such as a characteristic that exposed portions become soluble in alkali by light irradiation, adhesion to silicon wafers, plasma-etching resistance, and transparency to light used. The positive photoresists are generally used as a solution containing a base component polymer, a light-activatable acid generator, and several types of additives for controlling the above characteristics. It is very important for the base component polymer to have the above individual characteristics in balance in order to prepare an appropriate resist in accordance with its use.

The wavelength of a lithographic light source for use in the manufacture of semiconductors becomes shorter and shorter in recent years, and ArF excimer laser with a wavelength of 193 nm is promising as a next-generation light source. The use of a unit containing an alicyclic hydrocarbon skeleton has been proposed as a monomer unit for a resist polymer for use in the ArF excimer laser exposure system (e.g., Japanese Patent No. 2776273). Such alicyclic hydrocarbon skeletons are highly transparent with respect to light with the aforementioned wavelength and are resistant to etching. The use of a polymer having an adamantane skeleton as a resist polymer is also known, which adamantane skeleton exhibits especially high etching resistance among alicyclic hydrocarbon skeletons. However, such alicyclic hydrocarbon skeletons are highly hydrophobic and therefore exhibit low adhesion to substrates, although they have high etching resistance as mentioned above. To relieve this disadvantage, the aforementioned Japanese patent therefore proposes copolymers containing a highly hydrophilic monomer unit (an adhesion-imparting monomer unit) having, for example, a carboxyl group or a lactone ring. However, even these polymers do not always have sufficient adhesion to substrates. Additionally, the monomer units are not resistant to etching, and the etching resistance of the entire polymer becomes insufficient when the polymer contains such a sufficient amount of the monomer unit as to satisfy the required adhesion.

Japanese Unexamined Patent Application Publication No. 11-109632 makes an attempt to impart hydrophilicity to a polymer by introducing a hydroxyl group to an adamantane skeleton. However, if adhesion is improved by action of a hydroxyl-group-containing monomer unit alone, an alkali developer generally makes the resulting resist film swell, thus frequently inviting flexure or waviness in the resulting pattern.

DISCLOSURE OF INVENTION

Accordingly, an object of the present invention is to provide a polymeric compound for photoresist, which can satisfactorily adhere to substrates and can form fine patterns with high precision.

Another object of the present invention is to provide a polymeric compound for photoresist, which can satisfactorily adhere to substrates and has satisfactory transparency, alkali-solubility and etching resistance.

A further object of the present invention is to provide a resin composition for photoresist and a method of manufacturing a semiconductor, which can form fine patterns with high precision.

After intensive investigations to achieve the above objects, the present inventors have found that, when a polymer containing a monomer unit that has an alicyclic skeleton of a specific structure having a lactone ring is used as a photoresist resin, the resulting photoresist resin has markedly improved adhesion to substrates, is resistant to swelling in a developer and can form fine patterns with high precision. The present invention has been accomplished based on these findings.

Specifically, the present invention provides a polymeric compound for photoresist, which includes a monomer unit represented by following Formula (I):

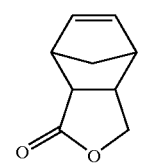

(I)

The polymeric compound may include the monomer unit represented by Formula (I) and at least one selected from monomer units represented by following Formulae (IIa) to (IIg):

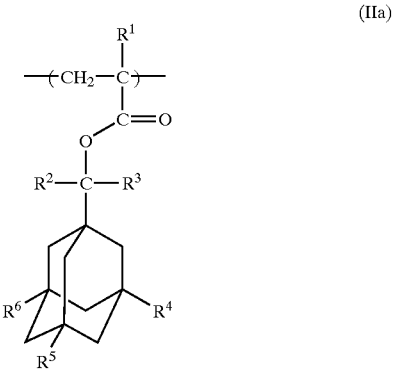

(IIa)

-continued

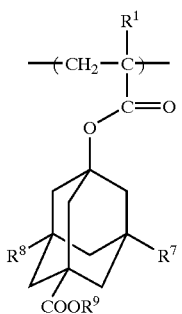
(IIb)

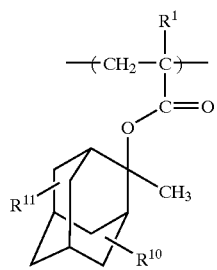
(IIc)

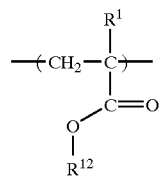
(IId)

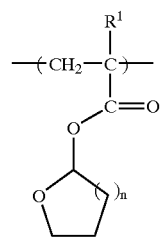
(IIe)

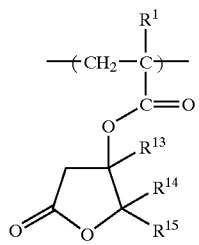
(IIf)

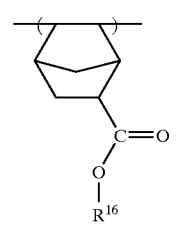
(IIg)

wherein $R^1$ is a hydrogen atom or a methyl group; $R^2$ and $R^3$ are the same or different and are each a hydrocarbon group having from 1 to 8 carbon atoms; $R^4$, $R^5$ and $R^6$ are the same or different and are each a hydrogen atom, a hydroxyl group or a methyl group; $R^7$ and $R^8$ are the same or different and are each a hydrogen atom, a hydroxyl group or a —COOR$^9$ group, where $R^9$ is a t-butyl group, a 2-tetrahydrofuranyl group, a 2-tetrahydropyranyl group or an 2-oxepanyl group; $R^{10}$ and $R^{11}$ are the same or different and are each a hydrogen atom, a hydroxyl group or an oxo group; $R^{12}$ is a hydrocarbon group having a tertiary carbon atom at a bonding site with an oxygen atom indicated in the formula; $R^{13}$, $R^{14}$ and $R^{15}$ are the same or different and are each hydrogen atom or a methyl group; $R^{16}$ is a t-butyl group, a 2-tetrahydrofuranyl group, a 2-tetrahydropyranyl group or an 2-oxepanyl group; and n denotes an integer from 1 to 3.

The polymeric compound may further include at least one selected from monomer units represented by following Formulae (IIIa) to (IIIg):

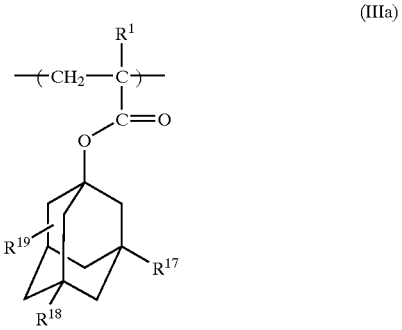
(IIIa)

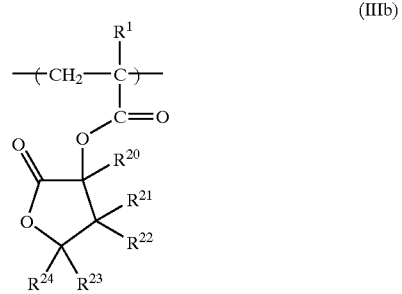
(IIIb)

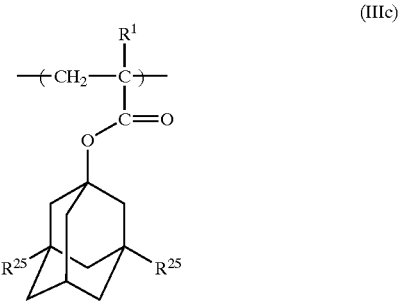
(IIIc)

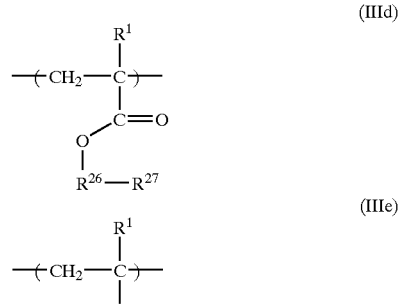
(IIId)

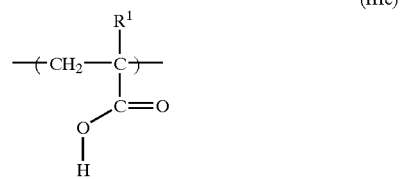
(IIIe)

-continued (IIIf)

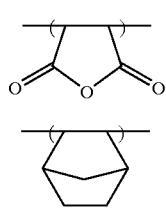

(IIIg)

wherein $R^1$ is a hydrogen atom or a methyl group; $R^{17}$ and $R^{18}$ are the same or different and are each a hydrogen atom, a hydroxyl group or a carboxyl group; $R^{19}$ is a hydroxyl group, an oxo group or a carboxyl group; $R^{20}$, $R^{21}$, $R^{22}$, $R^{23}$ and $R^{24}$ are the same or different and are each a hydrogen atom or a methyl group; $R^{25}$ is a hydrogen atom or a methyl group; $R^{26}$ is a tricyclo[5.2.1.0$^{2,6}$]decylmethyl group, a tetracyclo[4.4.0.1$^{2,5}$.1$^{7,10}$] dodecylmethyl group, a norbornyl group, an isobornyl group or a 2-norbornylmethyl group; and $R^{27}$ is a substituent of $R^{26}$ and is a hydrogen atom, a hydroxyl group, a hydroxymethyl group, a carboxyl group or a —COOR$^{28}$ group, where $R^{28}$ is a t-butyl group, a 2-tetrahydrofuranyl group, a 2-tetrahydropyranyl group or an 2-oxepanyl group.

The present invention further provides a resin composition for photoresist, which includes the polymeric compound for photoresist and a light-activatable acid generator. In addition, the present invention provides a method of manufacturing a semiconductor, which method includes the steps of applying the resin composition for photoresist onto a base or substrate to thereby form a resist film, and subjecting the resist film to exposure and development to thereby produce a pattern.

In the present description, the terms "acrylic" and "methacrylic" may be generically referred to as "(meth) acrylic", and the terms "acryloyl" and "methacryloyl" may be generically referred to as "(meth)acryloyl".

BEST MODE FOR CARRYING OUT THE INVENTION

Polymeric compounds for photoresist of the present invention comprise the monomer unit (constitutional repeating unit) represented by Formula (I) (hereinafter referred to as "Monomer Unit 1"). Monomer Unit 1 has a highly hydrophilic lactone ring and improves adhesion to substrate to thereby serve as a unit for imparting adhesion. It also has an alicyclic carbon ring (a norbornane ring), has the function of improving etching resistance and is resistant to swelling in an alkali developer. By using appropriate polymerizable monomers having the function of being soluble in alkali, the function of being resistant to etching, and other functions as comonomers in production of polymers, the resulting polymers have necessary functions as resists. Such polymers containing Monomer Unit 1 can be advantageously used as photoresist resins.

A polymeric compound as a preferred embodiment of the present invention includes the monomer unit represented by Formula (I) and at least one monomer unit (a constitutional repeating unit) (hereinafter referred to as "Monomer Unit 2") selected from those represented by Formulae (IIa) to (IIg). In the monomer unit represented by Formula (IIa), an acid causes a moiety containing an adamantane skeleton to eliminate from a carboxylic acid moiety combined with a principle chain to thereby form a free carboxyl group. In the monomer unit represented by Formula (IIb), a carboxyl group is combined with the adamantane skeleton and is protected with a protective group, and an acid causes the carboxyl group to deprotect to thereby form a free carboxyl group. In the monomer unit represented by Formula (IIc), an acid causes an adamantane skeleton to eliminate from a carboxylic acid moiety combined with a principle chain to thereby form a free carboxyl group. Additionally, in the monomer units represented by Formulae (IId), (IIe), (IIf) and (IIg), an acid causes a carboxylic ester moiety to decompose and eliminate to thereby form a free carboxyl group. Accordingly, Monomer Unit 2 acts as an alkali-soluble unit that makes the resulting resin soluble in development with an alkali.

The monomer units represented by Formulae (IIa), (IIb), (IIc) and (IIg) each have an alicyclic carbon skeleton, have satisfactory transparency and are very highly resistant to etching. Monomer units of Formula (IIa) where at least one of $R^4$ to $R^6$ is a hydroxyl group, and monomer units represented by Formula (IIf) are highly hydrophilic and also have the function of adhering.

In Formula (IIa), hydrocarbons each having from 1 to 8 carbon atoms in $R^2$ and $R^3$ include, but are not limited to, methyl, ethyl, propyl, isopropyl, butyl, isobutyl, s-butyl, pentyl, isopentyl, 1-methylbutyl, 1-ethylpropyl, hexyl, isohexyl, 1-methylpentyl, 1-ethylbutyl, heptyl, 1-methylhexyl, octyl, 1-methylheptyl and other $C_1$–$C_8$ alkyl groups; cyclopropyl, cyclopentyl, cyclohexyl, cycloheptyl, cyclooctyl and other $C_3$–$C_8$ cycloalkyl groups; and phenyl group. Among these groups, methyl, ethyl, isopropyl and other $C_1$–$C_3$ alkyl groups are preferred.

In Formula (IId), the "hydrocarbon group having a tertiary carbon atom at a bonding site with an oxygen atom indicated in the formula" in $R^{12}$ includes, but is not limited to, t-butyl group and t-amyl group.

The invented polymeric compounds for photoresist may further comprise at least one monomer unit (a constitutional repeating unit) (hereinafter referred to as "Monomer Unit 3") selected from monomer units represented by Formulae (IIIa) to (IIIg), in addition to Monomer Unit 1 or to Monomer Units 1 and 2.

The monomer unit represented by Formula (IIIa) has a highly hydrophilic group (a hydroxyl group, carboxyl group or oxo group) combined with an adamantane skeleton and therefore plays a role of improving adhesion to substrates. Additionally, the monomer units represented by Formulae (IIIa), (IIIc), (IIId) and (IIIg) each have an alicyclic carbon skeleton and are conductive to the improvement in, for example, transparency and etching resistance. The monomer unit represented by Formula (IIIb) having a lactone skeleton and the monomer units represented by Formulae (IIIe) and (IIIf) each have a hydrophilic group and have the function of imparting adhesion. As thus described, these monomer units can impart various functions based on the structures thereof to polymers, and the resulting polymers comprising each of the monomer units can have finely controlled well-balanced characteristics required as resist resins depending on the applications thereof. To control the aforementioned characteristics, the invented polymeric compounds for photoresist may further comprise additional monomer units according to necessity in addition to the aforementioned monomer units.

In the invented polymeric compounds for photoresist, the content of Monomer Unit 1 is, for example, from about 1% to about 90% by mole, preferably from about 3% to about 60% by mole, and more preferably from about 5% to about 40% by mole, relative to the total monomer units constituting the polymers. Preferred polymeric compounds comprise from about 10% to about 90% by mole (e.g., from about 20% to about 80% by mole), and specifically from about 30% to about 70% by mole of Monomer Unit 2 relative to the total monomer units constituting the polymers. The content of Monomer Unit 3 in polymers containing the Monomer Unit 3, if any, is from about 1% to about 70% by mole, preferably from about 3% to about 60% by mole, and more preferably from about 5% to about 50% by mole, relative to the total monomer units constituting the polymers.

Of the combinations of the individual monomer units in the invented polymeric compounds, specifically preferred combinations are as follows:

(1) a combination of the monomer unit of Formula (I) and at least one selected from monomer units of Formulae (IIa) to (IIg);
(2) a combination of the monomer unit of Formula (I), at least one selected from monomer units of Formulae (IIa) to (IIg) and at least one selected from monomer units of Formulae (IIIa) to (IIIg) [especially, at least one selected from monomer units of Formulae (IIIa), (IIIf) and (IIIg)]; and
(3) a combination of the monomer unit of Formula (I) and at least one selected from monomer units of Formulae (IIIa) to (IIIg) [especially, at least one selected from monomer units of Formulae (IIIa), (IIIf) and (IIIg)].

In the preferred polymeric compounds of the present invention, the total content of monomer units each having an alicyclic skeleton [of Formulae (I), (IIa), (IIb), (IIc), (IIg), (IIIa), (IIIc), (IIId) and (IIIg)] is, for example, from about 50% to about 95% by weight, and specifically from about 60% to about 85% by weight, relative to the total monomer units constituting the polymers. These polymeric compounds are specifically satisfactorily resistant to etching.

The invented polymeric compounds each have a weight average molecular weight (Mw) of, for example, from about 5000 to about 50000 and preferably from about 7000 to about 20000, and a molecular weight distribution (Mw/Mn) of, for example, from about 1.8 to about 3.5. The figure Mn indicates a number average molecular weight (in terms of polystyrene).

Each of the monomer units represented by Formulae (I), (IIg), (IIIf) and (IIIg) can be formed by subjecting a corresponding ethylenically unsaturated compound as a (co-)monomer to polymerization. Likewise, each of the monomer units represented by Formulae (IIa) to (IIf) and (IIIa) to (IIIe) can be formed by subjecting a corresponding (meth) acrylic acid or its ester as a (co-)monomer to polymerization. Polymerization can be performed by conventional techniques for use in the production of acrylic polymers or polyolefinic polymers.

Monomer Unit of Formula (I)

A monomer corresponding to the monomer unit of Formula (I) is represented by following Formula (1):

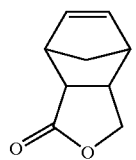

(I)

There are stereoisomers in this compound (bicyclo [2.2.1] hept-5-ene-2-hydroxymethyl-3-carboxylic acid lactone) [1-1]. Each of these stereoisomers can be used alone or in combination. This compound can be obtained, for example, by a Diels-Alder reaction between cyclopentadiene and 2,5-dihydrofuran-2-one.

Monomer Unit of Formula (IIa)

Monomers corresponding to the monomer units of Formula (IIa) are represented by following Formula (2a):

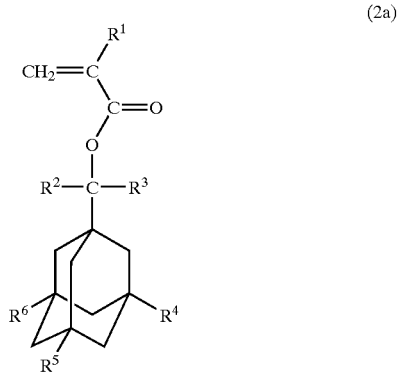

(2a)

wherein $R^1$ is a hydrogen atom or a methyl group; $R^2$ and $R^3$ are the same or different and are each a hydrocarbon group having from 1 to 8 carbon atoms; $R^4$, $R^5$ and $R^6$ are the same or different and are each a hydrogen atom, a hydroxyl group or a methyl group, of which typical examples are the following compounds:

[2-1] 1-(1-(meth)acryloyloxy-1-methylethyl)adamantane ($R^1$=H or $CH_3$, $R^2$=$R^3$=$CH_3$, $R^4$=$R^5$=$R^6$=H);

[2-2] 1-hydroxy-3-(1-(meth)acryloyloxy-1-methylethyl) adamantane ($R^1$=H or $CH_3$, $R^2$=$R^3$=$CH_3$, $R^4$=OH, $R^5$=$R^6$=H);

[2-3] 1-(1-ethyl-1-(meth)acryloyloxypropyl)adamantane ($R^1$=H or $CH_3$, $R^2$=$R^3$=$CH_2CH_3$, $R^4$=$R^5$=$R^6$=H);

[2-4] 1-hydroxy-3-(1-ethyl-1-(meth)acryloyloxypropyl) adamantane ($R^1$=H or $CH_3$, $R^2$=$R^3$=$CH_2CH_3$, $R^4$=OH, $R^5$=$R^6$=H);

[2-5] 1-(1-(meth)acryloyloxy-1-methylpropyl) adamantane ($R^1$=H or $CH_3$, $R^2$=$CH_3$, $R^3$=$CH_2CH_3$, $R^4$=$R^5$=$R^6$=H);

[2-6] 1-hydroxy-3-(1-(meth)acryloyloxy-1-methylpropyl)adamantane ($R^1$=H or $CH_3$, $R^2$=$CH_3$, $R^3$=$CH_2CH_3$, $R^4$=OH, $R^5$=$R^6$=H);

[2-7] 1-(1-(meth)acryloyloxy-1,2-dimethylpropyl) adamantane ($R^1$=H or $CH_3$, $R^2$=$CH_3$, $R^3$=CH($CH_3$)$_2$, $R^4$=$R^5$=$R^6$=H);

[2-8] 1-hydroxy-3-(1-(meth)acryloyloxy-1,2-dimethylpropyl)adamantane ($R^1$=H or $CH_3$, $R^2$=$CH_3$, $R^3$=$CH_2(CH_3)_2$, $R^4$=OH, $R^5$=$R^6$=H);

[2-9] 1,3-dihydroxy-5-(1-(meth)acryloyloxy-1-methylethyl)adamantane ($R^1$=H or $CH_3$, $R^2$=$R^3$=$CH_3$, $R^4$=$R^5$=OH, $R^6$=H);

[2-10] 1-(1-ethyl-1-(meth)acryloyloxypropyl)-3,5-dihydroxyadamantane ($R^1$=H or $CH_3$, $R^2$=$R^3$=$CH_2CH_3$, $R^4$=$R^5$=OH, $R^6$=H);

[2-11] 1,3-dihydroxy-5-(1-(meth)acryloyloxy-1-methylpropyl)adamantane ($R^1$=H or $CH_3$, $R^2$=$CH_3$, $R^3$=$CH_2CH_3$, $R^4$=$R^5$=OH, $R^6$=H); and

[2-12] 1,3-dihydroxy-5-(1-(meth)acryloyloxy-1,2-dimethylpropyl)adamantane ($R^1$=H or $CH_3$, $R^2$=$CH_3$, $R^3$=CH($CH_3$)$_2$, $R^4$=$R^5$=OH, $R^6$=H).

The compounds represented by Formula (2a) can be obtained, for example, in accordance with the following reaction process chart:

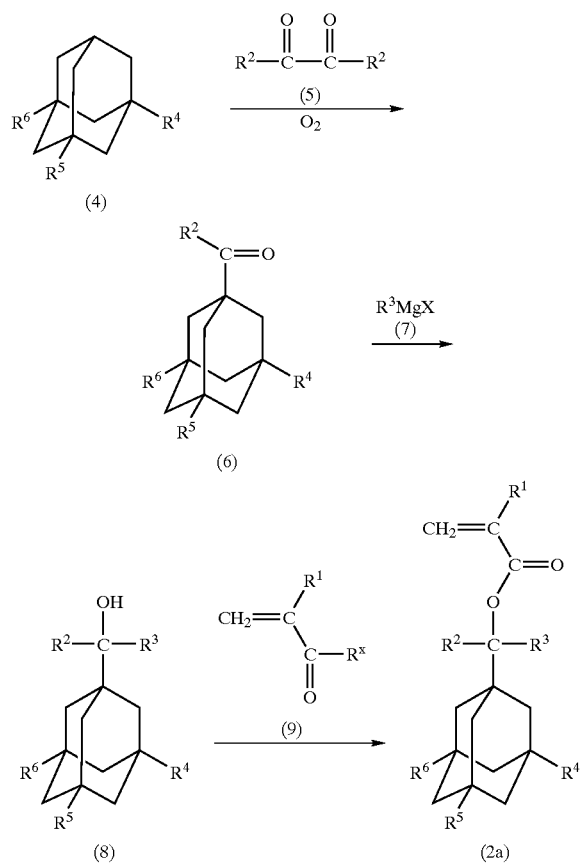

wherein X is a halogen atom; $R^x$ is a halogen atom, a hydroxyl group, an alkoxy group or an alkenyloxy group; and $R^1$, $R^2$, $R^3$, $R^4$, $R^5$ and $R^6$ have the same meanings as defined above.

Of adamantane derivatives (4) for use as raw materials in this reaction process chart, a compound in which any of $R^4$ to $R^6$ is a hydroxyl group can be obtained by introducing a hydroxyl group into an adamantane ring. For example, a hydroxyl group can be introduced into the adamantane ring by a process in which an adamantane compound is brought into contact with oxygen in the presence of a N-hydroxyimide catalyst such as N-hydroxyphthalimide and, where necessary, a metallic promoter (co-catalyst) such as a cobalt compound (e.g., cobalt acetate or acetylacetonatocobalt). In this process, the amount of the N-hydroxyimide catalyst is, for example, from about 0.0001 to about 1 mole and preferably from about 0.001 to about 0.5 mole, relative to 1 mole of the adamantane compound. The amount of the metallic promoter is, for example, from about 0.0001 to about 0.7 mole and preferably from about 0.001 to about 0.5 mole, relative to 1 mole of the adamantane compound. Oxygen is often used in excess to the adamantane compound. A reaction is performed, for example, in a solvent at a temperature of from about 0° C. to about 200° C. and preferably from about 30° C. to about 150° C. at atmospheric pressure or under a pressure (under a load). Such solvents include, for example, acetic acid and other organic acids, acetonitrile and other nitrites, and dichloroethane and other halogenated hydrocarbons. A plurality of hydroxyl groups can be introduced into the adamantane ring by appropriately selecting reaction conditions.

A reaction of the adamantane derivative (4) with a 1,2-dicarbonyl compound (e.g., biacetyl) (5) and oxygen can be performed in the presence of a metallic compound such as a cobalt compound such as cobalt acetate or acetylacetonatocobalt and/or an N-hydroxyimide catalyst such as N-hydroxyphthalimide. The amount of the 1,2-dicarbonyl compound (5) is 1 mole or more (e.g., from about 1 to about 50 moles), preferably from about 1.5 to about 20 moles and more preferably from about 3 to about 10 moles, relative to 1 mole of the adamantane derivative (4). The amount of the metallic compound is, for example, from about 0.0001 to about 0.1 mole relative to 1 mole of the adamantane derivative (4). The amount of the N-hydroxyimide catalyst is, for example, from about 0.001 to about 0.7 mole relative to 1 mole of the adamantane derivative (4). Oxygen is often used in excess to the adamantane derivative (4). The reaction is generally performed in an organic solvent. Such organic solvents include, but are not limited to, acetic acid and other organic acids, benzonitrile and other nitrites, and trifluoromethylbenzene and other halogenated hydrocarbons. The reaction is performed at a temperature of, for example, from about 30° C. to about 250° C. and preferably from about 40° C. to about 200° C. at atmospheric pressure or under a pressure (under a load).

A reaction between an acyladamantane derivative (6) thus obtained and a Grignard reagent (7) can be performed in a similar manner to a conventional Grignard reaction. The amount of the Grignard reagent (7) is, for example, from about 0.7 to about 3 moles and preferably from about 0.9 to about 1.5 moles, relative to 1 mole of the acyladamantane derivative (6). When the acyladamantane derivative (6) has hydroxyl group(s) on the adamantane ring, the amount of the Grignard reagent is increased depending on the number thereof. The reaction is performed in, for example, an ether such as diethyl ether or tetrahydrofuran. A reaction temperature is, for example, from about 0° C. to about 150° C. and preferably from about 20° C. to about 100° C.

A conventional process using an acid catalyst or a transesterification catalyst can perform a reaction (an esterification reaction) between an adamantanemethanol derivative (8) formed by the above reaction and a (meth)acrylic acid or its derivative (9). The compounds represented by Formula (2a) can be efficiently obtained under mild conditions by subjecting the adamantanemethanol derivative (8) to a reaction (a transesterification reaction) with an alkenyl (meth) acrylate such as vinyl (meth) acrylate or 2-propenyl (meth) acrylate in the presence of a catalyst of a Group 3 element compound of the Periodic Table of Elements (e.g., samarium acetate, samarium trifluoromethanesulfonate, samarium complexes, and other samarium compounds). In this procedure, the amount of the alkenyl (meth)acrylate is, for example, from about 0.8 to about 5 moles and preferably from about 1 to about 1.5 moles relative to 1 mole of the adamantanemethanol derivative (8). The amount of the Group 3 element compound catalyst of the Periodic Table of Elements is, for example, from about 0.001 to about 1 mole and preferably from about 0.01 to about 0.25 mole relative to 1 mole of the adamantanemethanol derivative (8). This reaction is performed in a solvent inert toward the reaction at a temperature of, for example, from about 0° C. to about 150° C. and preferably from about 25° C. to about 120° C.

Of the compounds represented by Formula (2a), a compound in which $R^2$ and $R^3$ are the same groups can be obtained, for example, in accordance with the following reaction process chart:

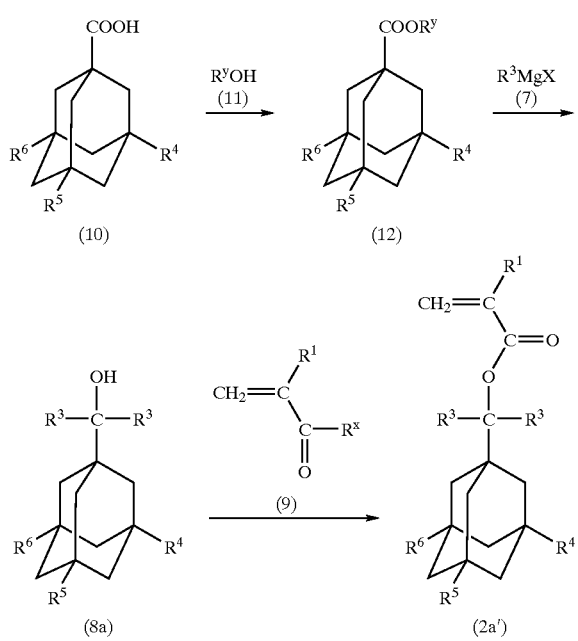

wherein $R^y$ is a hydrocarbon group; and X, $R^1$, $R^2$, $R^3$, $R^4$, $R^5$, $R^6$ and $R^x$ have the same meanings as defined above.

The hydrocarbon group in $R^y$ includes, but is not limited to, methyl, ethyl, propyl, isopropyl and other $C_1$–$C_6$ aliphatic hydrocarbon groups; and phenyl group.

An adamantanecarboxylic acid derivative (10) for use as a raw material in the above reaction process chart can be produced by introducing a carboxyl group into the adamantane ring of an adamantane compound. For example, a carboxyl group can be introduced into the adamantane ring of the adamantane compound by a process in which the adamantane compound is brought into contact with carbon monoxide and oxygen in the presence of a N-hydroxyimide catalyst such as N-hydroxyphthalimide and, where necessary, a metallic promoter (co-catalyst) such as a cobalt compound (e.g., cobalt acetate or acetylacetonatocobalt). In the carboxylation reaction, the amount of the N-hydroxyimide catalyst is, for example, from about 0.0001 to about 1 mole and preferably from about 0.001 to about 0.5 mole relative to 1 mole of the adamantane compound. The amount of the metallic promoter is, for example, from about 0.0001 to about 0.7 mole and preferably from about 0.001 to about 0.5 mole relative to 1 mole of the adamantane compound. The amounts of carbon monoxide and oxygen are, for example, 1 mole or more and 0.5 mole or more, respectively, relative to 1 mole of the adamantane compound. The ratio of carbon monoxide to oxygen is, for example, such that the former/the latter (by mole) is from about 1/99 to about 99/1 and preferably from about 50/50 to about 95/5. The carboxylation reaction is performed, for example, in a solvent at a temperature of from about 0° C. to about 200° C. and preferably from about 10° C. to about 150° C. at atmospheric pressure or under a pressure (under a load). Such solvents include, for example, acetic acid and other organic acids, acetonitrile and other nitrites, and dichloroethane and other halogenated hydrocarbons. A plurality of carboxyl groups can be introduced into the adamantane ring by appropriately selecting reaction conditions.

A reaction between the adamantanecarboxylic acid derivative (10) and a hydroxy compound (11) can be performed, for example, in accordance with a conventional esterification process using an acid catalyst.

A reaction between an adamantanecarboxylic ester represented by Formula (12) and a Grignard reagent (7) is generally performed in a solvent inert toward the reaction, such as diethyl ether, tetrahydrofuran and other ethers. A reaction temperature is, for example, from about 0° C. to about 100° C. and preferably from about 10° C. to about 40° C. The amount of the Grignard reagent (7) is, for example, from about 2 to about 4 equivalents relative to the adamantanecarboxylic ester (12).

A reaction (an esterification reaction) between an adamantanemethanol derivative (8a) and the (meth) acrylic acid or its derivative (9) can be performed in a similar manner to the reaction between the compound represented by Formula (8) and the (meth)acrylic acid or its derivative (9). Of the compounds represented by Formula (2a), a compound (2a') in which $R^2$ and $R^3$ are the same hydrocarbon group (e.g., $R^2$=$R^3$=ethyl group) can be easily prepared in this manner.

Monomer Unit of Formula (IIb)

Monomers corresponding to the monomer units of Formula (IIb) are represented by following Formula (2b):

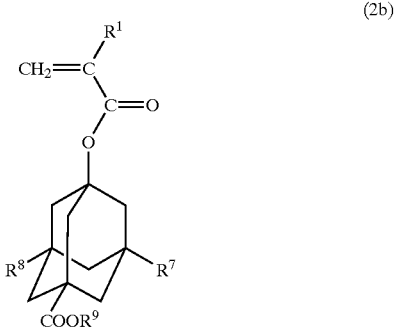

(2b)

wherein $R^1$ is a hydrogen atom or a methyl group; $R^7$ and $R^8$ are the same or different and are each a hydrogen atom, a hydroxyl group or a —$COOR^9$ group, where $R^9$ is a t-butyl group, a 2-tetrahydrofuranyl group, a 2-tetrahydropyranyl group or an 2-oxepanyl group, of which typical examples are the following compounds:

[2-13] 1-t-butoxycarbonyl-3-(meth) acryloyloxyadamantane ($R^1$=H or $CH_3$, $R^7$=$R^8$=H, $R^9$=t-butyl group);

[2-14] 1,3-bis(t-butoxycarbonyl)-5-(meth) acryloyloxyadamantane ($R^1$=H or $CH_3$, $R^7$=t-butoxycarbonyl group, $R^8$=H, $R^9$=t-butyl group);

[2-15] 1-t-butoxycarbonyl-3-hydroxy-5-(meth) acryloyloxyadamantane ($R^1$=H or $CH_3$, $R^7$=OH, $R^8$=H, $R^9$=t-butyl group);

[2-16] 1-(2-tetrahydropyranyloxycarbonyl)-3-(meth) acryloyloxyadam antane ($R^1$=H or $CH_3$, $R^7$=$R^8$=H, $R^9$=2-tetrahydropyranyl group);

[2-17] 1,3-bis(2-tetrahydropyranyloxycarbonyl)-5-(meth) acryloylox yadamantane ($R^1$=H or $CH_3$, $R^7$=2-tetrahydropyranyloxycarbonyl group, $R^8$=H, $R^9$=2-tetrahydropyranyl group); and

[2-18] 1-hydroxy-3-(2-tetrahydropyranyloxycarbonyl)-5-(meth)acryl oyloxyadamantane ($R^1$=H or $CH_3$, $R^7$=OH, $R^8$=H, $R^9$=2-tetrahydropyranyl group).

The compounds represented by Formula (2b) can be obtained, for example, in accordance with the following reaction process chart:

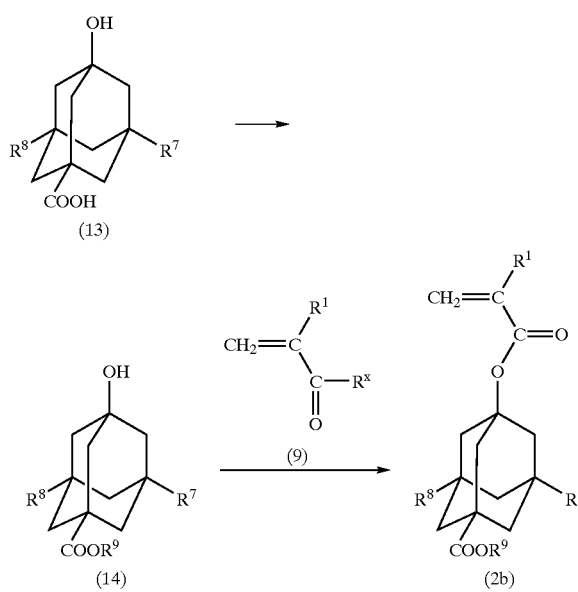

[2-21] 5-hydroxy-2-(meth)acryloyloxy-2-methyladamantane ($R^1$=H or $CH_3$, $R^{10}$=5-OH, $R^{11}$=H);

[2-22] 1,3-dihydroxy-2-(meth)acryloyloxy-2-methyladamantane ($R^1$=H or $CH_3$, $R^{10}$=1-OH, $R^{11}$=3-OH);

[2-23] 1,5-dihydroxy-2-(meth)acryloyloxy-2-methyladamantane ($R^1$=H or $CH_3$, $R^{10}$=1-OH, $R^{11}$=5-OH); and

[2-24] 1,3-dihydroxy-6-(meth)acryloyloxy-6-methyladamantane ($R^1$=H or $CH_3$, $R^{10}$=1-OH, $R^{11}$=3-OH).

The compounds represented by Formula (2c) can be obtained, for example, in accordance with the following reaction process chart:

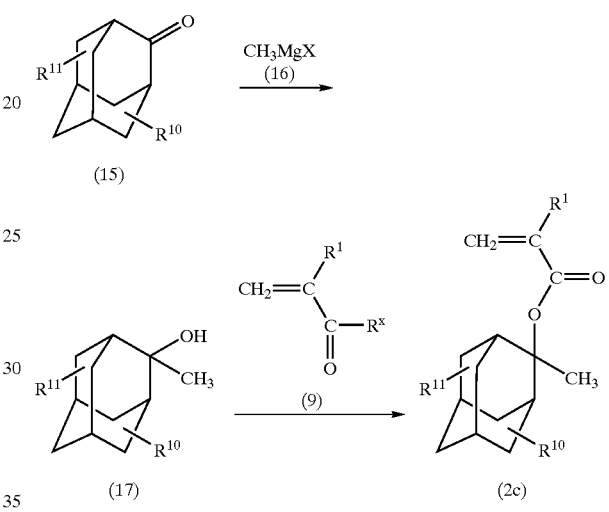

wherein $R^x$, $R^1$, $R^7$, $R^8$ and $R^9$ have the same meanings as defined above.

In the reaction process chart, a conventional process can convert a carboxyadamantanol derivative (13) into an 1-adamantanol derivative (14) (protection of a carboxyl group). Such conventional processes include a process in which the carboxyadamantanol derivative (13) is allowed to react with isobutylene, dihydrofuran or dihydropyran.

The carboxyadamantanol derivative (13) for use as a raw material in this procedure can be obtained by introducing a hydroxyl group and carboxyl group into the adamantane ring of an adamantane compound. The introduction of a hydroxyl group and carboxyl group into the adamantane ring can be performed in the same manner as above.

A reaction (an esterification reaction) between the 1-adamantanol derivative (14) and the (meth)acrylic acid or its derivative (9) can be performed in a similar manner to the reaction between the compound represented by Formula (8) and the (meth)acrylic acid or its derivative (9).

Monomer Unit of Formula (IIc)

Monomers corresponding to the monomer units of Formula (IIc) are represented by the following Formula (2c):

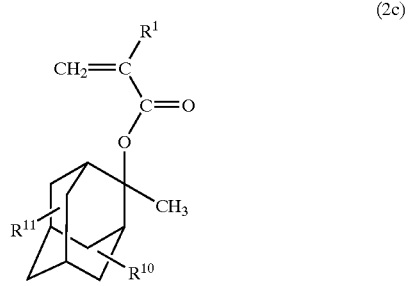

wherein $R^1$ is a hydrogen atom or a methyl group; and $R^{10}$ and $R^{11}$ are the same or different and are each a hydrogen atom, a hydroxyl group or an oxo group, of which typical examples are the following compounds:

[2-19] 2-(meth)acryloyloxy-2-methyladamantane ($R^1$=H or $CH_3$, $R^{10}$=$R^{11}$=H);

[2-20] 1-hydroxy-2-(meth)acryloyloxy-2-methyladamantane ($R^1$=H or $CH_3$, $R^{10}$=1-OH, $R^{11}$=H)

wherein X, $R^1$, $R^{10}$, $R^{11}$ and $R^x$ have the same meanings as defined above.

In this reaction process chart, a reaction between an adamantanone derivative (15) and a Grignard reagent (16) can be performed in accordance with a conventional Grignard reaction. The amount of the Grignard reagent (16) is, for example, from about 0.7 to about 3 moles and preferably from about 0.9 to about 1.5 moles relative to 1 mole of the adamantanone derivative (15). When the adamantanone derivative (15) has hydroxyl group(s) on the adamantane ring, the amount of the Grignard reagent is increased depending on the number thereof. The reaction is performed in a solvent inert toward the reaction, such as diethyl ether, tetrahydrofuran and other ethers. A reaction temperature is, for example, from about 0° C. to about 150° C. and preferably from about 20° C. to about 100° C.

The above-prepared 2-adamantanol derivative (17) is subjected to a reaction (an esterification reaction) with the (meth)acrylic acid or its derivative (9) to thereby yield a compound represented by Formula (2c). The esterification reaction can be performed in a similar manner to the reaction between the compound of Formula (8) and the (meth)acrylic acid or its derivative (9).

Of the adamantanone derivatives (15) for use as a raw material in the above process, a compound having a hydroxyl group on the adamantane ring can be produced in the following manner. Specifically, a 2-adamantanone is brought into contact with oxygen in the presence of a N-hydroxyimide catalyst such as N-hydroxyphthalimide, and where necessary, a metallic promoter such as a cobalt compound, a manganese compound or a vanadium compound to thereby introduce a hydroxyl group into the adamantane ring. In this process, the amount of the N-hydroxyimide catalyst is, for example, from about 0.0001 to about 1 mole and preferably from about 0.001 to about 0.5 mole relative to 1 mole of the 2-adamantanone. The amount of the metallic promoter is, for example, from about 0.0001 to about 0.7 mole and preferably from about 0.001 to about 0.5 mole relative to 1 mole of the 2-adamantanone. Oxygen is often used in excess to the 2-adamantanone. The reaction is performed in a solvent at a temperature of from about 0° C. to about 200° C. and preferably from about 30° C. to about 150° C. at atmospheric pressure or under a pressure (under a load). Such solvents include, for example, acetic acid and other organic acids, acetonitrile and other nitriles, and dichloroethane and other halogenated hydrocarbons.

Of the adamantanone derivatives (15), a compound having a hydroxyl group on the adamantane ring can also be produced by allowing an adamantane to react with oxygen in the presence of the N-hydroxyimide catalyst, a strong acid (e.g., a hydrogen halide or sulfuric acid), and where necessary, the metallic promoter. The amount of the strong acid is, for example, from about 0.00001 to about 1 mole and preferably from about 0.0005 to about 0.7 mole relative to 1 mole of the adamantane. The other reaction conditions are similar to those in the reaction for the introduction of hydroxyl group.

Monomer Unit of Formula (IId)

Monomers corresponding to the monomer units of Formula (IId) are represented by following Formula (2d):

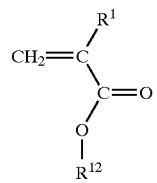

(2d)

wherein $R^1$ is a hydrogen atom or a methyl group; and $R^{12}$ is a hydrocarbon group having a tertiary carbon atom at a bonding site with an oxygen atom indicated in the formula, of which a typical example is the following compound:

[2-25] t-butyl (meth)acrylate ($R^1$=H or $CH_3$, $R^{12}$=t-butyl group).

Monomer Unit of Formula (IIe)

Monomers corresponding to the monomer units of Formula (IIe) are represented by following Formula (2e):

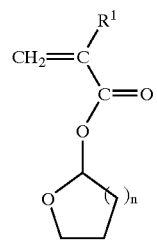

(2e)

wherein $R^1$ is a hydrogen atom or a methyl group; and n denotes an integer from 1 to 3, of which typical examples are the following compounds:

[2-26] 2-tetrahydropyranyl (meth)acrylate ($R^1$=H or $CH_3$, n=2); and

[2-27] 2-tetrahydrofuranyl (meth)acrylate ($R^1$=H or $CH_3$, n=1)

Monomer Unit of Formula (IIf)

Monomers corresponding to the monomer units of Formula (IIf) are represented by following Formula (2f):

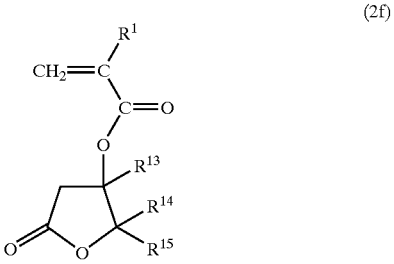

(2f)

wherein $R^1$ is a hydrogen atom or a methyl group; and $R^{13}$, $R^{14}$ and $R^{15}$ are the same or different and are each hydrogen atom or a methyl group, of which typical examples are the following compounds:

[2-28] 3-(meth)acryloyloxy-γ-butyrolactone ($R^1$=H or $CH_3$, $R^{13}$=$R^{14}$=$R^{15}$=H);

[2-29] 3-(meth) acryloyloxy-3-methyl-γ-butyrolactone ($R^1$=H or $CH_3$, $R^{13}$=$CH_3$, $R^{14}$=$R^{15}$=H);

[2-30] 3-(meth)acryloyloxy-4-methyl-γ-butyrolactone ($R^1$=H or $CH_3$, $R^{13}$=$R^{15}$=H, $R^{14}$=$CH_3$);

[2-31] 3-(meth)acryloyloxy-3,4-dimethyl-γ-butyrolactone ($R^1$=H or $CH_3$, $R^{13}$=$R^{14}$=$CH_3$, $R^{15}$=H);

[2-32] 3-(meth)acryloyloxy-4,4-dimethyl-γ-butyrolactone ($R^1$=H or $CH_3$, $R^{13}$=H, $R^{14}$=$R^{15}$=$CH_3$); and

[2-33] 3-(meth)acryloyloxy-3,4,4-trimethyl-γ-butyrolactone ($R^1$=H or $CH_3$, $R^{13}$=$R^{14}$=$R^{15}$=$CH_3$).

The compounds represented by Formula (2f) can be obtained, for example, in accordance with the following reaction process chart:

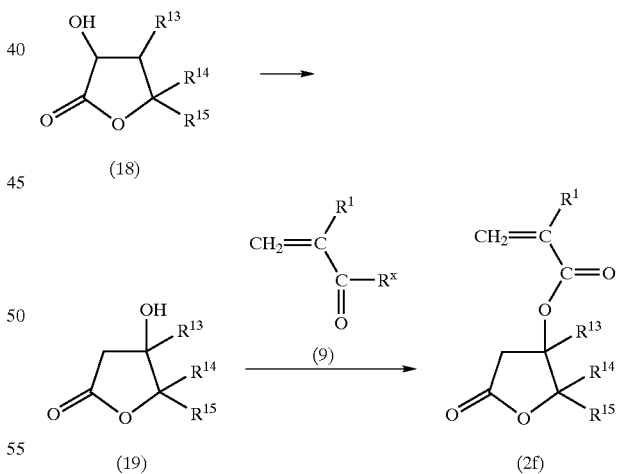

wherein $R^1$, $R^{13}$, $R^{14}$, $R^{15}$ and $R^x$ have the same meanings as defined above.

In the above reaction process chart, the conversion (isomerization) of an α-hydroxy-γ-butyrolactone represented by Formula (18) into a β-hydroxy-γ-butyrolactone represented by Formula (19) can be performed by dissolving the compound of Formula (18) in water or a solvent, where necessary, with a small amount of an acid such as sulfuric acid or hydrochloric acid. The solvent is not specifically limited, and includes, for example, acetonitrile, acetic acid and ethyl acetate. A reaction temperature is, for example, from about 0° C. to about 150° C. and preferably from about 20° C. to about 100° C. The α-hydroxy-γ-butyrolactone (18) for use as a raw material can be produced in a similar manner to that in a compound represented by Formula (23) mentioned below. Alternatively, the compound of Formula (19) can be obtained by subjecting the compound of Formula (18) to a reaction (a dehydration reaction) with phosphorus pentoxide to yield a corresponding α,β-unsaturated-γ-butyrolactone, allowing this compound to react with a peracid such as hydrogen peroxide or m-chloroperbenzoic acid to epoxidize a double bond, and hydrogenating the same in the presence of a catalyst such as Pd—C. Alternatively, the compound of Formula (19) can be produced by a conventional process for the preparation of a β-hydroxy-γ-butyrolactone.

A reaction between the β-hydroxy-γ-butyrolactone (19) and the (meth)acrylic acid or its derivative represented by Formula (9) can be performed in a similar manner to the reaction between the compound of Formula (8) and the (meth)acrylic acid or its derivative (9).

Monomer Unit of Formula (IIg)

Monomers corresponding to the monomer units of Formula (IIg) are represented by following Formula (2g):

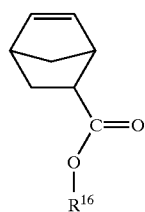

(2g)

wherein $R^{16}$ is a t-butyl group, a 2-tetrahydrofuranyl group, a 2-tetrahydropyranyl group or an 2-oxepanyl group, of which typical examples are the following compounds:

[2-34] 5-t-butoxycarbonylnorbornene ($R^{16}$=t-butyl group);

[2-35] 5-(2-tetrahydropyranyloxycarbonyl)norbornene ($R^{16}$=2-tetrahydropyranyl group); and

[2-36] 5-(2-tetrahydrofuranyloxycarbonyl)norbornene ($R^{16}$=2-tetrahydrofuranyl group).

Monomer Unit of Formula (IIIa)

Monomers corresponding to the monomer units of Formula (IIIa) are represented by following Formula (3a):

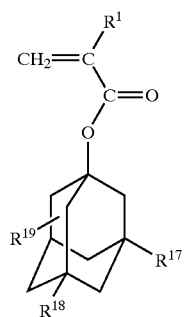

(3a)

wherein $R^1$ is a hydrogen atom or a methyl group; $R^{17}$ and $R^{18}$ are the same or different and are each a hydrogen atom, a hydroxyl group or a carboxyl group; and $R^{19}$ is a hydroxyl group, an oxo group or a carboxyl group, of which typical examples include the following compounds:

[3-1] 1-hydroxy-3-(meth)acryloyloxyadamantane ($R^1$=H or $CH_3$, $R^{19}$=OH, $R^{17}$=$R^{18}$=H);

[3-2] 1,3-dihydroxy-5-(meth)acryloyloxyadamantane ($R^1$=H or $CH_3$, $R^{19}$=$R^{17}$=OH, $R^{18}$=H);

[3-3] 1-carboxy-3-(meth)acryloyloxyadamantane ($R^1$=H or $CH_3$, $R^{19}$=COOH, $R^{17}$=$R^{18}$=H);

[3-4] 1,3-dicarboxy-5-(meth)acryloyloxyadamantane ($R^1$=H or $CH_3$, $R^{19}$=$R^{17}$=COOH, $R^{18}$=H);

[3-5] 1-carboxy-3-hydroxy-5-(meth)acryloyloxyadamantane ($R^1$=H or $CH_3$, $R^{19}$=OH, $R^{17}$=COOH, $R^{18}$=H);

[3-6] 1-(meth)acryloyloxy-4-oxoadamantane ($R^1$=H or $CH_3$, $R^{19}$=4-oxo group, $R^{17}$=$R^{18}$=H);

[3-7] 3-hydroxy-1-(meth)acryloyloxy-4-oxoadamantane ($R^1$=H or $CH_3$, $R^{19}$=4-oxo group, $R^{17}$=3-OH, $R^{18}$=H); and

[3-8] 7-hydroxy-1-(meth)acryloyloxy-4-oxoadamantane ($R^1$=H or $CH_3$, $R^{19}$=4-oxo group, $R^{17}$=7-OH, $R^{18}$=H).

The compounds represented by Formula (3a) can be obtained, for example, in accordance with the following reaction process chart:

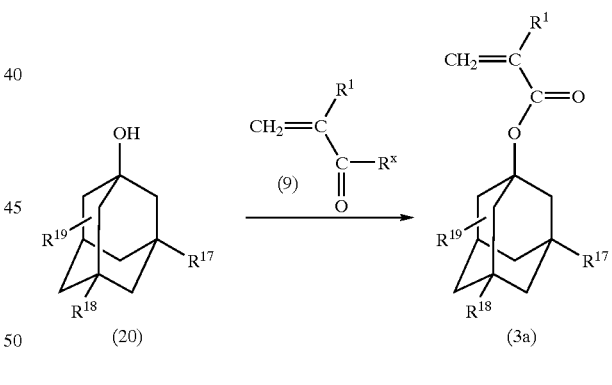

wherein $R^1$, $R^{17}$, $R^{18}$, $R^{19}$ and $R^x$ have the same meanings as defined above.

In this reaction process chart, a reaction between an 1-adamantanol derivative (20) and the (meth)acrylic acid or its derivative (9) can be performed in a similar manner to the reaction between the 1-adamantanol derivative (8) and the (meth) acrylic acid or its derivative (9). The 1-adamantanol derivative (20) for use as a raw material can be obtained, for example, by introducing a hydroxyl group or a carboxyl group into the adamantane ring of an adamantane compound. The introduction of a hydroxyl group and carboxyl group into the adamantane ring can be performed in the same manner as above.

Monomer Unit of Formula (IIIb)

Monomers constituting the monomer units of Formula (IIIb) are represented by following Formula (3b):

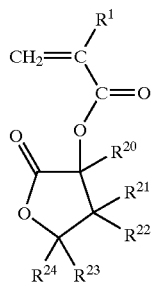

(3b)

wherein $R^1$ is a hydrogen atom or a methyl group; and $R^{20}$, $R^{21}$, $R^{22}$, $R^{23}$ and $R^{24}$ are the same or different and are each a hydrogen atom or a methyl group,
of which typical examples include the following compounds:

[3-9] 2-(meth)acryloyloxy-γ-butyrolactone ($R^1$=H or $CH_3$, $R^{20}$=$R^{21}$=$R^{22}$$R^{23}$=$R^{24}$=H);

[3-10] 2-(meth)acryloyloxy-2-methyl-γ-butyrolactone ($R^1$=H or $CH_3$, $R^{20}$=$CH_3$, $R^{21}$=$R^{22}$=$R^{23}$=$R^{24}$=H);

[3-11] 2-(meth)acryloyloxy-4,4-dimethyl-γ-butyrolactone ($R^1$=H or $CH_3$, $R^{20}$=$R^{21}$=$R^{22}$=H, $R^{23}$=$R^{24}$=$CH_3$);

[3-12] 2-(meth)acryloyloxy-2,4,4-trimethyl-γ-butyrolactone ($R^1$=H or $CH_3$, $R^{20}$=$R^{23}$=$R^{24}$=$CH_3$, $R^{21}$=$R^{22}$=H);

[3-13] 2-(meth)acryloyloxy-3,4,4-trimethyl-γ-butyrolactone ($R^1$=H or $CH_3$, $R^{20}$=$R^{22}$=H, $R^{21}$=$R^{23}$=$R^{24}$=$CH_3$);

[3-14] 2-(meth)acryloyloxy-2,3,4,4-tetramethyl-γ-butyrolactone ($R^1$=H or $CH_3$, $R^{20}$=$R^{21}$=$R^{23}$=$R^{24}$=$CH_3$, $R^{22}$=H);

[3-15] 2-(meth)acryloyloxy-3,3,4-trimethyl-γ-butyrolactone ($R^1$=H or $CH_3$, $R^{20}$=$R^{24}$=H, $R^{21}$=$R^{22}$$R^{23}$=$CH_3$);

[3-16] 2-(meth)acryloyloxy-2,3,3,4-tetramethyl-γ-butyrolactone ($R^1$=H or $CH_3$, $R^{20}$=$R^{21}$=$R^{22}$=$R^{23}$=$CH_3$, $R^{24}$=H);

[3-17] 2-(meth)acryloyloxy-3,3,4,4-tetramethyl-γ-butyrolactone ($R^1$=H or $CH_3$, $R^{20}$=H, $R^{21}$=$R^{22}$=$R^{23}$=$R^{24}$=$CH_3$); and

[3-18] 2-(meth)acryloyloxy-2,3,3,4,4-pentamethyl-γ-butyrolactone ($R^1$=H or $CH_3$, $R^{20}$=$R^{21}$=$R^{22}$=$R^{23}$=$R^{24}$=$CH_3$).

The compounds represented by Formula (3b) can be obtained, for example, in accordance with the following reaction process chart:

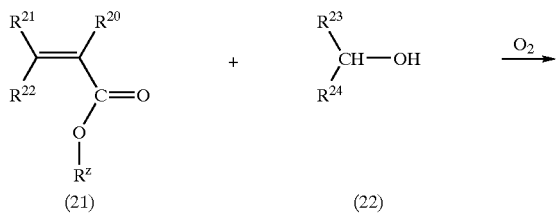

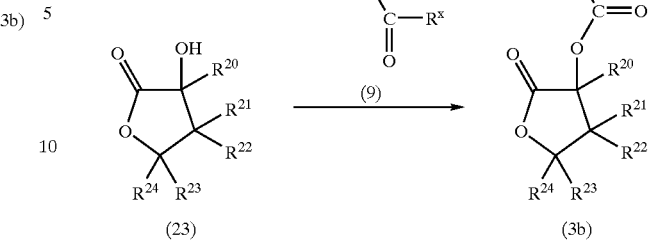

wherein $R^z$ is a hydrocarbon group; and $R_1$, $R^{20}$, $R^{21}$, $R^{22}$, $R^{23}$, $R^{24}$ and $R^x$ have the same meanings as defined above.

The hydrocarbon group in $R^z$ in the above reaction process chart includes, for example, methyl, ethyl, propyl, s-butyl, t-butyl, vinyl, allyl and other aliphatic hydrocarbon groups (alkyl groups, alkenyl groups or alkynyl groups) each having from about 1 to about 6 carbon atoms; phenyl group, naphthyl group and other aromatic hydrocarbon groups; and cycloalkyl groups and other alicyclic hydrocarbon groups.

A reaction of an α,β-unsaturated carboxylic ester (21) with an alcohol (22) and oxygen is performed in the presence of a N-hydroxyimide catalyst such as N-hydroxyphthalimide, and where necessary, a metallic promoter such as a cobalt compound (e.g., cobalt acetate or acetylacetonatocobalt). The ratio of the α,β-unsaturated carboxylic ester (21) to the alcohol (22) can be appropriately selected depending on the types (e.g., cost and reactivity) of the two compounds. For example, the alcohol (22) may be used in excess (e.g., from about 2 to about 50 times by mole) to the α,β-unsaturated carboxylic ester (21), and vice versa, the α,β-unsaturated carboxylic ester (21) may be used in excess to the alcohol (22). The amount of the N-hydroxyimide catalyst is, for example, from about 0.0001 to about 1 mole and preferably from about 0.001 to about 0.5 mole, relative to 1 mole of the compound that is used in a less amount between the α,β-unsaturated carboxylic ester (21) and the alcohol (22). The amount of metallic promoter is, for example, from about 0.0001 to about 0.7 mole and preferably from about 0.001 to about 0.5 mole, relative to 1 mole of the compound that is used in a less amount between the α,β-unsaturated carboxylic ester (21) and the alcohol (22). Oxygen is often used in excess to the compound that is used in a less amount between the α,β-unsaturated carboxylic ester (21) and the alcohol (22). The reaction is performed in a solvent at a temperature of from about 0° C. to about 150° C. and preferably from about 30° C. to about 100° C. at atmospheric pressure or under a pressure (under a load). Such solvents include, but are not limited to, acetic acid and other organic acids, acetonitrile and other nitrites, trifluoromethylbenzene and other halogenated hydrocarbons, and ethyl acetate and other esters.

A reaction between the resulting α-hydroxy-γ-butyrolactone derivative (23) and the (meth)acrylic acid or its derivative (9) can be carried out in a similar manner to the reaction between the 1-adamantanol derivative (8) and the (meth)acrylic acid or its derivative (9).

Monomer Unit of Formula (IIIc)

Monomers constituting the monomer units of Formula (IIIc) are represented by following Formula (3c):

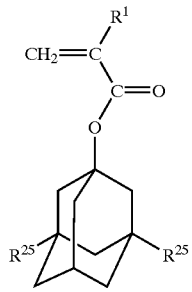
(3c)

wherein $R^1$ and $R^{25}$ are the same or different and are each a hydrogen atom or a methyl group, of which specific examples are the following compounds. These compounds can be prepared by a conventional or known technique.

[3-19] 1-(Meth)acryloyloxyadamantane ($R^1$=H or $CH_3$, $R^{25}$=H); and

[3-20] 1-(meth)acryloyloxy-3,5-dimethyladamantane ($R^1$=H or $CH_3$, $R^{25}$=$CH_3$).

Monomer Unit of Formula (IIId)

Monomers constituting the monomer units of Formula (IIId) are represented by the following Formula (3d):

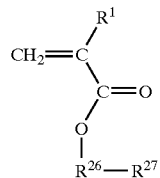
(3d)

wherein $R^1$ is a hydrogen atom or a methyl group; $R^{26}$ is a tricyclo[5.2.1.0$^{2,6}$]decylmethyl group, a tetracyclo[4.4.0.1$^{2,5}$.1$^{7,10}$]dodecylmethyl group, a norbornyl group, an isobornyl group or a 2-norbornylmethyl group; and $R^{27}$ is a substituent of $R^{26}$ and is a hydrogen atom, a hydroxyl group, a hydroxymethyl group, a carboxyl group or a —COOR$^{28}$ group, where $R^{28}$ is a t-butyl group, a 2-tetrahydrofuranyl group, a 2-tetrahydropyranyl group or an 2-oxepanyl group, of which typical examples include the following compounds. A known or conventional process can yield these compounds, such as a process in which a corresponding alcohol (HO—$R^{26}$—$R^{27}$) and the (meth) acrylic acid or its derivative (9) are subjected to an esterification reaction.

[3-21] 8-Hydroxymethyl-4-(meth)acryloyloxymethyltricyclo[5.2.1.0$^{2,6}$]decane;

[3-22] 4-hydroxymethyl-8-(meth)acryloyloxymethyltricyclo[5.2.1.0$^{2,6}$]decane;

[3-23] 4-(meth)acryloyloxymethyltetracyclo[4.4.0.1$^{2,5}$.1$^{7,10}$]dodecane;

[3-24] 2-(meth)acryloyloxynorbornane;

[3-25] 2-(meth)acryloyloxyisobornane; and

[3-26] 2-(meth)acryloyloxymethylnorbornane.

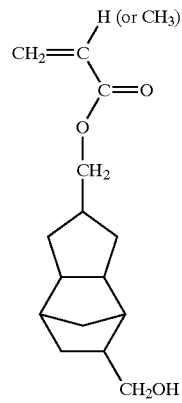
[3d-1]

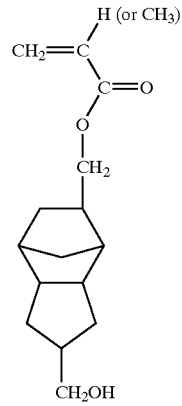
[3d-2]

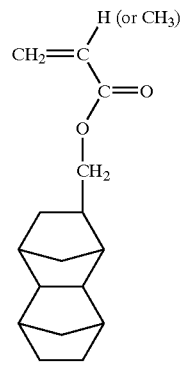
[3d-3]

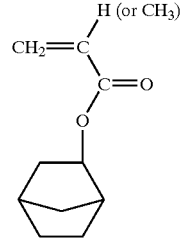
[3d-4]

-continued

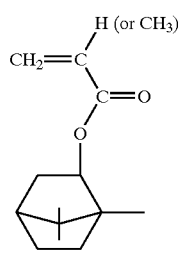

[3d-5]

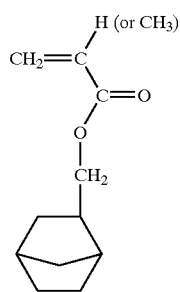

[3d-6]

Monomer Unit of Formula (IIIe)

Monomers constituting the monomer units of Formula (IIIe) are represented by the following Formula (3e):

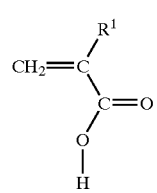

(3e)

wherein $R^1$ has the same meaning as defined above, of which specific examples are the following compounds:

[3-29] (meth)acrylic acid ($R^1$=H or $CH_3$).

Monomer Unit of Formula (IIIf)

A monomer constituting the monomer unit of Formula (IIIf) is the following compound represented by following Formula (3f):

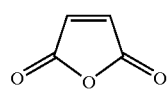

(3f)

[3-27] maleic anhydride.

Monomer Unit of Formula (IIIg)

A monomer constituting the monomer unit of Formula (IIIg) is the following compound represented by following Formula (3g):

(3g)

[3-28] norbornene.

A photoresist resin composition of the present invention comprises the invented polymeric compound for photoresist and a light-activatable acid generator.

As the light-activatable acid generator, known or conventional compounds that can efficiently generate an acid upon exposure to light can be employed. Such compounds include, but are not limited to, diazonium salts, iodonium salts (e.g., diphenyliodonium hexafluorophosphate), sulfonium salts (e.g., triphenylsulfonium hexafluoroantimonate, triphenylsulfonium hexafluorophosphate, and triphenylsulfonium methanesulfonate), sulfonates [e.g., 1-phenyl-1-(4-methylphenyl)sulfonyloxy-1-benzoylmethane, 1,2,3-trisulfonyloxymethylbenzene, 1,3-dinitro-2-(4-phenylsulfonyloxymethyl)benzene, and 1-phenyl-1-(4-methylphenylsulfonyloxymethyl)-1-hydroxy-1-benzoylmethane], oxathiazol derivatives, s-triazine derivatives, disulfone derivatives (e.g., diphenyldisulfone), imide compounds, oxime sulfonates, diazonaphthoquinone, and benzoin tosylate. Each of these light-activatable acid generators can be used alone or in combination.

The amount of the light-activatable acid generator can be appropriately selected depending on the strength of an acid generated by light irradiation or the proportion of each monomer unit in the polymeric compound, and is, for example, from about 0.1 to about 30 parts by weight, preferably from about 1 to about 25 parts by weight, and more preferably from about 2 to about 20 parts by weight, relative to 100 parts by weight of the polymeric compound.

The photoresist resin composition may further comprise additional components. Such additional components include, but are not limited to, alkali-soluble resins (e.g., novolak resins, phenol resins, imide resins, and carboxyl-group-containing resins) and other alkali-soluble components, coloring agents (e.g., dyestuffs), and organic solvents (e.g., hydrocarbons, halogenated hydrocarbons, alcohols, esters, amides, ketones, ethers, Cellosolves, Carbitols, glycol ether esters, and mixtures of these solvents).

The photoresist resin composition is applied onto a base or a substrate and is dried, and the resulting film (resist film) is exposed to light through a predetermined mask (or is further subjected to post-exposure baking) to form a latent image pattern, and the film is then developed to thereby highly precisely yield a fine pattern.

Such bases or substrates include, for example, silicon wafers, metals, plastics, glasses and ceramics. The photoresist resin composition can be applied using a conventional application means such as a spin coater, a dip coater and a roller coater. The applied film has a thickness of, for example, from about 0.1 to about 20 μm, and preferably from about 0.3 to about 2 μm.

Light rays with different wavelengths, such as ultraviolet rays and X-rays, can be used for exposure operation. For example, g-line, i-line, and excimer laser (e.g., XeCl, KrF, KrCl, ArF, or ArCl) are usually used for semiconductor resists. An exposure energy is, for example, from about 1 to about 1000 $mJ/cm^2$, and preferably from about 10 to about 500 $mJ/cm^2$.

An acid is generated from the light-activatable acid generator by action of light irradiation and immediately deprotects the protective group (leaving group) of the carboxyl group of the polymeric compound. Thus, a carboxyl group that contributes to solubilized resin is formed. Subsequent development with water or an alkali developer can therefore precisely form a predetermined pattern.

Industrial Applicability

The invented polymeric compounds for photoresist each have a monomer unit having an alicyclic skeleton of a specific structure carrying a lactone ring, can satisfactorily adhere to substrates and are resistant to swelling in a developer. Additionally, by using the monomer unit with other monomer units of specific structures, the resulting polymeric compounds can exhibit well-balanced adhesion to substrates, transparency, alkali-solubility and etching resistance.

The invented method of manufacturing a semiconductor uses the polymeric compound having the satisfactory characteristics as a resist and can highly precisely produce fine patterns.

EXAMPLES

The present invention will now be illustrated in further detail with reference to several examples below, which are not intended to limit the scope of the invention. A compound indicated by "acrylate" subsequent to a compound number (monomer number) means a compound having an acryloyloxy group, of two compounds corresponding to the compound number described in the description. A compound indicated by "methacrylate" means a compound having a methacryloyloxy group, of the two compounds. The figure at lower right of the parentheses in the structural formulae is the mole percentage of the monomer unit in question.

Production Example 1

Production of 1-(1-Acryloyloxy-1-ethylpropyl)adamantane [2-3 (acrylate)]

In a flask, 61.51 g (0.060 mole) of a 13% by weight ethylmagnesium bromide solution in tetrahydrofuran was placed, which solution had been previously prepared from ethyl bromide and metal magnesium. To this solution, a solution of 4.76 g (0.02 mole) of n-butyl 1-adamantanecarboxylate in 7.21 g of tetrahydrofuran was added dropwise, while maintaining the inner temperature at 35° C. or lower. After the completion of addition, the resulting mixture was stirred at room temperature for 1 hour.

The resulting reaction mixture was added dropwise to 32.37 g of a 10% by weight aqueous sulfuric acid solution, while maintaining the inner temperature at 35° C. or lower, and the resulting mixture was neutralized with a 5% by weight aqueous sodium hydroxide solution to thereby separate the mixture. The aqueous layer was extracted with two portions of 22.24 g of benzene, and the extract was added to the organic layer and the resulting mixture was rinsed with 22.24 g of an aqueous saturated sodium chloride solution and was dried over anhydrous sodium sulfate. The dried mixture was then filtrated, and the filtrate was concentrated under a reduced pressure to thereby yield α,α-diethyl-1-adamantanemethanol in a yield on the basis of n-butyl 1-adamantanecarboxylate of 45.5%.

Spectral Data of α,α-Diethyl-1-adamantanemethanol

GC-MS m/e: 204, 193, 175, 161, 147, 135, 86, 79, 67, 57, 41.

A total of 15 mmole of acryloyl chloride was added dropwise to a mixture of 10 mmole of the above-prepared α,α-diethyl-1-adamantanemethanol, 20 mmole of triethylamine and 40 ml of tetrahydrofuran over about 30 minutes. After the completion of addition, the resulting mixture was stirred at room temperature for 6 hours. After the addition of water, the reaction mixture was concentrated, and the concentrate was subjected to column chromatography on a silica gel to thereby yield the title compound in a yield of 72%.

Spectral Data $^1$H-NMR (500 MHz, CDCl$_3$) δ: 1.15–1.55 (m, 10H), 1.59–1.76 (m, 10H), 2.03 (m, 3H), 5.72 (dd, 1H), 6.04 (dd, 1H), 6.28 (dd, 1H).

Production Example 2

Production of 1-(1-Acryloyloxy-1-methylpropyl)adamantane [2-5 (acrylate)]

A mixture of 0.3 mole of adamantane, 1.8 mole of biacetyl, 1.5 mmole of cobalt(II) acetate and 300 ml of acetic acid was stirred at 60° C. in an oxygen atmosphere (1 atm) for 4 hours. The resulting reaction mixture was concentrated to about 20% by weight, was then extracted with ethyl acetate, was dried and was rinsed with hexane to thereby yield 1-acetyladamantane in a yield of 52% with a conversion from adamantane of 87%.

Separately, 1.1 mole of metal magnesium was placed in a flask, the inside atmosphere of the flask was replaced with nitrogen, and a solution of 1.0 mole of ethyl bromide in 500 ml of ethyl ether was placed in the flask in such an amount that the metal magnesium was submerged in the solution. A reaction was then initiated with a small amount of iodine, and the remainder ethyl ether solution of ethyl bromide was added dropwise to the mixture at such a rate that the solvent was gently refluxed. After the completion of addition, the reflux operation was continued for further 2 hours.

A solution of 1.0 mole of the above-prepared 1-acetyladamantane in 1000 ml of ethyl ether was added dropwise to the above-obtained reaction mixture at such a rate that the solvent was gently refluxed. After the completion of addition, the reflux operation was continued for further 2 hours. The resulting reaction mixture was gradually added dropwise to a 10% hydrochloric acid (in an amount corresponding to 1 mole of HCl) cooled on ice, while stirring, and the mixture was stirred at a temperature in a range from 0° C. to room temperature for further 2 hours.

A 10% aqueous sodium hydroxide solution was added to the reaction mixture to adjust the mixture to neutrality, and the neutralized mixture was separated into an aqueous layer and an organic layer; the aqueous layer was extracted with two portions of 1000 ml of ethyl ether; the extract was added to the organic layer and the mixture was concentrated; and the concentrate was cooled and crystallized to yield α-ethyl-α-methyl-1-adamantanemethanol in a yield of 46%.

A total of 10 mmole of acryloyl chloride was added dropwise to a mixture of 10 mmole of the above-prepared α-ethyl-α-methyl-1-adamantanemethanol, 10 mmole of triethylamine and 40 ml of tetrahydrofuran over about 30 minutes. After the completion of addition, the resulting mixture was stirred at room temperature for 6 hours. After the addition of water, the reaction mixture was concentrated, and the concentrate was subjected to column chromatography on a silica gel to thereby yield the title compound in a yield of 74%.

Spectral Data $^1$H-NMR (CDCl$_3$) δ: 1.14–1.37 (m, 5H), 1.48 (s, 3H), 1.55–1.78 (m, 10H), 2.04 (m, 3H), 5.73 (dd, 1H), 6.05 (dd, 1H), 6.29 (dd, 1H)

Production Example 3

Production of 1-(1-Acryloyloxy-1,2-dimethylpropyl)-3-hydroxyadamantane [2-7 (acrylate)]

The procedure of Production Example 2 was repeated, except that 0.3 mole of 1-adamantanol was used instead of adamantane, to thereby yield 1-acetyl-3-adamantanol in a yield of 20% with a conversion from 1-adamantanol of 82%.

Spectral Data of 1-Acetyl-3-adamantanol

IR (cm$^{-1}$): 3401, 2897, 2854, 1683, 1430, 1019, 605

$^{13}$C-NMR (CDCl$_3$) δ: 24.3, 29.9, 34.8, 36.8, 43.9, 45.4, 49.6, 67.9, 212.4.

Separately, 1.1 mole of metal magnesium was placed in a flask, the inside atmosphere of the flask was replaced with nitrogen, and a solution of 1.0 mole of 2-bromopropane in 500 ml of ethyl ether was placed in the flask in such an amount that the metal magnesium was submerged in the solution. A reaction was then initiated with a small amount of iodine, and the remainder ethyl ether solution of 2-bromopropane was added dropwise to the mixture at such a rate that the solvent was gently refluxed. After the completion of addition, the reflux operation was continued for further 2 hours.

A solution of 0.5 mole of the above-prepared 1-acetyl-3-adamantanol in 1000 ml of ethyl ether was added dropwise to the above-obtained reaction mixture at such a rate that the solvent was gently refluxed. After the completion of addition, the reflux operation was continued for further 2 hours. The resulting reaction mixture was added dropwise to a 10% hydrochloric acid (in an amount corresponding to 1 mole of HCl) cooled on ice, while stirring, and the mixture was stirred for further 2 hours at a temperature in a range from 0° C. to room temperature.

A 10% aqueous sodium hydroxide solution was added to the reaction mixture to adjust the mixture to neutrality, and the neutralized mixture was separated into an aqueous layer and an organic layer; the aqueous layer was extracted with two portions of 1000 ml of ethyl ether; the extract was added to the organic layer, the mixture was concentrated; and the concentrate was cooled and crystallized to yield 3-hydroxy-α-isopropyl-α-methyl-1-adamantanemethanol in a yield of 67%.

Spectral Data of 3-Hydroxy-α-isopropyl-α-methyl-1-adamantanemethanol

MS m/e: 238 ([M$^+$]), 220, 202, 187, 172, 157, 144

A total of 10 mmole of acryloyl chloride was added dropwise to a mixture of 10 mmole of the above-prepared 3-hydroxy-α-isopropyl-α-methyl-1-adamantanemethanol, 10 mmole of triethylamine and 40 ml of tetrahydrofuran over about 30 minutes. After the completion of addition, the resulting mixture was stirred at room temperature for 6 hours. After the addition of water, the reaction mixture was concentrated, and the concentrate was subjected to column chromatography on a silica gel to thereby yield the title compound in a yield of 67%.

Spectral Data $^1$H-NMR (CDCl$_3$) δ: 1.21 (m, 1H), 1.41 (d, 6H), 1.42–1.80 (m, 13H), 2.28 (m, 2H), 5.76 (dd, 1H), 6.02 (dd, 1H), 6.30 (dd, 1H).

Production Example 4

Production of 1-(1-Acryloyloxy-1-methylethyl)-3-hydroxyadamantane [2-2 (acrylate)]

A mixture of 0.3 mole of 1-adamantanol, 1.8 mole of biacetyl, 1.5 mmole of cobalt(II) acetate and 300 ml of acetic acid was stirred at 60° C. in an oxygen atmosphere (1 atm) for 4 hours. The resulting reaction mixture was concentrated to about 20% by weight, was extracted, was dried and was rinsed with hexane to thereby yield 1-acetyl-3-adamantanol in a yield of 20% with a conversion from 1-adamantanol of 82%.

Spectral Data of 1-Acetyl-3-adamantanol

IR (cm$^{-1}$): 3401, 2897, 2854, 1683, 1430, 1019, 605

$^{13}$C-NMR (CDCl$_3$) δ: 24.3, 29.9, 34.8, 36.8, 43.9, 45.4, 49.6, 67.9, 212.4.

Separately, 1.1 mole of metal magnesium was placed in a flask, the inside atmosphere of the flask was replaced with nitrogen, and a solution of 1.0 mole of methyl bromide in 500 ml of ethyl ether was placed in the flask in such an amount that the metal magnesium was submerged in the solution. A reaction was then initiated with a small amount of iodine, and the remainder ethyl ether solution of methyl bromide was added dropwise to the mixture at such a rate that the solvent was gently refluxed. After the completion of addition, the reflux operation was continued for further 2 hours.

A solution of 1.0 mole of the above-prepared 1-acetyl-3-adamantanol in 1000 ml of ethyl ether was added dropwise to the above-obtained reaction mixture at such a rate that the solvent was gently refluxed. After the completion of addition, the reflux operation was continued for further 2 hours The resulting reaction mixture was added dropwise to a 10% hydrochloric acid (in an amount corresponding to 1 mole of HCl) cooled on ice, while stirring, and the mixture was stirred for further 2 hours at a temperature in a range from 0° C. to room temperature.

A 10% aqueous sodium hydroxide solution was added to the reaction mixture to adjust the mixture to neutrality, and the neutralized mixture was separated into an aqueous layer and an organic layer; the aqueous layer was extracted with two portions of 1000 ml of ethyl ether; the extract was added to the organic layer and the mixture was concentrated; and the concentrate was cooled and crystallized to yield 3-hydroxy-α,α-dimethyl-1-adamantanemethanol in a yield of 67%.

Spectral Data of 3-Hydroxy-α,α-dimethyl-1-adamantanemethanol

MS (CI) m/e: 197, 179, 135

A total of 10 mmole of acryloyl chloride was added dropwise to a mixture of 10 mmole of the above-prepared 3-hydroxy-α,α-dimethyl-1-adamantanemethanol, 10 mmole of triethylamine and 40 ml of tetrahydrofuran over about 30 minutes. After completion of addition, the resulting mixture as stirred at room temperature for 6 hours. After the addition of water, the reaction mixture was concentrated, and the concentrate was subjected to column chromatography on a silica gel to thereby yield the title compound in a yield of 23%.

Spectral Data $^1$H-NMR (CDCl$_3$) δ: 1.52 (s, 6H), 1.54–1.70 (m, 13H), 2.27 (m, 2H), 5.73 (dd, 1H), 6.04 (dd, 1H), 6.28 (dd, 1H).

Production Example 5

Production of 1-Hydroxy-3-(1-methacryloyloxy-1-methylethyl)adamantane [2-2 (methacrylate)]

The procedure of Production Example 4 was repeated, except that methacryloyl chloride was used instead of acryloyl chloride, to thereby yield the title compound.

Spectral Data $^1$H-NMR (CDCl$_3$) δ: 1.52 (s, 6H), 1.54–1.70 (m, 13H), 1.92 (brs, 3H), 2.27 (m, 2H), 5.46 (brs, 1H), 6.02 (brs, 1H).

Production Example 6

Production of 1-Acryloyloxy-3-t-butoxycarbonyladamantane [2-13 (acrylate)]

Initially, 10 mmole of 1 adamantanol, 1 mmole of N-hydroxyphthalimide, 30 ml of acetic acid and 30 ml of 1,2-dichloroethane were placed in an autoclave and were stirred at 95° C. in an atmosphere of a gaseous mixture including 15 atm carbon monoxide and 1 atm air for 6 hours. The resulting reaction mixture was concentrated, and the concentrate was then subjected to column chromatography on a silica gel to thereby yield 1-carboxy-3-hydroxyadamantane in a yield of 47%.

A total of 25 mmole of acryloyl chloride was added dropwise to a mixture containing 10 mmole of the above-prepared 1-carboxy-3-hydroxyadamantane, 25 mmole of triethylamine and 40 ml of tetrahydrofuran over about 30 minutes. After the completion of addition, the resulting mixture was stirred at room temperature for 2 hours. After the addition of water, the reaction mixture was extracted with ethyl acetate, the organic layer was concentrated, and the concentrate was subjected to column chromatography on a silica gel to thereby yield 1-acryloyloxy-3-carboxyadamantane in a yield of 82%.

A mixture of 5 mmole of the above-prepared 1-acryloyloxy-3-carboxyadamantane, 50 mmole of isobutene, 0.5 mmole of sulfuric acid and 50 ml of dichloromethane was stirred at 0° C. for 24 hours. After concentrating the reaction mixture, the concentrate was subjected to column chromatography on a silica gel to thereby yield the title compound in a yield of 81%.

Spectral Data $^1$H-NMR (500 MHz, CDCl$_3$) δ: 1.43 (s, 9H), 1.55–2.23 (m, 12H), 2.28 (m, 2H), 5.74 (dd, 1H), 6.03 (dd, 1H), 6.30 (dd, 1H).

Production Example 7

Production of 1-t-Butoxycarbonyl-3-methacryloyloxyadamantane [2-13 (methacrylate)]

The title compound was obtained in a similar manner to that in Production Example 6, except that methacryloyl chloride was used instead of acryloyl chloride.

Spectral Data $^1$H-NMR (500 MHz, CDCl$_3$) δ: 1.45–1.63 (m, 6H), 1.92 (s, 3H), 2.00–2.19 (m, 7H), 2.30 (m, 2H), 5.52 (brs, 1H), 6.02 (brs, 1H).

Production Example 8

Production of 1-Acryloyloxy-3-t-butoxycarbonyl-5-hydroxyadamantane [2-15 (acrylate)]

The title compound was obtained in a similar manner to that in Production Example 6, except that 1,3-adamantanediol was used instead of 1-adamantanol to synthetically yield 1-carboxy-3,5-dihydroxyadamantane, and that this compound was allowed to react with acryloyl chloride and then with isobutene.

Spectral Data $^1$H-NMR (500 MHz, CDCl$_3$) δ: 1.43 (s, 9H), 1.60–2.22 (m, 12H), 2.38 (brs, 1H), 2.42 (m, 1H), 5.76 (dd, 1H), 6.03 (dd, 1H), 6.31 (dd, 1H).

Production Example 9

Production of 1-t-Butoxycarbonyl-3-hydroxy-5-methacryloyloxyadamantane [2-15 (methacrylate)]

The title compound was obtained in a similar manner to that in Production Example 8, except that methacryloyl chloride was used instead of acryloyl chloride.

Spectral Data $^1$H-NMR (500 MHz, CDCl$_3$) δ: 1.43 (s, 9H), 1.62–1.88 (m, 6H), 1.90 (s, 3H), 2.02–2.22 (m, 7H), 2.41 (m, 1H), 5.51 (brs, 1H), 6.02 (brs, 1H).

Production Example 10

Production of 1-Acryloyloxy-3-(2-tetrahydropyranyloxycarbonyl)adamantane [2-16 (acrylate)]

A mixture of 10 mmole of 1-acryloyloxy-3-carboxyadamantane obtained in a similar manner to that in Production Example 6, 12 mmole of dihydropyran, 1 mmole of p-toluenesulfonic acid and 30 ml of dichloromethane was stirred at 20° C. for 2 hours. After concentrating the reaction mixture, the resulting concentrate was subjected to column chromatography on a silica gel to thereby yield 1-acryloyloxy-3-(2-tetrahydropyranyloxycarbonyl) adamantane in a yield of 92%.

Spectral Data $^1$H-NMR (60 MHz, CDCl$_3$) δ: 1.2–2.6 (m, 20H), 3.5–4.2 (m, 2H), 5.7–6.6 (m, 4H).

Production Example 11

Production of 1-(2-Tetrahydropyranyloxycarbonyl)-3-methacryloyloxyadamantane [2-16 (methacrylate)]

The title compound was obtained in a similar manner to that in Production Example 10, except that 1-carboxy-3-methacryloyloxyadamantane obtained as an intermediate in the procedure of Production Example 7 was used instead of 1-acryloyloxy-3-carboxyadamantane.

Spectral Data $^1$H-NMR (60 MHz, CDCl$_3$) δ: 1.3–2.5 (m, 23H), 3.4–4.3 (m, 2H), 5.65 (brs, 1H), 6.0–6.3 (m, 2H).

Production Example 12

Production of 1-Acryloyloxy-3-hydroxy-5-(2-tetrahydropyranyloxycarbonyl) adamantane [2-18 (acrylate)]

The title compound was obtained in a similar manner to that in Production Example 10, except that, instead of 1-acryloyloxy-3-carboxyadamantane, 1-acryloyloxy-3-carboxy-5-hydroxyadamantane obtained as an intermediate in Production Example 8 was allowed to react with dihydropyran.

Spectral Data $^1$H-NMR (60 MHz, CDCl$_3$) δ: 1.1–2.5 (m, 20H), 3.5–4.2 (m, 2H), 5.7–6.5 (m, 4H).

Production Example 13

Production of 1-Hydroxy-3-(2-tetrahydropyranyloxycarbonyl)-5-methacryloy loxyadamantane [2-18 (methacrylate)]

The title compound was obtained in a similar manner to that in Production Example 10, except that 1-carboxy-3-hydroxy-5-methacryloyloxyadamantane obtained as an intermediate in Production Example 9 was allowed to react with dihydropyran.

Spectral Data $^1$H-NMR (60 MHz, CDCl$_3$) δ: 1.2–2.7 (m, 23H), 3.3–4.2 (m, 2H), 5.6 (brs, 1H), 6.0–6.3 (m, 2H).

Production Example 14

Production of 1-Acryloyloxy-3,5-bis(2-tetrahydropyranyloxycarbonyl)adama ntane [2-17 (acrylate)]

In an autoclave, 10 mmole of 1-adamantanol, 1 mmole of N-hydroxyphthalimide, 30 ml of acetic acid and 30 ml of 1,2-dichloroethane were placed and were stirred at 95° C. in an atmosphere of a gaseous mixture composed of 15 atm carbon monoxide gas and 1 atm air for 6 hours. After concentrating the reaction mixture, the resulting concentrate was subjected to column chromatography on a silica gel to thereby yield 1,3-dicarboxy-5-hydroxyadamantane in a yield of 21%.

The title compound was obtained in a similar manner to that in Production Example 10, except that the above-prepared 1,3-dicarboxy-5-hydroxyadamantane was used instead of 1-carboxy-3-hydroxyadamantane.

Spectral Data $^1$H-NMR (60 MHz, CDCl$_3$) δ: 1.3–2.7 (m, 25H), 3.4–4.3 (m, 4H), 5.6–6.5 (m, 5H).

Production Example 15

Production of 1,3-Bis(2-tetrahydropyranyloxycarbonyl)-5-methacryloyloxya damantane [2-17 (methacrylate)]

The title compound was obtained in a similar manner to that in Production Example 11, except that 1,3-dicarboxy-5-hydroxyadamantane prepared in a similar manner to that in Production Example 14 was used instead of 1-carboxy-3-hydroxyadamantane.

Spectral Data
$^1$H-NMR (60 MHz, CDCl$_3$) δ: 1.4–2.6 (m, 28H), 3.4–4.4 (m, 2H), 5.6 (brs, 1H), 6.0–6.3 (m, 2H).

Production Example 16
Production of 1-Acryloyloxy-3,5-bis(t-butoxycarbonyl)adamantane [2-14 (acrylate)]

The title compound was obtained in a similar manner to that in Production Example 6, except that 1,3-dicarboxy-5-hydroxyadamantane prepared in a similar manner to that in Production Example 14 was used instead of 1-carboxy-3-hydroxyadamantane.

Production Example 17
Production of 1-Acryloyloxy-3-hydroxyadamantane [3-1 (acrylate)]

A total of 13 mmole of acryloyl chloride was added dropwise to a mixture of 10 mmole of 1,3-adamantanediol, 15 mmole of triethylamine and 100 ml of tetrahydrofuran over about 30 minutes. After the completion of addition, the resulting mixture was stirred at 50° C. for 1.5 hours. After the addition of water, the reaction mixture was extracted with ethyl acetate, the organic layer was concentrated, and the resulting concentrate was subjected to column chromatography on a silica gel to thereby yield the title compound in a yield of 63%.

Spectral Data
$^1$H-NMR (CDCl$_3$) δ: 1.47–1.61 (m, 2H), 1.62–1.80 (m, 5H), 2.00–2.17 (m, 6H), 2.34 (m, 2H), 5.75 (dd, 1H), 6.03 (dd, 1H), 6.30 (dd, 1H).

Production Example 18
Production of 1-Hydroxy-3-methacryloyloxyadamantane [3-1 (methacrylate)]

The title compound was obtained in a similar manner to that in Production Example 17, except that methacryloyl chloride was used instead of acryloyl chloride.

Spectral Data
$^1$H-NMR (CDCl$_3$) δ: 1.48–1.61 (m, 6H), 1.89 (s, 3H), 2.00–2.16 (m, 7H), 2.34 (m, 2H), 5.49 (brs, 1H), 6.01 (brs, 1H).

Production Example 19
Production of 1-Acryloyloxy-3,5-dihydroxyadamantane [3-2 (acrylate)]

The title compound was obtained in a similar manner to that in Production Example 17, except that 1,3,5-adamantanetriol was used instead of 1,3-adamantanediol.

Spectral Data
$^1$H-NMR (DMSO-d$_6$) δ: 1.38–1.96 (m, 12H), 2.22 (m, 1H), 4.60 (brs, 2H), 5.81 (dd, 1H), 6.03 (dd, 1H), 6.21 (dd, 1H).

Production Example 20
Production of 1,3-Dihydroxy-5-methacryloyloxyadamantane [3-2 (methacrylate)]

The title compound was obtained in a similar manner to that in Production Example 17, except that 1,3,5-adamantanetriol and methacryloyl chloride were used instead of 1,3-adamantanediol and acryloyl chloride, respectively.

Spectral Data
$^1$H-NMR (DMSO-d$_6$) δ: 1.38–1.58 (m, 6H), 1.81 (s, 3H), 1.83–1.95 (m, 6H), 2.22 (m, 1H), 4.60 (brs, 2H), 5.58 (brs, 1H), 5.92 (brs, 1H).

Production Example 21
Production of 2-Acryloyloxy-1,5-dihydroxy-2-methyladamantane [2-23 (acrylate)]

A mixture of 30 mmole of 2-keto-1-adamantanol, 3 mmole of N-hydroxyphthalimide, 0.03 mmole of acetylacetonatocobalt(III) and 35 ml of acetic acid was stirred at 60° C. in an oxygen atmosphere (1 atm) for 12 hours. The resulting reaction mixture was concentrated, and the concentrate was subjected to column chromatography on a silica gel to thereby yield 2-keto-1,5-adamantanediol as a white solid matter.

Separately, a solution of methylmagnesium bromide in THF (tetrahydrofuran) was prepared from 11 mmole of metal magnesium, 10 mmole of bromomethane and a small amount of iodine. A solution of the above-prepared 2-keto-1,5-adamantanediol in THF was added dropwise to the methylmagnesium bromide solution and was refluxed for 2 hours. The reaction mixture was then added dropwise to a 10% by weight aqueous hydrochloric acid cooled on ice, and the mixture was stirred for 2 hours. The mixture was adjusted to neutrality with a 10% by weight aqueous sodium hydroxide solution and was separated into an organic layer and an aqueous layer. The aqueous layer was concentrated and was crystallized from acetone to thereby yield 2-methyl-1,2,5-adamantanetriol.

A total of 6.5 mmole of acryloyl chloride was added dropwise to a mixture of 5 mmole of 2-methyl-1,2,5-adamantanetriol, 7.5 mmole of triethylamine and 50 ml of THF over about 15 minutes. After the completion of addition, the resulting mixture was stirred at room temperature for 1.5 hours. After the addition of water, the reaction mixture was extracted with ethyl acetate, the organic layer was concentrated, and the concentrate was subjected to column chromatography on a silica gel to thereby yield the title compound.

Production Example 22
Production of 2-Acryloyloxy-4,4-dimethyl-γ-butyrolactone [3-11 (acrylate)]

A mixture of 3 mmole of ethyl acrylate, 3 ml of 2-propanol, 0.6 mmole of N-hydroxyphthalimide, 0.003 mmole of cobalt(II) acetate, 0.010 mmole of acetylacetonatocobalt(III) and 1 ml of acetonitrile was stirred at 60° C. in an oxygen atmosphere (1 atm) for 12 hours. The reaction mixture was concentrated, and the concentrate was subjected to column chromatography on a silica gel to thereby yield 2-hydroxy-4,4-dimethyl-γ-butyrolactone in a yield of 75%.

Spectral Data of 2-Hydroxy-4,4-dimethyl-γ-butyrolactone
$^1$H-NMR (CDCl$_3$) δ: 1.42 (s, 3H), 1.51 (s, 3H), 2.06 (dd, 1H), 2.52 (dd, 1H), 3.03 (brs, 1H), 4.63 (t, 1H).

A mixture of 100 mmole of the above-prepared 2-hydroxy-4,4-dimethyl-γ-butyrolactone, 150 mmole of acryloyl chloride, 150 mmole of triethylamine and 300 ml of toluene was stirred at 25° C. for 4 hours. After the addition of water to the reaction mixture, the resulting organic layer was concentrated, and the concentrate was subjected to column chromatography on a silica gel to thereby yield 2-acryloyloxy-4,4-dimethyl-γ-butyrolactone in a yield of 85%.

Spectral Data of 2-Acryloyloxy-4,4-dimethyl-γ-butyrolactone
$^1$H-NMR (CDCl$_3$) δ: 1.42 (s, 3H), 1.52 (s, 3H), 2.06 (dd, 1H), 2.52 (dd, 1H), 5.65 (dd, 1H), 5.77 (dd, 1H), 6.03 (dd, 1H), 6.32 (dd, 1H).

Production Example 23

Production of 2-Methacryloyloxy-4,4-dimethyl-γ-butyrolactone [3-11 (methacrylate)]

The title compound was obtained in a similar manner to that in Production Example 22, except that methacryloyl chloride was used instead of acryloyl chloride.

Spectral Data $^1$H-NMR (CDCl$_3$) δ: 1.42 (s, 3H), 1.48 (s, 3H), 1.90 (s, 3H), 2.15 (dd, 1H), 2.62 (dd, 1H), 5.66 (brs, 1H), 6.18 (brs, 1H).

Production Example 24

Production of 2-Acryloyloxy-2,4,4-trimethyl-γ-butyrolactone [3-12 (acrylate)]

The title compound was obtained in a similar manner to that in Production Example 22, except that ethyl methacrylate was used instead of ethyl acrylate.

Spectral Data $^1$H-NMR (CDCl$_3$) δ: 1.45 (s, 3H), 1.57 (s, 3H), 2.16 (dd, 1H), 2.63 (dd, 1H), 5.74 (dd, 1H), 6.03 (dd, 1H), 6.32 (dd, 1H).

Production Example 25

Production of 2-Methacryloyloxy-2,4,4-trimethyl-γ-butyrolactone [3-12 (methacrylate)]

The title compound was obtained in a similar manner to that in Production Example 22, except that ethyl methacrylate and methacryloyl chloride were used instead of ethyl acrylate and acryloyl chloride, respectively.

Spectral Data $^1$H-NMR (CDCl$_3$) δ: 1.47 (s, 3H), 1.59 (s, 3H), 1.68 (d, 3H), 1.94 (dd, 3H), 2.20 (d, 1H), 2.60 (d, 1H), 5.64 (t, 1H), 6.17 (s, 1H).

Production Example 26

Production of 3-Acryloyloxy-4,4-dimethyl-γ-butyrolactone [2-32 (acrylate)]

In dioxane, 2-hydroxy-4,4-dimethyl-γ-butyrolactone prepared in the same manner as in Production Example 22 was subjected to a reaction (a dehydration reaction) with an equivalent amount of P$_2$O$_5$ at room temperature to thereby yield a corresponding α,β-unsaturated-γ-butyrolactone (yield: 30%). Next, this substance was allowed to react with m-chloroperbenzoic acid (MCPBA) in methylene chloride at room temperature to thereby yield 2,3-epoxy-4,4-dimethyl-γ-butyrolactone (yield: 85%). Hydrogen was bubbled into a mixture of 10 mmole of the above-prepared 2,3-epoxy-4,4-dimethyl-γ-butyrolactone, 1 g of a 5% by weight Pd—C and 20 ml of tetrahydrofuran at room temperature for 11 hours. The resulting reaction mixture was filtrated and concentrated, and the concentrate was subjected to column chromatography on a silica gel to thereby yield 3-hydroxy-4,4-dimethyl-γ-butyrolactone in a yield of 63%.

The above-prepared 3-hydroxy-4,4-dimethyl-γ-butyrolactone was allowed to react with acryloyl chloride in a similar manner to that in Production Example 22 to thereby yield the title compound in a yield of 87%.

Spectral Data

MS m/e: 185 (M$^+$)

IR (cm$^{-1}$): 3040, 1770, 1650, 1150.

Production Example 27

Production of 3-Methacryloyloxy-4,4-dimethyl-γ-butyrolactone [2-32 (methacrylate)]

The title compound was obtained in a similar manner to that in Production Example 26, except that methacryloyl chloride was used instead of acryloyl chloride.

Spectral Data

MS m/e: 199 (M$^+$).

IR (cm$^{-1}$): 3045, 1772, 1190.

Production Example 28

Production of 3-Acryloyloxy-3,4,4-trimethyl-γ-butyrolactone [2-33 (acrylate)]

Using ethyl crotonate instead of ethyl acrylate, the procedure of Production Example 22 was repeated to thereby yield 2-hydroxy-3,4,4-trimethyl-γ-butyrolactone in a yield of 15%. The obtained 2-hydroxy-3,4,4-trimethyl-γ-butyrolactone was subjected to a reaction (a dehydration reaction) with an equivalent amount of P$_2$O$_5$ in dioxane at room temperature to thereby yield a corresponding α,β-unsaturated γ-butyrolactone (yield: 34%). This substance was then allowed to react with m-chloroperbenzoic acid (MCPBA) in methylene chloride at room temperature to thereby yield 2,3-epoxy-3,4,4-trimethyl-γ-butyrolactone (yield: 75%). Hydrogen was bubbled into a mixture of 10 mmole of the above-prepared 2,3-epoxy-3,4,4-trimethyl-γ-butyrolactone, 1 g of a 5% by weight Pd—C and 20 ml of tetrahydrofuran at room temperature for 11 hours. The resulting reaction mixture was filtrated and concentrated, and the concentrate was subjected to column chromatography on a silica gel to thereby yield 3-hydroxy-3,4,4-trimethyl-γ-butyrolactone in a yield 82%.

The above-prepared 3-hydroxy-3,4,4-trimethyl-γ-butyrolactone was allowed to react with acryloyl chloride in a similar manner to that in Production Example 22 to thereby yield the title compound in a yield of 85%.

Spectral Data

MS m/e: 199 (M$^+$).

IR (cm$^{-1}$): 3020, 1768, 1210.

Production Example 29

Production of 3-Methacryloyloxy-3,4,4-trimethyl-γ-butyrolactone [2-33 (methacrylate)]

The title compound was obtained in a similar manner to that in Production Example 28, except that methacryloyl chloride was used instead of acryloyl chloride.

Spectral Data

MS m/e: 211 (M$^+$).

IR (cm$^{-1}$): 3010, 1765, 1200.

EXAMPLE 1
Synthesis of Resin with Following Structure

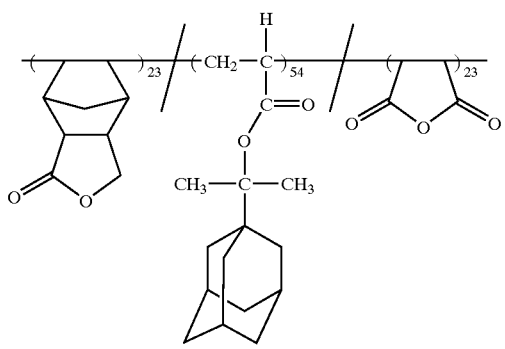

In a 100-ml round bottom flask equipped with a reflux condenser, stirrer and three way stopcock, 1.81 g (12.0 mmole) of the monomer [1-1], 7.01 g (28.3 mmole) of the monomer[2-1] (acrylate), 1.18 g (12.0 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was purified by putting the reaction mixture into 500 ml of a mixture of hexane and isopropyl alcohol (1:1) and separating the resulting precipitate by filtration. The recovered precipitate was dried under a reduced pressure, was dissolved in 30 ml of n-butyl acetate, and the above precipitation and purification procedures were repeated to thereby yield 6.88 g of the target resin. The recovered polymer had a weight average molecular weight (Mw) of 10000 and a molecular weight distribution (Mw/Mn) of 2.59 as determined by GPC (gel permeation chromatography) analysis. In $^1$H-NMR (in DMSO-d6) spectrum, signals were observed at 1.0–3.1 (broad), 1.5, 1.9, 2.2, 2.8, 3.7 and 4.2 ppm.

The $^1$H-NMR spectrum of the used monomer [1-1] are as follows (ditto with the following examples).

$^1$H-NMR (500 MHz, CDCl$_3$) δ: 1.46 (d, 1H), 1.65 (m, 1H), 3.05–3.14 (m, 2H), 3.22–3.28 (m, 1H), 3.32–3.37 (m, 1H), 3.80 (dd, 1H), 4.28 (dd, 1H), 6.28 (dd, 1H), 6.31 (dd, 1H).

EXAMPLE 2
Synthesis of Resin with Following Structure

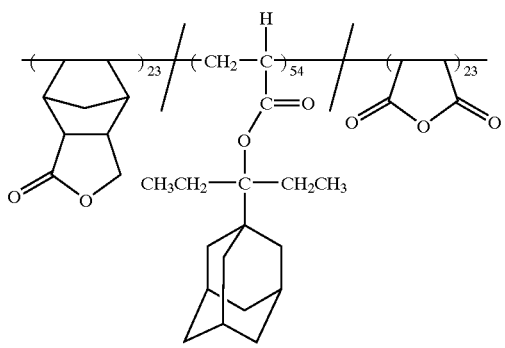

In a 100-ml round bottom flask equipped with a reflux condenser, stirrer and three way stopcock, 1.67 g (11.2 mmole) of the monomer [1-1], 7.23 g (26.2 mmole) of the monomer [2-3] (acrylate), 1.09 g (11.2 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 6.90 g of the target resin. The recovered polymer had a weight average molecular weight (Mw) of 10300 and a molecular weight distribution (Mw/Mn) of 2.63 as determined by GPC analysis. In $^1$H-NMR (in DMSO-d6) spectrum, signals were observed at 1.0–3.1 (broad), 1.5, 1.9, 2.2, 2.8, 3.7 and 4.2 ppm.

EXAMPLE 3
Synthesis of Resin with Following Structure

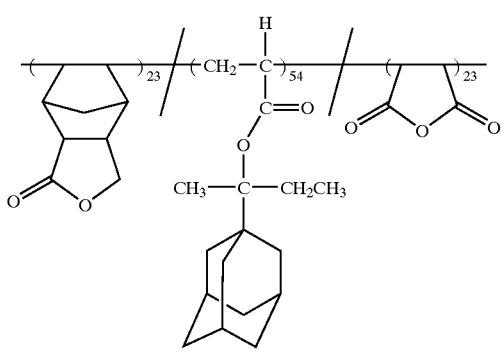

In a 100-ml round bottom flask equipped with a reflux condenser, stirrer and three way stopcock, 1.75 g (11.6 mmole) of the monomer [1-1], 7.11 g (27.3 mmole) of the monomer [2-5] (acrylate), 1.14 g (11.6 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 6.70 g of the target resin. The recovered polymer had a weight average molecular weight (Mw) of 10100 and a molecular weight distribution (Mw/Mn) of 2.72 as determined by GPC analysis. In $^1$H-NMR (in DMSO-d6) spectrum, signals were observed at 1.0–3.1 (broad), 1.5, 1.9, 2.2, 2.8, 3.7 and 4.2 ppm.

EXAMPLE 4
Synthesis of Resin with Following Structure

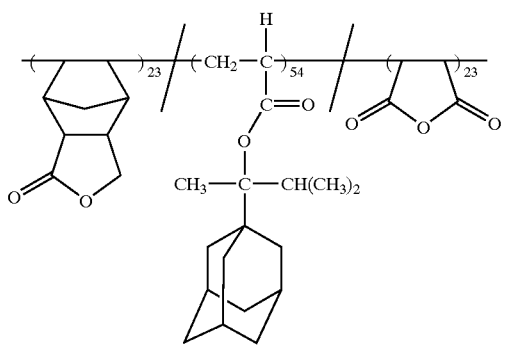

In a 100-ml round bottom flask equipped with a reflux condenser, stirrer and three way stopcock, 1.67 g (11.2 mmole) of the monomer [1-1], 7.23 g (26.2 mmole) of the monomer [2-7] (acrylate), 1.09 g (11.2 mmole) of the monomer [3-27] and 1.00 goof an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 7.01 g of the target resin. The recovered polymer had a weight average molecular weight (Mw) of 10500 and a molecular weight distribution (Mw/Mn) of 2.59 as determined by GPC analysis. In $^1$H-NMR (in DMSO-d6) spectrum, signals were observed at 1.0–3.1 (broad), 1.5, 1.9, 2.2, 2.8, 3.7 and 4.2 ppm.

EXAMPLE 5
Synthesis of Resin with Following Structure

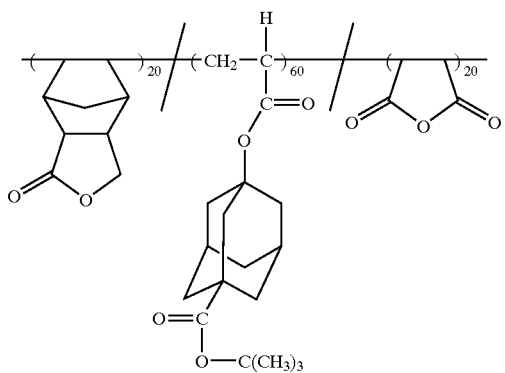

In a 100-ml round bottom flask equipped with a reflux condenser, stirrer and three way stopcock, 1.29 g (8.58 mmole) of the monomer [1-1], 7.87 g (25.7 mmole) of the monomer [2-13] (acrylate), 0.84 g (8.58 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 7.04 g of the target resin. The recovered polymer had a weight average molecular weight (Mw) of 10000 and a molecular weight distribution (Mw/Mn) of 2.62 as determined by GPC analysis. In $^1$H-NMR (in DMSO-d6) spectrum, signals were observed at 1.0-3.1 (broad), 1.5, 1.9, 2.2, 2.8, 3.7 and 4.2 ppm.

EXAMPLE 6

Synthesis of Resin with Following Structure

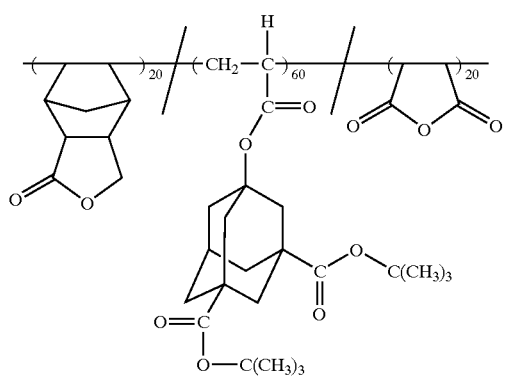

In a 100-ml round bottom flask equipped with a reflux condenser, stirrer and three way stopcock, 1.02 g (6.82 mmole) of the monomer [1-1], 8.31 g (20.5 mmole) of the monomer [2-14] (acrylate), 0.67 g (6.82 mmole) of the monomer [3-27] and 1.00 g of an initiator ("IV-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 6.96 g of the target resin. The recovered polymer had a weight average molecular weight (Mw) of 10300 and a molecular weight distribution (Mw/Mn) of 2.60 as determined by GPC analysis. In $^1$H-NMR (in DMSO-d6) spectrum, signals were observed at 1.0–3.1 (broad), 1.5, 1.9, 2.2, 2.8, 3.7 and 4.2 ppm.

EXAMPLE 7

Synthesis of Resin with Following Structure

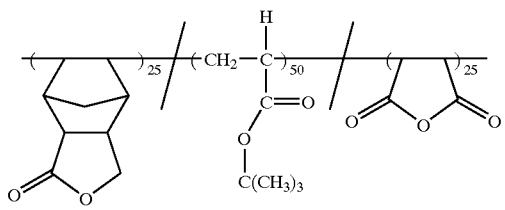

In a 100-ml round bottom flask equipped with a reflux condenser, stirrer and three way stopcock, 2.98 g (19.8 mmole) of the monomer [1-1], 5.08 g (39.6 mmole) of the monomer [2-25] (acrylate), 1.94 g (19.8 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 7.03 g of the target resin. The recovered polymer had a weight average molecular weight (Mw) of 10400 and a molecular weight distribution (Mw/Mn) of 2.73 as determined by GPC analysis. In $^1$H-NMR (in DMSO-d6) spectrum, signals were observed at 1.0–3.1 (broad), 1.5, 2.8, 3.7 and 4.2 ppm.

EXAMPLE 8

Synthesis of Resin with Following Structure

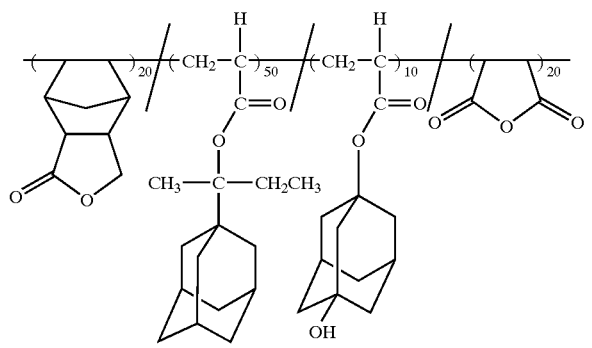

In a 100-ml round bottom flask equipped with a reflux condenser, stirrer and three way stopcock, 1.53 g (10.2 mmole) of the monomer [1-1], 6.33 g (25.5 mmole) of the monomer [2-1] (acrylate), 1.13 g (5.11 mmole) of the monomer [3-1] (acrylate), 1.00 g (10.2 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 6.99 g of the target resin. The recovered polymer had a weight average molecular weight (Mw) of 10000 and a molecular weight distribution (Mw/Mn) of 2.59 as determined by GPC analysis. In $^1$H-NMR (in DMSO-d6) spectrum, signals were observed at 1.0–3.1 (broad), 1.5, 1.9, 2.2, 2.8, 3.7, 4.2 and 4.6 ppm.

EXAMPLE 9

Synthesis of Resin with Following Structure

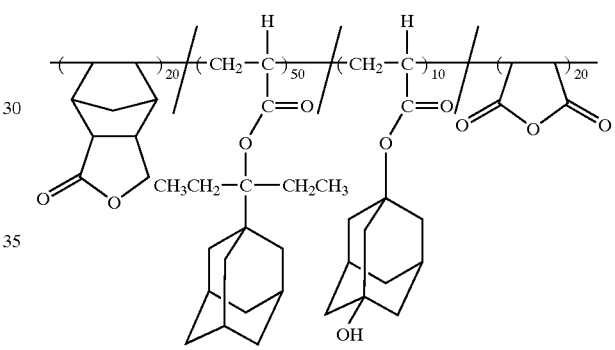

In a 100-ml round bottom flask equipped with a reflux condenser, stirrer and three way stopcock, 1.43 g (9.53 mmole) of the monomer [1-1], 6.58 g (23.8 mmole) of the monomer [2-3] (acrylate), 1.06 g (4.77 mmole) of the monomer [3-1] (acrylate), 0.93 g (9.53 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 7.01 g of the target resin. The recovered polymer had a weight average molecular weight (Mw) of 10300 and a molecular weight distribution (Mw/Mn) of 2.58 as determined by GPC analysis. In $^1$H-NMR (in DMSO-d6) spectrum, signals were observed at 1.0–3.1 (broad), 1.5, 1.9, 2.2, 2.8, 3.7, 4.2 and 4.6 ppm.

EXAMPLE 10
Synthesis of Resin with Following Structure

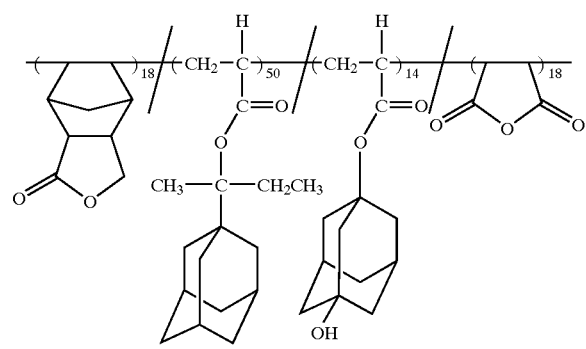

In a 100-ml round bottom flask equipped with a reflux condenser, stirrer and three way stopcock, 1.31 g (8.75 mmole) of the monomer [1-1], 6.32 g (24.3 mmole) of the monomer [2-5] (acrylate), 1.51 g (6.81 mmole) of the monomer [3-1] (acrylate), 0.86 g (8.75 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 7.23 g of the target resin. The recovered polymer had a weight average molecular weight (Mw) of 10000 and a molecular weight distribution (Mw/Mn) of 2.65 as determined by GPC analysis. In $^1$H-NMR (in DMSO-d6) spectrum, signals were observed at 1.0–3.1 (broad), 1.5, 1.9, 2.2, 2.8, 3.7, 4.2 and 4.6 ppm.

EXAMPLE 11
Synthesis of Resin with Following Structure

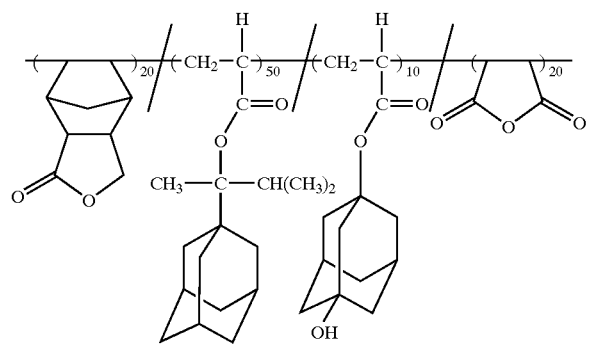

In a 100-ml round bottom flask equipped with a reflux condenser, stirrer and three way stopcock, 1.43 g (9.53 mmole) of the monomer [1-1], 6.58 g (23.8 mmole) of the monomer [2-7] (acrylate), 1.06 g (4.77 mmole) of the monomer [3-1] (acrylate), 0.93 g (9.53 mmole) of the monomer [3-27] and 1.00 g of an initiator ("V-601" produced by Wako Pure Chemical condenser, stirrer and three way stopcock, 0.82 g (5.45 mmole) of the monomer [1-1], 0.41 g (21.0 mmole) of the monomer [2-13] (acrylate), 2.23 g (4.19 mmole) of the monomer [3-1] (acrylate), 0.53 g (5.45 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 7.09 g of the target resin. The recovered polymer had a weight average molecular weight (Mw) of 10000 and a molecular weight distribution (Mw/Mn) of 2.57 as determined by GPC analysis. In $^1$H-NMR (in DMSO-d6) spectrum, signals were observed at 1.0–3.1 (broad), 1.5, 1.9, 2.2, 2.8, 3.7, 4.2 and 4.6 ppm.

EXAMPLE 13
Synthesis of Resin with Following Structure

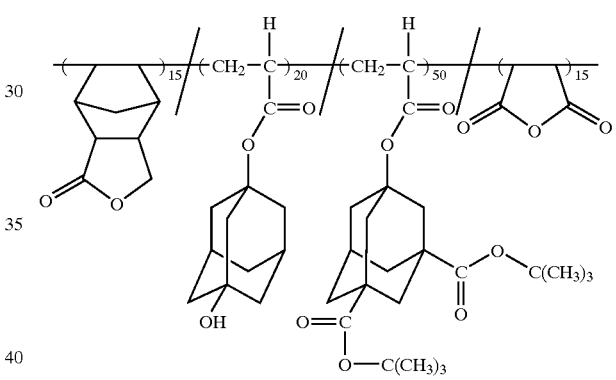

In a 100-ml round bottom flask equipped with a reflux condenser, stirrer and three way stopcock, 0.79 g (5.27 mmole) of the monomer [1-1], 7.13 g (17.6 mmole) of the monomer [2-14] (acrylate), 1.56 g (7.03 mmole) of the monomer [3-1] (acrylate), 0.52 g (5.27 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 7.24 g of the target resin. The recovered polymer had a weight average molecular weight (Mw) of 10100 and a molecular weight distribution (Mw/Mn) of 2.55 as determined by GPC analysis. In $^1$H-NMR (in DMSO-d6) spectrum, signals were observed at 1.0–3.1 (broad), 1.5, 1.9, 2.2, 2.8, 3.7, 4.2 and 4.6 ppm.

EXAMPLE 14
Synthesis of Resin with Following Structure

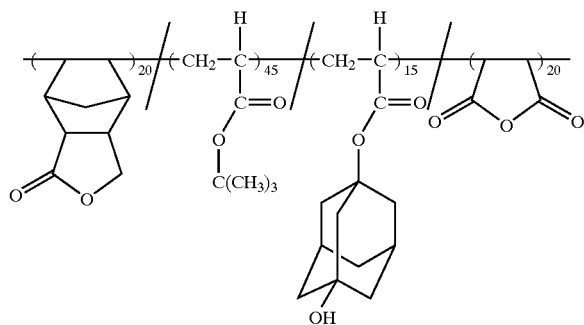

In a 100-ml round bottom flask equipped with a reflux condenser, stirrer and three way stopcock, 2.14 g (14.2 mmole) of the monomer [1-1], 4.10 g (32.0 mmole) of the monomer [2-25] (acrylate), 2.37 g (10.7 mmole) of the monomer [3-1] (acrylate), 1.40 g (14.2 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 7.04 g of the target resin. The recovered polymer had a weight average molecular weight (Mw) of 10100 and a molecular weight distribution (Mw/Mn) of 2.50 as determined by GPC analysis. In $^1$H-NMR (in DMSO-d6) spectrum, signals were observed at 1.0–3.1 (broad), 1.5, 1.9, 2.2, 2.8, 3.7, 4.2 and 4.6 ppm.

EXAMPLE 15
Synthesis of Resin with Following Structure

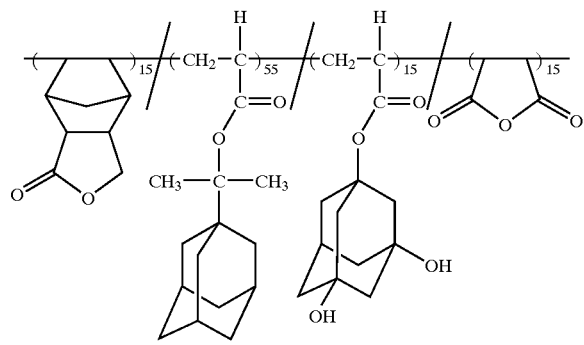

In a 100-ml round bottom flask equipped with a reflux condenser, stirrer and three way stopcock, 1.08 g (7.17 mmole) of the monomer [1-1], 6.52 g (26.2 mmole) of the monomer [2-1] (acrylate), 1.71 g (7.17 mmole) of the monomer [3-2] (acrylate), 0.70 g (7.17 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 7.12 g of the target resin. The recovered polymer had a weight average molecular weight (Mw) of 10200 and a molecular weight distribution (Mw/Mn) of 2.61 as determined by GPC analysis. In $^1$H-NMR (in DMSO-d6) spectrum, signals were observed at 1.0–3.1 (broad), 1.5, 1.9, 2.2, 2.8, 3.7, 4.2 and 4.6 ppm.

EXAMPLE 16

Synthesis of Resin with Following Structure

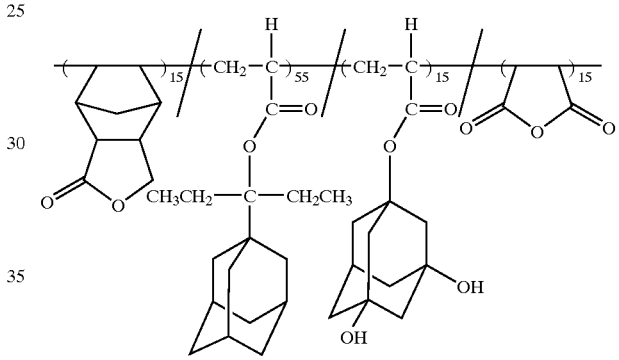

In a 100-ml round bottom flask equipped with a reflux condenser, stirrer and three way stopcock, 1.00 g (6.68 mmole) of the monomer [1-1], 6.76 g (24.5 mmole) of the monomer [2-3] (acrylate), 1.59 g (6.68 mmole) of the monomer [3-2] (acrylate), 0.65 g (6.68 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 7.20 g of the target resin. The recovered polymer had a weight average molecular weight (Mw) of 10300 and a molecular weight distribution (Mw/Mn) of 2.57 as determined by GPC analysis. In $^1$H-NMR (in DMSO-d6) spectrum, signals were observed at 1.0–3.1 (broad), 1.5, 1.9, 2.2, 2.8, 3.7, 4.2, 4.5 and 4.6 ppm.

EXAMPLE 17
Synthesis of Resin with Following Structure

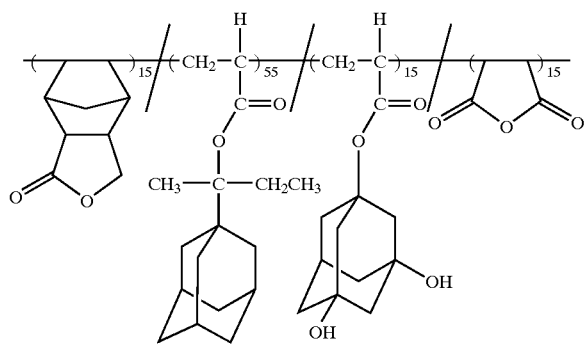

In a 100-ml round bottom flask equipped with a reflux condenser, stirrer and three way stopcock, 1.04 g (6.95 mmole) of the monomer [1-1], 6.62 g (25.4 mmole) of the monomer [2-5] (acrylate), 1.65 g (6.95 mmole) of the monomer [3-2] (acrylate), 0.68 g (6.95 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 7.09 g of the target resin. The recovered polymer had a weight average molecular weight (Mw) of 10000 and a molecular weight distribution (Mw/Mn) of 2.61 as determined by GPC analysis. In $^1$H-NMR (in DMSO-d6) spectrum, signals were observed at 1.0–3.1 (broad), 1.5, 1.9, 2.2, 2.8, 3.7, 4.2, 4.5 and 4.6 ppm.

EXAMPLE 18
Synthesis of Resin with Following Structure

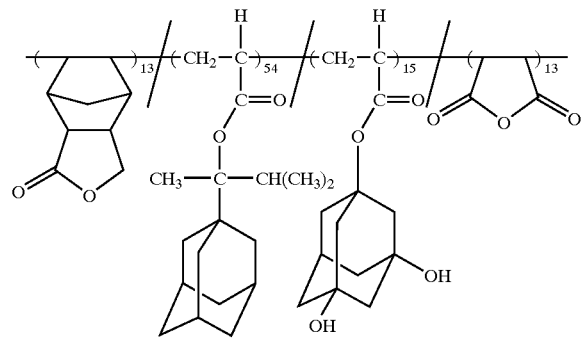

In a 100-ml round bottom flask equipped with a reflux condenser, stirrer and three way stopcock, 0.85 g (5.68 mmole) of the monomer [1-1], 6.51 g (23.5 mmole) of the monomer [2-7] (acrylate), 2.08 g (8.74 mmole) of the monomer [3-2] (acrylate), 0.56 g (5.68 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 7.23 g of the target resin. The recovered polymer had a weight average molecular weight (Mw) of 10300 and a molecular weight distribution (Mw/Mn) of 2.58 as determined by GPC analysis. In $^1$H-NMR (in DMSO-d6) spectrum, signals were observed at 1.0–3.1 (broad), 1.5, 1.9, 2.2, 2.8, 3.7, 4.2, 4.5 and 4.6 ppm.

EXAMPLE 19

Synthesis of Resin with Following Structure

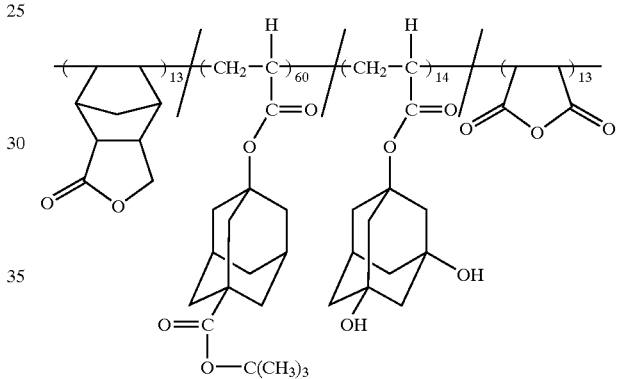

In a 100-ml round bottom flask equipped with a reflux condenser, stirrer and three way stopcock, 0.78 g (5.22 mmole) of the monomer [1-1], 7.37 g (24.0 mmole) of the monomer [2-13] (acrylate), 1.34 g (5.62 mmole) of the monomer [3-2] (acrylate), 0.51 g (5.22 mmole) of the monomer [3 -27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 6.93 g of the target resin. The recovered polymer had a weight average molecular weight (Mw) of 10000 and a molecular weight distribution (Mw/Mn) of 2.54 as determined by GPC analysis. In $^1$H-NMR (in DMSO-d6) spectrum, signals were observed at 1.0–3.1 (broad), 1.5, 1.9, 2.2, 2.8, 3.7, 4.2, 4.5 and 4.6 ppm.

EXAMPLE 20
Synthesis of Resin with Following Structure

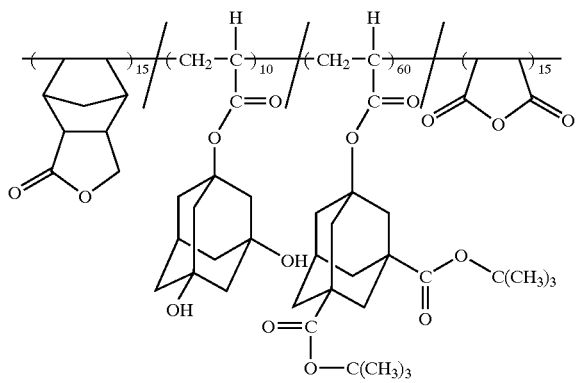

In a 100-ml round bottom flask equipped with a reflux condenser, stirrer and three way stopcock, 0.74 g (4.92 mmole) of the monomer [1-1], 8.00 g (19.6 mmole) of the monomer [2-14] (acrylate), 0.78 g (3.28 mmole) of the monomer [3-2] (acrylate), 0.48 g (4.92 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 7.11 g of the target resin. The recovered polymer had a weight average molecular weight (Mw) of 10500 and a molecular weight distribution (Mw/Mn) of 2.71 as determined by GPC analysis. In $^1$H-NMR (in DMSO-d6) spectrum, signals were observed at 1.0–3.1 (broad), 1.5, 1.9, 2.2, 2.8, 3.7, 4.2, 4.5 and 4.6 ppm.

EXAMPLE 21
Synthesis of Resin with Following Structure

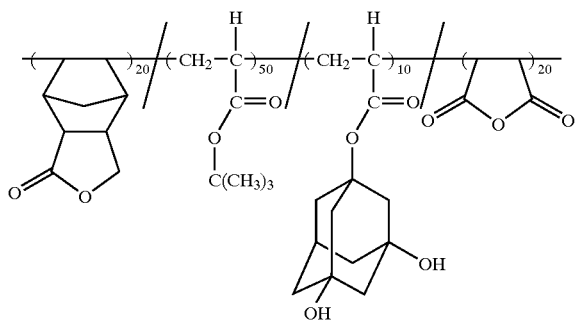

In a 100-ml round bottom flask equipped with a reflux condenser, stirrer and three way stopcock, 2.18 g (14.6 mmole) of the monomer [1-1], 4.66 g (36.3 mmole) of the monomer [2-25] (acrylate), 1.73 g (7.28 mmole) of the monomer [3-2] (acrylate), 1.43 g (14.6 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was-dissolved in 30 ml of n-butyl acetate, and the above precipitation and purification procedures were repeated to thereby yield 7.23 g of the target resin. The recovered polymer had a weight average molecular weight (Mw) of 10700 and a molecular weight distribution (Mw/Mn) of 2.73 as determined by GPC analysis. In $^1$H-NMR (in DMSO-d6) spectrum, signals were observed at 1.0–3.1 (broad), 1.5, 1.9, 2.2, 2.8, 3.7, 4.2, 4.5 and 4.6 ppm.

EXAMPLE 22

Synthesis of Resin with Following Structure

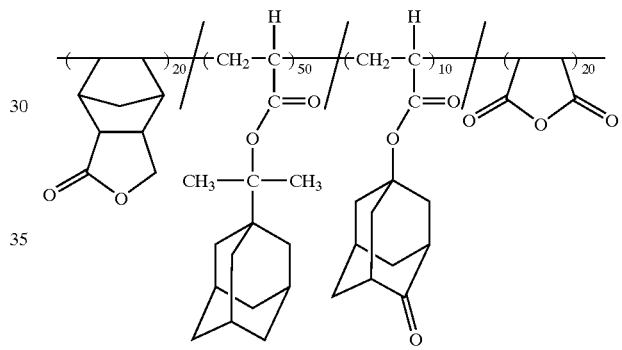

In a 100-ml round bottom flask equipped with a reflux condenser, stirrer and three way stopcock, 1.53 g (10.2 mmole) of the monomer [1-1], 6.34 g (25.6 mmole) of the monomer [2-1] (acrylate), 1.12 g (5.11 mmole) of the monomer [3-6](acrylate), 1.00 g (10.2 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 7.35 g of the target resin. The recovered polymer had a weight average molecular weight (Mw) of 10600 and a molecular weight distribution (Mw/Mn) of 2.61 as determined by GPC analysis. In $^1$H-NMR (in DMSO-d6) spectrum, signals were observed at 1.0–3.1 (broad), 1.5, 1.9, 2.2, 2.8, 3.7, 4.2, 4.5 and 4.6 ppm.

EXAMPLE 23
Synthesis of Resin with Following Structure

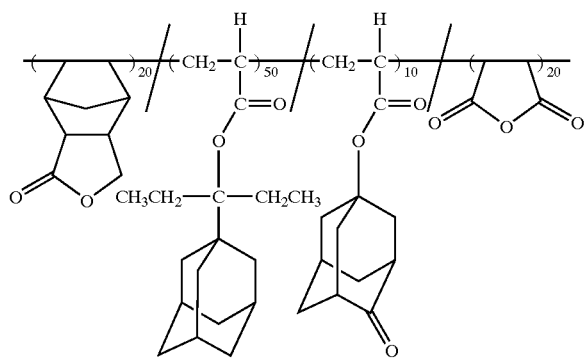

In a 100-ml round bottom flask equipped with a reflux condenser, stirrer and three way stopcock, 1.43 g (9.54 mmole) of the monomer [1-1], 6.58 g (23.8 mmole) of the monomer [2-3] (acrylate), 1.05 g (4.77 mmole) of the monomer [3-6] (acrylate), 0.94 g (9.54 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 7.56 g of the target resin. The recovered polymer had a weight average molecular weight (Mw) of 10600 and a molecular weight distribution (Mw/Mn) of 2.79 as determined by GPC analysis. In $^1$H-NMR (in DMSO-d6) spectrum, signals were observed at 1.0–3.1 (broad), 1.5, 1.9, 2.2, 2.8, 3.7, 4.2 and 4.6 ppm.

EXAMPLE 24
Synthesis of Resin with Following Structure

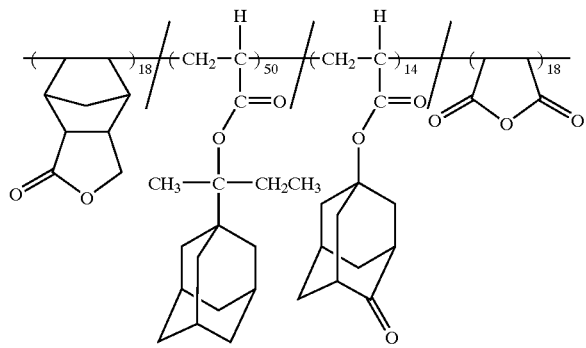

In a 100-ml round bottom flask equipped with a reflux condenser, stirrer and three way stopcock, 1.31 g (8.76 mmole) of the monomer [1-1], 6.33 g (24.3 mmole) of the monomer [2-5] (acrylate), 1.50 g (6.81 mmole) of the monomer [3-6] (acrylate), 0.86 g (8.76 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 7.33 g of the target resin. The recovered polymer had a weight average molecular weight (Mw) of 10400 and a molecular weight distribution (Mw/Mn) of 2.82 as determined by GPC analysis. In $^1$H-NMR (in DMSO-d6) spectrum, signals were observed at 1.0–3.1 (broad), 1.5, 1.9, 2.2, 2.8, 3.7, 4.2 and 4.6 ppm.

EXAMPLE 25
Synthesis of Resin with Following Structure

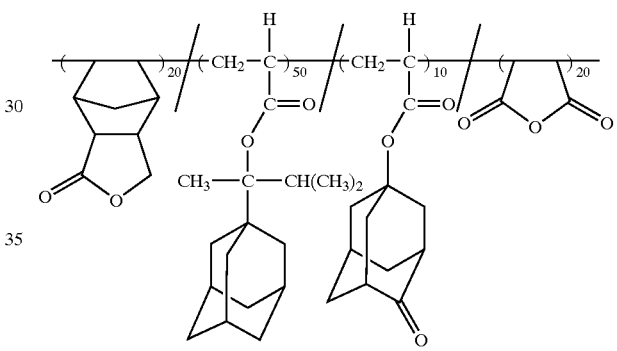

In a 100-ml round bottom flask equipped with a reflux condenser, stirrer and three way stopcock, 1.43 g (9.54 mmole) of the monomer [1-1], 6.58 g (23.8 mmole) of the monomer [2-7] (acrylate), 1.05 g (9.54 mmole) of the monomer [3-6] (acrylate), 0.94 g (9.54 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 7.56 g of the target resin. The recovered polymer had a weight average molecular weight (Mw) of 10400 and a molecular weight distribution (Mw/Mn) of 2.74 as determined by GPC analysis. In $^1$H-NMR (in DMSO-d6) spectrum, signals were observed at 1.0–3.1 (broad), 1.5, 1.9, 2.2, 2.8, 3.7, 4.2 and 4.6 ppm.

EXAMPLE 26
Synthesis of Resin with Following Structure

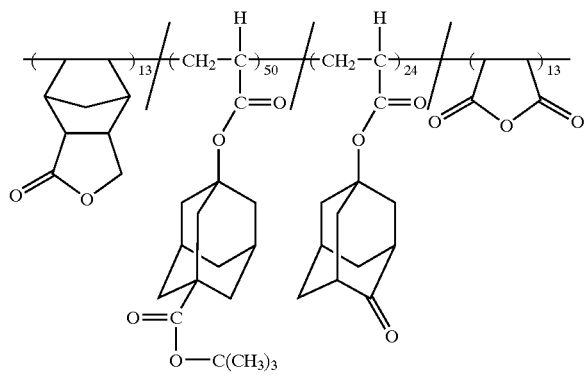

In a 100-ml round bottom flask equipped with a reflux condenser, stirrer and three way stopcock, 0.82 g (5.46 mmole) of the monomer [1-1], 6.43 g (21.0 mmole) of the monomer [2-13] (acrylate), 2.22 g (10.1 mmole) of the monomer [3-6] (acrylate), 0.54 g (5.46 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 6.97 g of the target resin. The recovered polymer had a weight average molecular weight (Mw) of 10200 and a molecular weight distribution (Mw/Mn) of 2.58 as determined by GPC analysis. In $^1$H-NMR (in DMSO-d6) spectrum, signals were observed at 1.0–3.1 (broad), 1.5, 1.9, 2.2, 2.8, 3.7, 4.2 and 4.6 ppm.

EXAMPLE 27
Synthesis of Resin with Following Structure

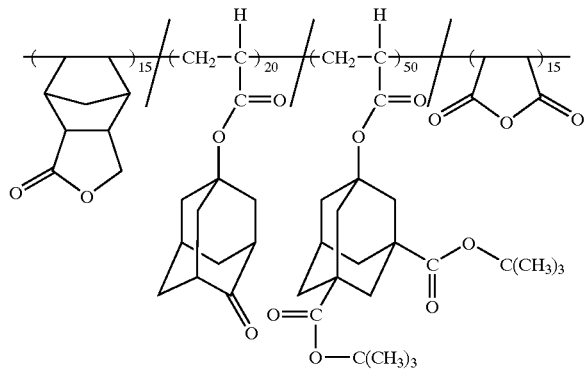

In a 100-ml round bottom flask equipped with a reflux condenser, stirrer and three way stopcock, 0.79 g (5.28 mmole) of the monomer [1-1], 7.14 g (17.6 mmole) of the monomer [2-14] (acrylate), 1.55 g (7.04 mmole) of the monomer [3-6] (acrylate), 0.52 g (5.28 mmole) of the monomer [3-27] and 1.00 g of an initiator ("V-601" produced by Wako Pure Chemical Industries, Ltd.) were placed and were dissolved in 10 g of n-butyl acetate Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedured were repeated to thereby yield 7.04 g of the target resin. The recovered polymer had a weight average molecular weight (Mw) of 10000 and a molecular weight distribution (Mw/Mn) of 2.59 as determined by GPC analysis. In $^1$H-NMR (in DMSO-d6) spectrum, signals were observed at 1.0–3.1 (broad), 1.5, 1.9, 2.2, 2.8, 3.7, 4.2 and 4.6 ppm.

EXAMPLE 28
Synthesis of Resin with Following Structure

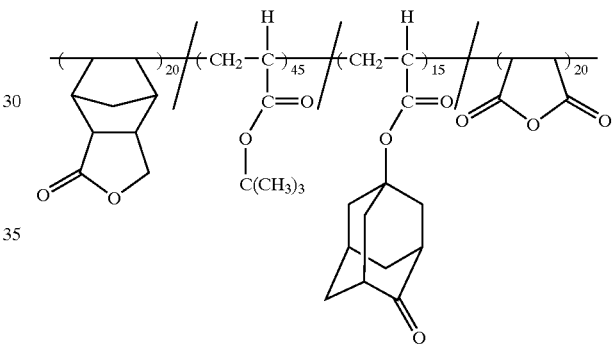

In a 100-ml round bottom flask equipped with a reflux condenser, stirrer and three way stopcock, 2.14 g (14.2 mmole) of the monomer [1-1], 4.11 g (32.1 mmole) of the monomer [2-25] (acrylate), 2.35 g (10.7 mmole) of the monomer [3-6] (acrylate), 1.40 g (14.2 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropul alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 7.06 g of the target resin. The recovered polymer had a weight average molecular weight (Mw) of 10100 and a molecular weight distribution (Mw/Mn) of 2.57 as determined by GPC analysis. In $^1$H-NMR (in DMSO-d6) spectrum, signals were observed at 1.0–3.1 (broad), 1.5, 1.9, 2.2, 2.8, 3.7, 4.2 and 4.6 ppm.

EXAMPLE 29
Synthesis of Resin with Following Structure

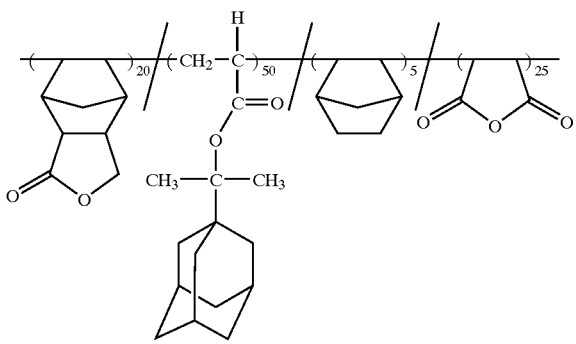

In a 100-ml round bottom flask equipped with a reflux condenser, stirrer and three way stopcock, 1.64 g (10.9 mmole) of the monomer [1-1], 6.77 g (27.2 mmole) of the monomer [2-1] (acrylate), 0.26 g (2.73 mmole) of the monomer [3-28], 1.34 g (13.6 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 7.23 g of the target resin. The recovered polymer had a weight average molecular weight (Mw) of 10800 and a molecular weight distribution (Mw/Mn) of 2.73 as determined by GPC analysis. In $^1$H-NMR (in DMSO-d6) spectrum, signals were observed at 1.0–3.1 (broad), 1.5, 1.9, 2.2, 2.8, 3.7 and 4.2 ppm.

EXAMPLE 30
Synthesis of Resin with Following Structure

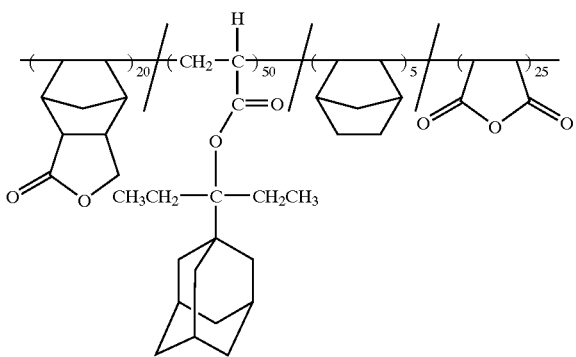

In a 100-ml round bottom flask equipped with a reflux condenser, stirrer and three way stopcock, 1.52 g (10.1 mmole) of the monomer [1-1], 7.00 g (25.3 mmole) of the monomer [2-3] (acrylate), 0.24 g (2.54 mmole) of the monomer [3-28], 1.24 g (12.7 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 6.89 g of the target resin. The recovered polymer had a weight average molecular weight (Mw) of 10000 and a molecular weight distribution (Mw/Mn) of 2.57 as determined by GPC analysis. In $^1$H-NMR (in DMSO-d6) spectrum, signals were observed at 1.0–3.1 (broad), 1.5, 1.9, 2.2, 2.8, 3.7 and 4.2 ppm.

EXAMPLE 31
Synthesis of Resin with Following Structure

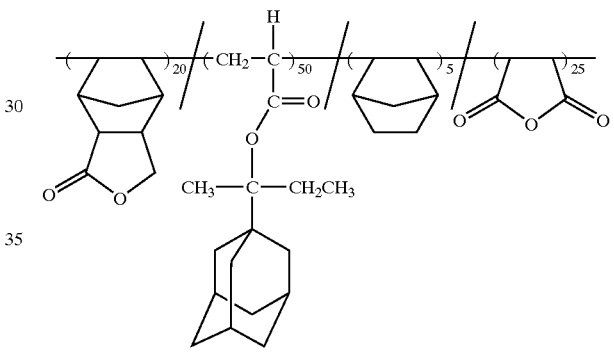

In a 100-ml round bottom flask equipped with a reflux condenser, stirrer and three way stopcock, 1.59 g (10.6 mmole) of the monomer [1-1], 6.87 g (26.4 mmole) of the monomer [2-5] (acrylate), 0.25 g (2.64 mmole) of the monomer [3-28], 1.29 g (13.2 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 7.20 g of the target resin. The recovered polymer had a weight average molecular weight (Mw) of 10200 and a molecular weight distribution (Mw/Mn) of 2.51 as determined by GPC analysis. In $^1$H-NMR (in DMSO-d6) spectrum, signals were observed at 1.0–3.1 (broad), 1.5, 1.9, 2.2, 2.8, 3.7 and 4.2 ppm.

EXAMPLE 32
Synthesis of Resin with Following Structure

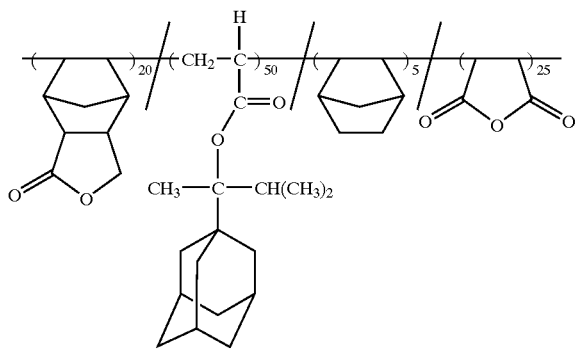

In a 100-ml round bottom flask equipped with a reflux condenser, stirrer and three way stopcock, 1.52 g (10.1 mmole) of the monomer [1-1], 7.00 g (25.3 mmole) of the monomer [2-7] (acrylate), 0.24 g (2.54 mmole) of the monomer [3-28], 1.24 g (12.7 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 7.21 g of the target resin. The recovered polymer had a weight average molecular weight (Mw) of 10300 and a molecular weight distribution (Mw/Mn) of 2.60 as determined by GPC analysis. In $^1$H-NMR (in DMSO-d6) spectrum, signals were observed at 1.0–3.1 (broad), 1.5, 1.9, 2.2, 2.8, 3.7 and 4.2 ppm.

EXAMPLE 33
Synthesis of Resin with Following Structure

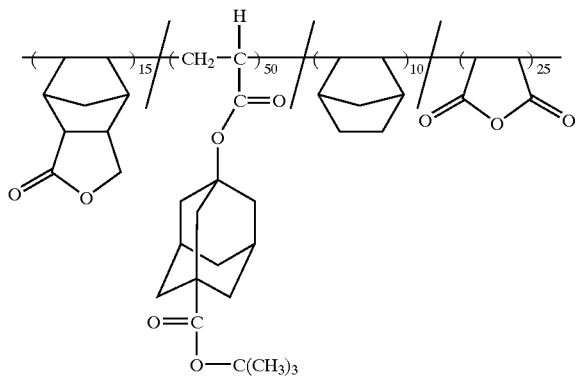

In a 100-ml round bottom flask equipped with a reflux condenser, stirrer and three way stopcock, 1.07 g (7.16 mmole) of the monomer [1-1], 7.31 g (23.9 mmole) of the monomer [2-13] (acrylate), 0.45 g (4.78 mmole) of the monomer [3-28], 1.17 g (11.9 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 7.10 g of the target resin. The recovered polymer had a weight average molecular weight (Mw) of 10500 and a molecular weight distribution (Mw/Mn) of 2.64 as determined by GPC analysis. In $^1$H-NMR (in DMSO-d6) spectrum, signals were observed at 1.0–3.1 (broad), 1.5, 1.9, 2.2, 2.8, 3.7 and 4.2 ppm.

EXAMPLE 34
Synthesis of Resin with Following Structure

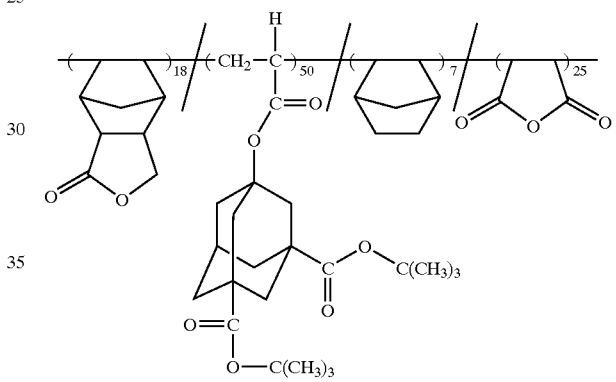

In a 100-ml round bottom flask equipped with a reflux condenser, stirrer and three way stopcock, 1.03 g (6.89 mmole) of the monomer [1-1], 7.78 g (19.2 mmole) of the monomer [2-14] (acrylate), 0.25 g (2.68 mmole) of the monomer [3-28], 0.94 g (9.58 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 6.93 g of the target resin. The recovered polymer had a weight average molecular weight (Mw) of 10300 and a molecular weight distribution (Mw/Mn) of 2.70 as determined by GPC analysis. In $^1$H-NMR (in DMSO-d6) spectrum, signals were observed at 1.0–3.1 (broad), 1.5, 1.9, 2.2, 2.8, 3.7 and 4.2 ppm.

EXAMPLE 35

Synthesis of Resin with Following Structure

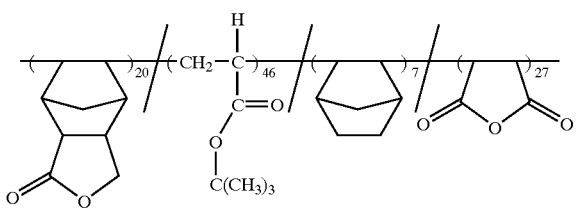

In a 100-ml round bottom flask equipped with a reflux condenser, stirrer and three way stopcock, 2.46 g (16.4 mmole) of the monomer [1-1], 4.83 g (37.7 mmole) of the monomer [2-25] (acrylate), 0.54 g (5.74 mmole) of the monomer [3-28], 2.17 g (22.1 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 7.00 g of the target resin. The recovered polymer had a weight average molecular weight (Mw) of 10000 and a molecular weight distribution (Mw/Mn) of 2.57 as determined by GPC analysis. In $^1$H-NMR (in DMSO-d6) spectrum, signals were observed at 1.0–3.1 (broad), 1.5, 1.9, 2.2, 2.8, 3.7 and 4.2 ppm.

EXAMPLE 36

Synthesis of Resin with Following Structure

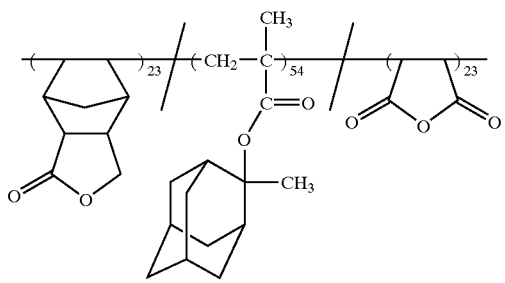

In a 100-ml round bottom flask equipped with a reflux condenser, stirrer and three way stopcock, 1.88 g (12.5 mmole) of the monomer [1-1], 6.89 g (29.4 mmole) of the monomer [2-19] (methacrylate), 1.23 g (1.25 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 6.90 g of the target resin. The recovered polymer had a weight average molecular weight (Mw) of 10500 and a molecular weight distribution (Mw/Mn) of 2.68 as determined by GPC analysis. In $^1$H-NMR (in DMSO-d6) spectrum, signals were observed at 1.0–3.1 (broad), 1.5, 1.9, 2.2, 2.8, 3.7 and 4.2 ppm.

EXAMPLE 37

Synthesis of Resin with Following Structure

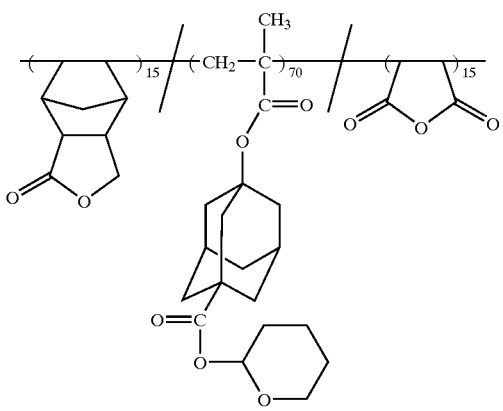

In a 100-ml round bottom flask equipped with a reflux condenser, stirrer and three way stopcock, 0.80 g (5.34 mmole) of the monomer [1-1], 8.68 g (24.9 mmole) of the monomer [2-16] (methacrylate), 0.52 g (5.34 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 6.95 g of the target resin. The recovered polymer had a weight average molecular weight (Mw) of 10700 and a molecular weight distribution (Mw/Mn) of 2.73 as determined by GPC analysis. In $^1$H-NMR (in DMSO-d6) spectrum, signals were observed at 0.6–3.1 (broad), 0.8, 1.5, 1.9, 2.2, 2.8, 3.7, 4.2 and 5.8 ppm.

EXAMPLE 38

Synthesis of Resin with Following Structure

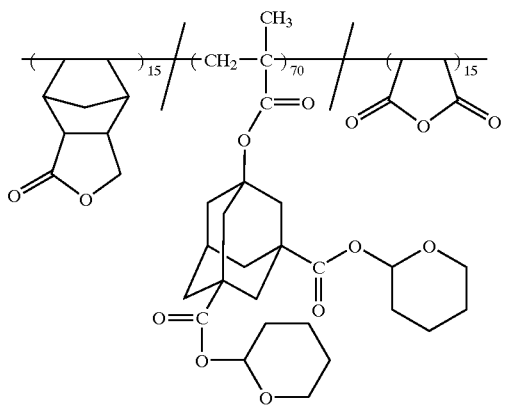

In a 100-ml round bottom flask equipped with a reflux condenser, stirrer and three way stopcock, 0.61 g (4.05 mmole) of the monomer [1-1], 9.00 g (18.9 mmole) of the monomer [2-17] (methacrylate), 0.40 g (4.05 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 7.34 g of the target resin. The recovered polymer had a weight average molecular weight (Mw) of and a molecular weight distribution (Mw/Mn) of 2.75 as determined by GPC analysis. In $^1$H-NMR (in DMSO-d6) spectrum, signals were observed at 0.6–3.1 (broad), 0.8, 1.5, 1.9, 2.2, 2.8, 3.7, 4.2 and 5.8 ppm.

EXAMPLE 39

Synthesis of Resin with Following Structure

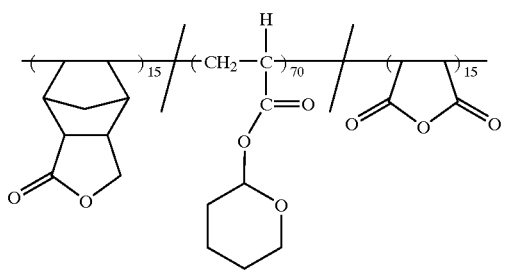

In a 100-ml round bottom flask equipped with a reflux condenser, stirrer and three way stopcock, 1.54 g (10.2 mmole) of the monomer [1-1], 7.46 g (47.8 mmole) of the monomer [2-26] (acrylate), 1.00 g (10.2 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 6.81 g of the target resin. The recovered polymer had a weight average molecular weight (Mw) of 10600 and a molecular weight distribution (Mw/Mn) of 2.55 as determined by GPC analysis. In $^1$H-NMR (in DMSO-d6) spectrum, signals were observed at 1.0–3.1 (broad), 1.5, 1.9, 2.2, 2.8, 3.7, 4.2 and 5.8 ppm.

EXAMPLE 40

Synthesis of Resin with Following Structure

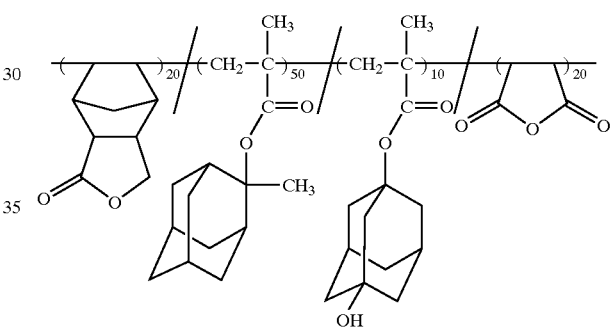

In a 100-ml round bottom flask equipped with a reflux condenser, stirrer and three way stopcock, 1.58 g (10.5 mmole) of the monomer [1-1], 6.15 g (26.3 mmole) of the monomer [2-26] (methacrylate), 1.24 g (5.26 mmole) of the monomer [3-1] (methacrylate), 1.03 g (10.5 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 6.80 g of the target resin. The recovered polymer had a weight average molecular weight (Mw) of 10900 and a molecular weight distribution (Mw/Mn) of 2.79 as determined by GPC analysis. In $^1$H-NMR (in DMSO-d6) spectrum, signals were observed at 0.6–3.1 (broad), 0.8, 1.5, 1.9, 2.2, 2.8, 3.7, 4.2 and 4.5 ppm.

EXAMPLE 41
Synthesis of Resin with Following Structure

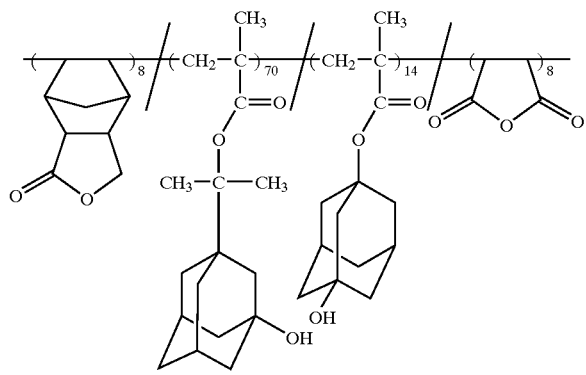

In a 100-ml round bottom flask equipped with a reflux condenser, stirrer and three way stopcock, 0.48 g (3.23 mmole) of the monomer [1-1], 7.86 g (28.3 mmole) of the monomer [2-2] (methacrylate), 1.34 g (5.66 mmole) of the monomer [3-1] (methacrylate), 0.32 g (3.23 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 6.62 g of the target resin. The recovered polymer had a weight average molecular weight (Mw) of 10900 and a molecular weight distribution (Mw/Mn) of 2.76 as determined by GPC analysis. In $^1$H-NMR (in DMSO-d6) spectrum, signals were observed at 0.6–3.1 (broad), 0.8, 1.5, 1.9, 2.2, 2.8, 3.7 and 4.2 ppm.

EXAMPLE 42
Synthesis of Resin with Following Structure

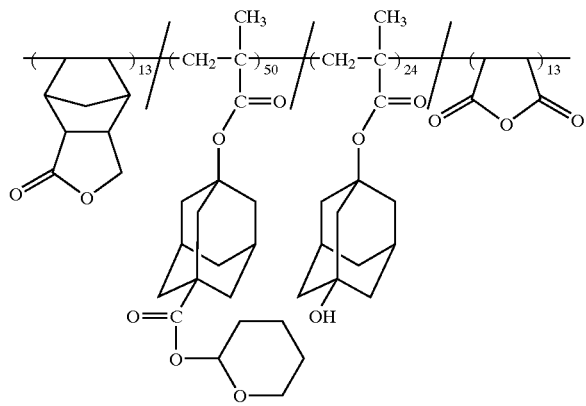

In a 100-ml round bottom flask equipped with a reflux condenser, stirrer and three way stopcock, 0.74 g (4.95 mmole) of the monomer [1-1], 6.62 g (19.0 mmole) of the monomer [2-16] (methacrylate), 2.15 g (9.13 mmole) of the monomer [3-1] (methacrylate), 0.48 g (4.95 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 7.33 g of the target resin. The recovered polymer had a weight average molecular weight (Mw) of 10700 and a molecular weight distribution (Mw/Mn) of 2.64 as determined by GPC analysis. In $^1$H-NMR (in DMSO-d6) spectrum, signals were observed at 0.6–3.1 (broad), 0.8, 1.5, 1.9, 2.2, 2.8, 3.7, 4.2, 4.5 and 5.8 ppm.

EXAMPLE 43
Synthesis of Resin with Following Structure

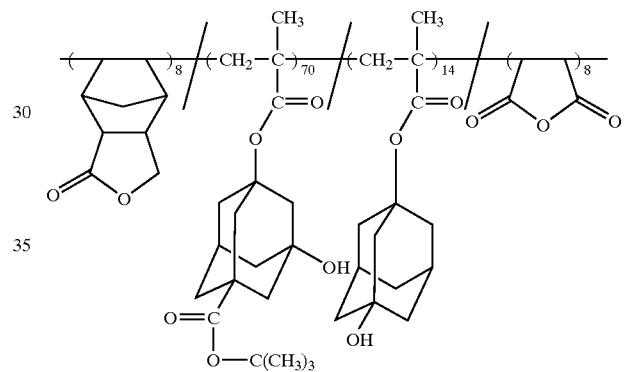

In a 100-ml round bottom flask equipped with a reflux condenser, stirrer and three way stopcock, 0.42 g (2.78 mmole) of the monomer [1-1], 8.16 g (24.3 mmole) of the monomer [2-15] (methacrylate), 1.15 g (4.86 mmole) of the monomer [3-1] (methacrylate), 0.27 g (2.78 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 6.80 g of the target resin. The recovered polymer had a weight average molecular weight (Mw) of 9900 and a molecular weight distribution (Mw/Mn) of 2.34 as determined by GPC analysis. In $^1$H-NMR (in DMSO-d6) spectrum, signals were observed at 0.6–3.1 (broad), 0.8, 1.5, 1.9, 2.2, 2.8, 3.7, 4.2 and 4.5 ppm.

EXAMPLE 44
Synthesis of Resin with Following Structure

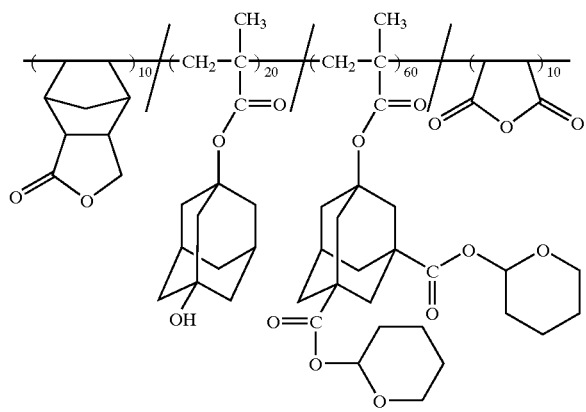

In a 100-ml round bottom flask equipped with a reflux condenser, stirrer and three way stopcock, 0.42 g (2.78 mmole) of the monomer [1-1], 7.99 g (16.8 mmole) of the monomer [2-17] (methacrylate), 1.32 g (5.59 mmole) of the monomer [3-1] (methacrylate), 0.27 g (2.78 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 6.82 g of the target resin. The recovered polymer had a weight average molecular weight (Mw) of 11000 and a molecular weight distribution (Mw/Mn) of 2.72 as determined by GPC analysis. In $^1$H-NMR (in DMSO-d6) spectrum, signals were observed at 0.6–3.1 (broad), 0.8, 1.5, 1.9, 2.2, 2.8, 3.7, 4.2, 4.5 and 5.8 ppm.

EXAMPLE 45
Synthesis of Resin with Following Structure

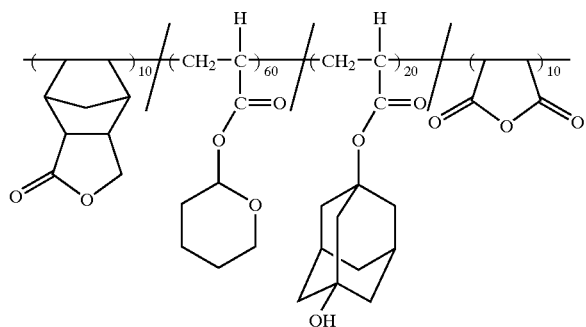

In a 100-ml round bottom flask equipped with a reflux condenser, stirrer and three way stopcock, 0.92 g (6.14 mmole) of the monomer [1-1], 5.75 g (36.9 mmole) of the monomer [2-26] (acrylate), 2.73 g (12.3 mmole) of the monomer [3-1] (acrylate), 0.60 g (6.14 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 7.50 g of the target resin. The recovered polymer had a weight average molecular weight (Mw) of 11000 and a molecular weight distribution (Mw/Mn) of 2.91 as determined by GPC analysis. In $^1$H-NMR (in DMSO-d6) spectrum, signals were observed at 1.0–3.1 (broad), 1.5, 1.9, 2.2, 2.8, 3.7, 4.2 and 4.6 ppm.

EXAMPLE 46
Synthesis of Resin with Following Structure

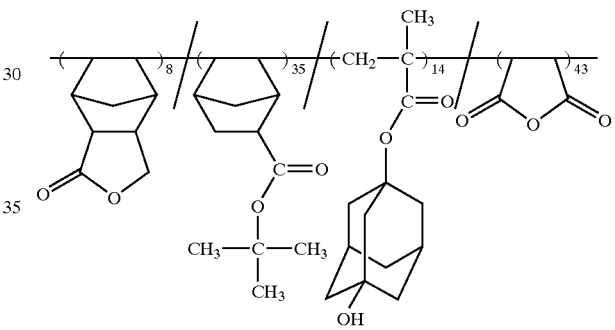

In a 100-ml round bottom flask equipped with a reflux condenser, stirrer and three way stopcock, 0.77 g (5.16 mmole) of the monomer [1-1], 4.38 g (22.6 mmole) of the monomer [2-34] (methacrylate), 2.13 g (9.03 mmole) of the monomer [3-1] (methacrylate), 2.72 g (27.7 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 7.56 g of the target resin. The recovered polymer had a weight average molecular weight (Mw) of 10700 and a molecular weight distribution (Mw/Mn) of 2.74 as determined by GPC analysis. In $^1$H-NMR (in DMSO-d6) spectrum, signals were observed at 0.6–3.1 (broad), 0.8, 1.5, 1.9, 2.2, 2.8, 3.7, 4.2 and 4.6 ppm.

EXAMPLE 47
Synthesis of Resin with Following Structure

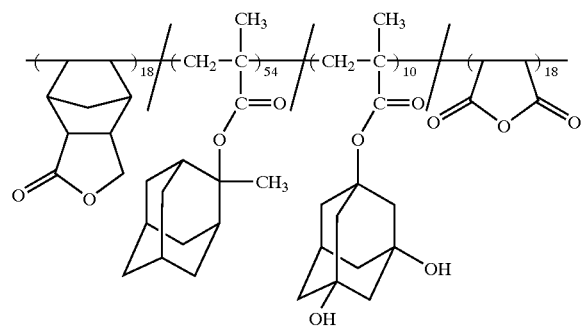

In a 100-ml round bottom flask equipped with a reflux condenser, stirrer and three way stopcock, 1.38 g (9.17 mmole) of the monomer [1-1], 6.44 g (27.5 mmole) of the monomer [2-19] (methacrylate), 1.28 g (5.10 mmole) of the monomer [3-2] (methacrylate), 0.90 g (9.17 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 7.40 g of the target resin. The recovered polymer had a weight average molecular weight (Mw) of 10700 and a molecular weight distribution (Mw/Mn) of 2.74 as determined by GPC analysis. In $^1$H-NMR (in DMSO-d6) spectrum, signals were observed at 0.6–3.1 (broad), 0.8, 1.5, 1.9, 2.2, 2.8, 3.7, 4.2 and 4.6 ppm.

EXAMPLE 48
Synthesis of Resin with Following Structure

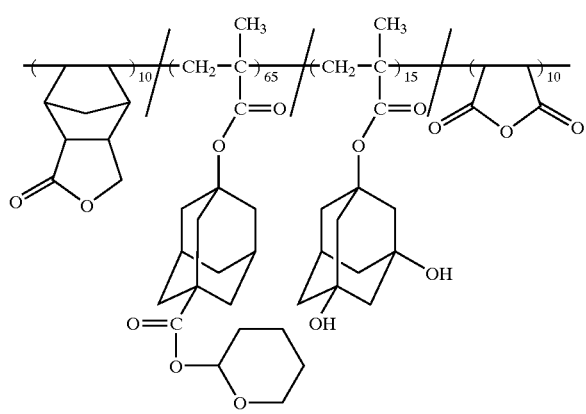

In a 100-ml round bottom flask equipped with a reflux condenser, stirrer and three way stopcock, 0.52 g (3.46 mmole) of the monomer [1-1], 7.83 g (22.5 mmole) of the monomer [2-16] (methacrylate), 1.31 g (5.19 mmole) of the monomer [3-2] (methacrylate), 0.34 g (3.46 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 6.70 g of the target resin. The recovered polymer had a weight average molecular weight (Mw) of 9800 and a molecular weight distribution (Mw/Mn) of 2.58 as determined by GPC analysis. In $^1$H-NMR (in DMSO-d6) spectrum, signals were observed at 0.6–3.1 (broad), 0.8, 1.5, 1.9, 2.2, 2.8, 3.7, 4.2, 4.6 and 5.8 ppm.

EXAMPLE 49
Synthesis of Resin with Following Structure

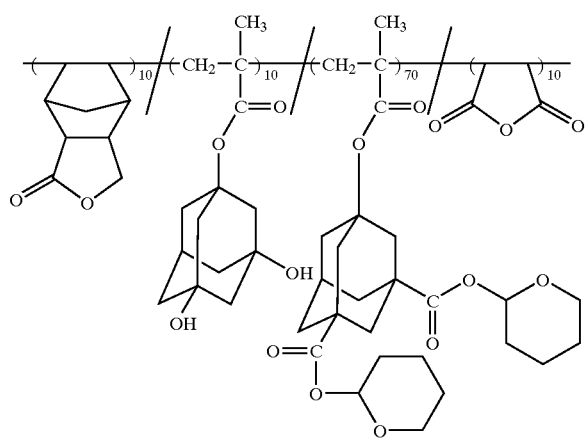

In a 100-ml round bottom flask equipped with a reflux condenser, stirrer and three way stopcock, 0.39 g (2.61 mmole) of the monomer [1-1], 8.69 g (18.3 mmole) of the monomer [2-17] (methacrylate), 0.66 g (2.61 mmole) of the monomer [3-2] (methacrylate), 0.26 g (2.61 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 7.03 g of the target resin. The recovered polymer had a weight average molecular weight (Mw) of 10800 and a molecular weight distribution (Mw/Mn) of 2.57 as determined by GPC analysis. In $^1$H-NMR (in DMSO-d6) spectrum, signals were observed at 0.6–3.1 (broad), 0.8, 1.5, 1.9, 2.2, 2.8, 3.7, 4.2, 4.6 and 5.8 ppm.

EXAMPLE 50
Synthesis of Resin with Following Structure

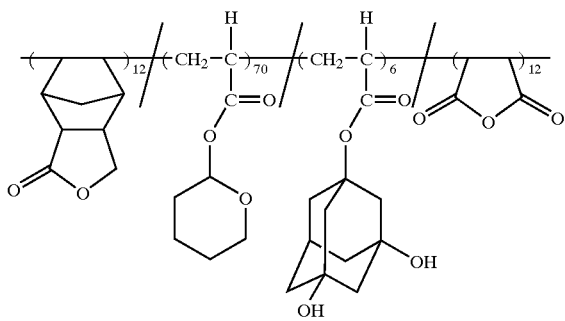

In a 100-ml round bottom flask equipped with a reflux condenser, stirrer and three way stopcock, 1.17 g (7.83 mmole) of the monomer [1-1], 7.13 g (45.7 mmole) of the monomer [2-26] (acrylate), 0.93 g (3.92 mmole) of the monomer [3-2] (acrylate), 0.77 g (7.83 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 6.89 g of the target resin. The recovered polymer had a weight average molecular weight (Mw) of 9600 and a molecular weight distribution (Mw/Mn) of 2.65 as determined by GPC analysis. In $^1$H-NMR (in DMSO-d6) spectrum, signals were observed at 1.0–3.1 (broad), 1.5, 1.9, 2.2, 2.8, 3.7, 4.2 and 4.6 ppm.

EXAMPLE 51
Synthesis of Resin with Following Structure

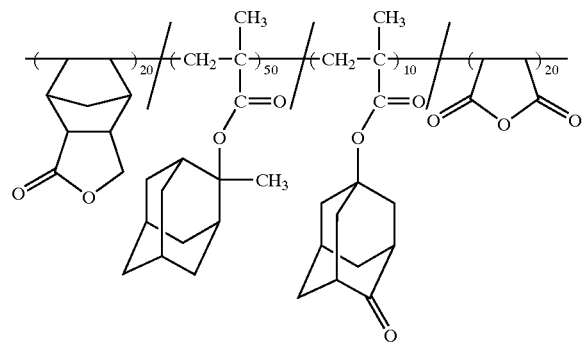

In a 100-ml round bottom flask equipped with a reflux condenser, stirrer and three way stopcock, 1.58 g (10.5 mmole) of the monomer [1-1], 6.16 g (26.3 mmole) of the monomer [2-19] (methacrylate), 1.23 g (5.26 mmole) of the monomer [3-6] (methacrylate), 1.03 g (10.5 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 7.08 g of the target resin. The recovered polymer had a weight average molecular weight (Mw) of 9900 and a molecular weight distribution (Mw/Mn) of 2.66 as determined by GPC analysis. In $^1$H-NMR (in DMSO-d6) spectrum, signals were observed at 0.6–3.1 (broad), 0.8, 1.5, 1.9, 2.2, 2.8, 3.7 and 4.2 ppm.

EXAMPLE 52

Synthesis of Resin with Following Structure

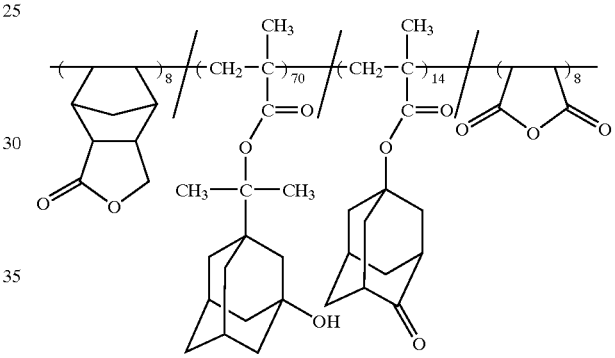

In a 100-ml round bottom flask equipped with a reflux condenser, stirrer and three way stopcock, 0.49 g (3.24 mmole) of the monomer [1-1], 7.87 g (28.3 mmole) of the monomer [2-2] (methacrylate), 1.33 g (5.66 mmole) of the monomer [3-6] (methacrylate), 0.32 g (3.24 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 6.79 g of the target resin. The recovered polymer had a weight average molecular weight (Mw) of 9700 and a molecular weight distribution (Mw/Mn) of 2.58 as determined by GPC analysis. In $^1$H-NMR (in DMSO-d6) spectrum, signals were observed at 0.6–3.1 (broad), 0.8, 1.5, 1.9, 2.2, 2.8, 3.7 and 4.2 ppm.

EXAMPLE 53
Synthesis of Resin with Following Structure

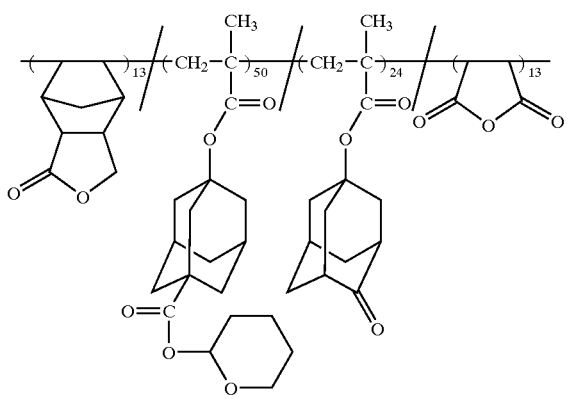

In a 100-ml round bottom flask equipped with a reflux condenser, stirrer and three way stopcock, 0.74 g (4.95 mmole) of the monomer [1-1], 6.63 g (19.1 mmole) of the monomer [2-16] (methacrylate), 2.14 g (9.14 mmole) of the monomer [3-6] (methacrylate), 0.49 g (4.95 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 7.11 g of the target resin. The recovered polymer had a weight average molecular weight (Mw) of 10500 and a molecular weight distribution (Mw/Mn) of 2.54 as determined by GPC analysis. In $^1$H-NMR (in DMSO-d6) spectrum, signals were observed at 0.6–3.1 (broad), 0.8, 1.5, 1.9, 2.2, 2.8, 3.7, 4.2 and 5.8 ppm.

EXAMPLE 54
Synthesis of Resin with Following Structure

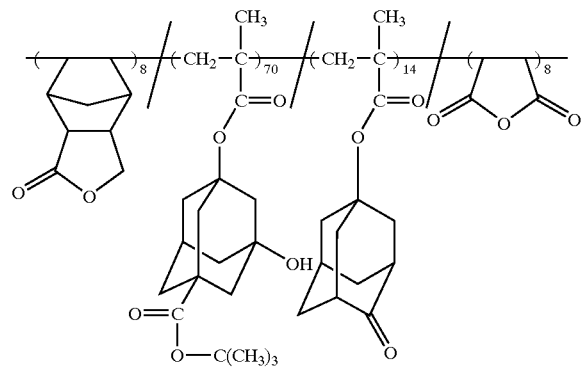

In a 100-ml round bottom flask equipped with a reflux condenser, stirrer and three way stopcock, 0.42 g (2.78 mmole) of the monomer [1-1], 8.17 g (24.3 mmole) of the monomer [2-15] (methacrylate), 1.14 g (4.86 mmole) of the monomer [3-6] (methacrylate), 0.27 g (2.78 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 7.40 g of the target resin. The recovered polymer had a weight average molecular weight (Mw) of 9000 and a molecular weight distribution (Mw/Mn) of 2.39 as determined by GPC analysis. In $^1$H-NMR (in DMSO-d6) spectrum, signals were observed at 0.6–3.1 (broad), 0.8, 1.5, 1.9, 2.2, 2.8, 3.7 and 4.2 ppm.

EXAMPLE 55
Synthesis of Resin with Following Structure

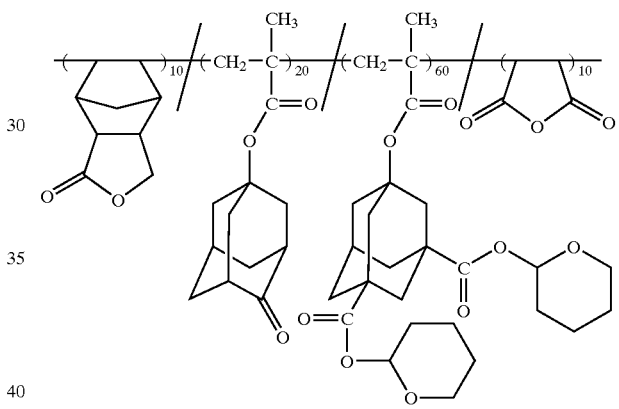

In a 100-ml round bottom flask equipped with a reflux condenser, stirrer and three way stopcock, 0.42 g (2.78 mmole) of the monomer [1-1], 8.00 g (16.8 mmole) of the monomer [2-17] (methacrylate), 1.31 g (5.60 mmole) of the monomer [3-6] (methacrylate), 0.27 g (2.78 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 6.78 g of the target resin. The recovered polymer had a weight average molecular weight (Mw) of 9700 and a molecular weight distribution (Mw/Mn) of 2.49 as determined by GPC analysis. In $^1$H-NMR (in DMSO-d6) spectrum, signals were observed at 0.6–3.1 (broad), 0.8, 1.5, 1.9, 2.2, 2.8, 3.7, 4.2 and 5.8 ppm.

EXAMPLE 56

Synthesis of Resin with Following Structure

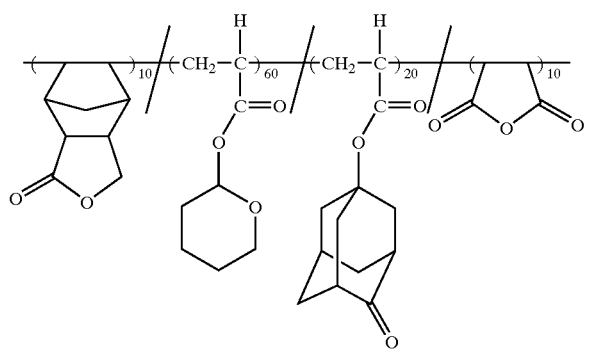

In a 100-ml round bottom flask equipped with a reflux condenser, stirrer and three way stopcock, 0.92 g (6.16 mmole) of the monomer [1-1], 5.76 g (36.9 mmole) of the monomer [2-26] (acrylate), 2.71 g (12.3 mmole) of the monomer [3-6] (acrylate), 0.60 g (6.16 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 6.90 g of the target resin. The recovered polymer had a weight average molecular weight (Mw) of 8900 and a molecular weight distribution (Mw/Mn) of 2.50 as determined by GPC analysis. In $^1$H-NMR (in DMSO-d6) spectrum, signals were observed at 1.0–3.1 (broad), 1.5, 1.9, 2.2, 2.8, 3.7, 4.2 and 5.8 ppm.

EXAMPLE 57

Synthesis of Resin with Following Structure

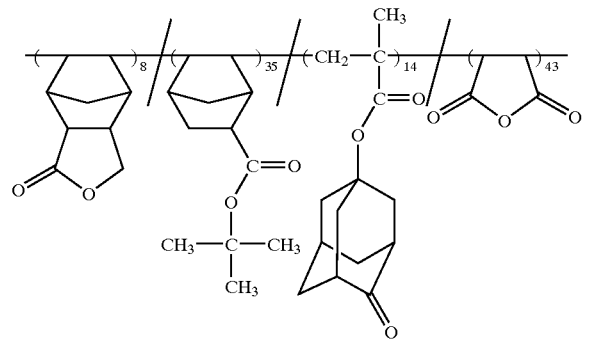

In a 100-ml round bottom flask equipped with a reflux condenser, stirrer and three way stopcock, 0.78 g (5.17 mmole) of the monomer [1-1], 4.39 g (22.6 mmole) of the monomer [2-34] (methacrylate), 2.12 g (9.04 mmole) of the monomer [3-6] (methacrylate), 2.72 g (27.8 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 6.78 g of the target resin. The recovered polymer had a weight average molecular weight (Mw) of 9000 and a molecular weight distribution (Mw/Mn) of 2.56 as determined by GPC analysis. In $^1$H-NMR (in DMSO-d6) spectrum, signals were observed at 0.6–3.1 (broad), 0.8, 1.5, 1.9, 2.2, 2.8, 3.7 and 4.2 ppm.

EXAMPLE 58

Synthesis of Resin with Following Structure

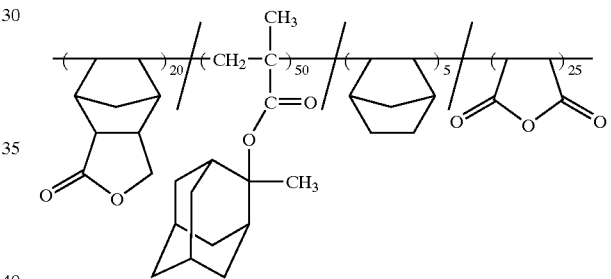

In a 100-ml round bottom flask equipped with a reflux condenser, stirrer and three way stopcock, 1.70 g (11.4 mmole) of the monomer [1-1], 6.64 g (28.3 mmole) of the monomer [2-19] (methacrylate), 0.27 g (2.84 mmole) of the monomer [3-28], 1.39 g (14.1 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 6.94 g of the target resin. The recovered polymer had a weight average molecular weight (Mw) of 9500 and a molecular weight distribution (Mw/Mn) of 2.49 as determined by GPC analysis. In $^1$H-NMR (in DMSO-d6) spectrum, signals were observed at 0.6–3.1 (broad), 0.8, 1.5, 1.9, 2.2, 2.8, 3.7 and 4.2 ppm.

EXAMPLE 59
Synthesis of Resin with Following Structure

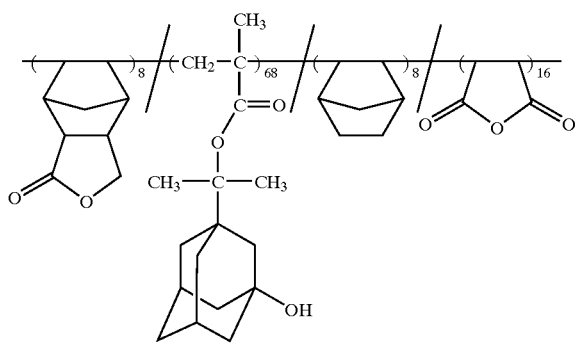

In a 100-ml round bottom flask equipped with a reflux condenser, stirrer and three way stopcock, 0.54 g (3.57 mmole) of the monomer [1-1], 8.43 g (30.3 mmole) of the monomer [2-2] (methacrylate), 0.21 g (2.23 mmole) of the monomer [3-28], 1.09 g (11.1 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 7.18 g of the target resin. The recovered polymer had a weight average molecular weight (Mw) of 10500 and a molecular weight distribution (Mw/Mn) of 2.79 as determined by GPC analysis. In $^1$H-NMR (in DMSO-d6) spectrum, signals were observed at 0.6–3.1 (broad), 0.8, 1.5, 1.9, 2.2, 2.8, 3.7, 4.2 and 4.6 ppm.

EXAMPLE 60
Synthesis of Resin with Following Structure

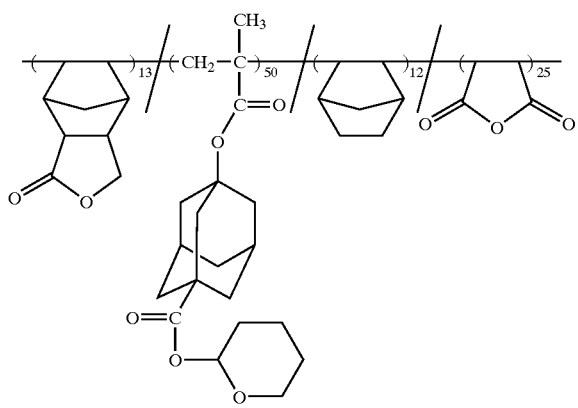

In a 100-ml round bottom flask equipped with a reflux condenser, stirrer and three way stopcock, 0.85 g (5.67 mmole) of the monomer [1-1], 7.59 g (21.8 mmole) of the monomer [2-16] (methacrylate), 0.49 g (5.23 mmole) of the monomer [3-28], 1.07 g (10.9 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 7.20 g of the target resin. The recovered polymer had a weight average molecular weight (Mw) of 10800 and a molecular weight distribution (Mw/Mn) of 2.67 as determined by GPC analysis. In $^1$H-NMR (in DMSO-d6) spectrum, signals were observed at 0.6–3.1 (broad), 0.8, 1.5, 1.9, 2.2, 2.8, 3.7, 4.2, 4.6 and 5.8 ppm.

EXAMPLE 61
Synthesis of Resin with Following Structure

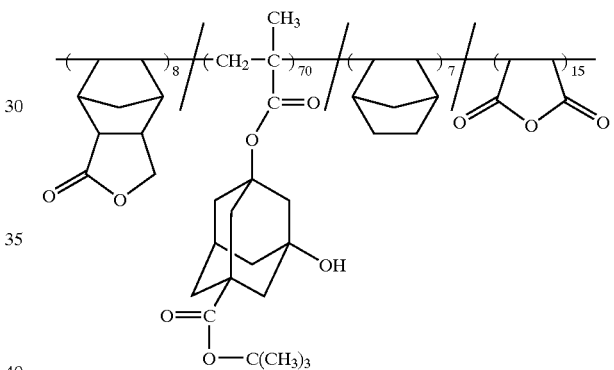

In a 100-ml round bottom flask equipped with a reflux condenser, stirrer and three way stopcock, 0.45 g (2.98 mmole) of the monomer [1-1], 8.76 g (26.0 mmole) of the monomer [2-15] (methacrylate), 0.25 g (2.61 mmole) of the monomer [3-28], 0.55 g (5.59 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 7.20 g of the target resin. The recovered polymer had a weight average molecular weight (Mw) of 10900 and a molecular weight distribution (Mw/Mn) of 2.56 as determined by GPC analysis. In $^1$H-NMR (in DMSO-d6) spectrum, signals were observed at 0.6–3.1 (broad), 0.8, 1.5, 1.9, 2.2, 2.8, 3.7, 4.2 and 4.6 ppm.

EXAMPLE 62
Synthesis of Resin with Following Structure

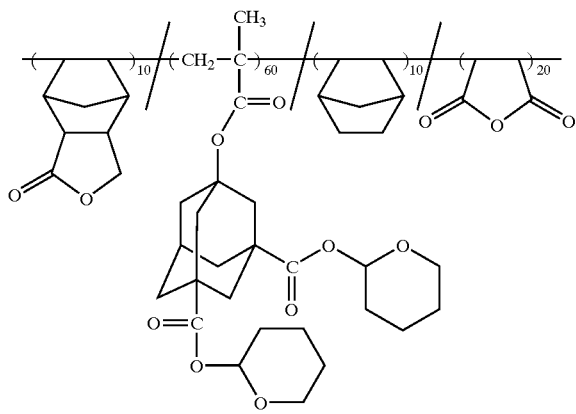

In a 100-ml round bottom flask equipped with a reflux condenser, stirrer and three way stopcock, 0.46 g (3.04 mmole) of the monomer [1-1], 8.67 g (18.2 mmole) of the monomer [2-17] (methacrylate), 0.29 g (3.03 mmole) of the monomer [3-28], 0.59 g (6.07 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 6.98 g of the target resin. The recovered polymer had a weight average molecular weight (Mw) of 9900 and a molecular weight distribution (Mw/Mn) of 2.64 as determined by GPC analysis. In $^1$H-NMR (in DMSO-d6) spectrum, signals were observed at 0.6–3.1 (broad), 0.8, 1.5, 1.9, 2.2, 2.8, 3.7, 4.2, 4.6 and 5.8 ppm.

EXAMPLE 63
Synthesis of Resin with Following Structure

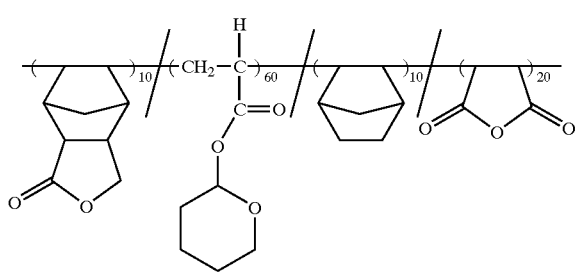

In a 100-ml round bottom flask equipped with a reflux condenser, stirrer and three way stopcock, 1.09 g (7.27 mmole) of the monomer [1-1], 6.80 g (43.6 mmole) of the monomer [2-26] (acrylate), 0.68 g (7.27 mmole) of the monomer [3-28], 1.42 g (14.5 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 7.29 g of the target resin. The recovered polymer had a weight average molecular weight (Mw) of 9400 and a molecular weight distribution (Mw/Mn) of 2.58 as determined by GPC analysis. In $^1$H-NMR (in DMSO-d6) spectrum, signals were observed at 1.0–3.1 (broad), 1.5, 1.9, 2.2, 2.8, 3.7, 4.2 and 5.8 ppm.

EXAMPLE 64
Synthesis of Resin with Following Structure

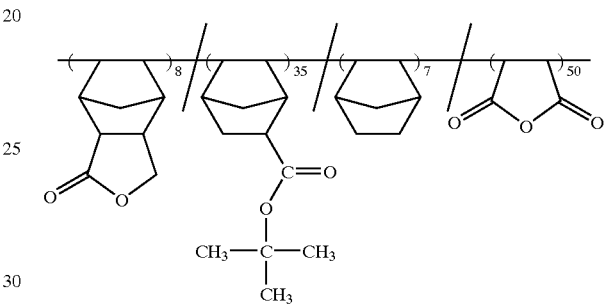

In a 100-ml round bottom flask equipped with a reflux condenser, stirrer and three way stopcock, 0.89 g (5.90 mmole) of the monomer [1-1], 5.01 g (25.8 mmole) of the monomer [2-34] (methacrylate), 0.49 g (5.17 mmole) of the monomer [3-28], 3.62 g (36.9 mmole) of the monomer [3-27] and 1.00 g of an initiator ("V-601" produced by Wako Pure Chemical Industries, Ltd.) were placed and were dissolved in 10 g of n-butyl acetate. Subsequently, the inside atmosphere of the flask was replaced with nitrogen gas, and the solution in the flask was stirred in an atmosphere of nitrogen gas for 6 hours, while maintaining the temperature of a reaction system at 70° C. The resulting reaction mixture was put into 500 ml of a mixture of hexane and isopropyl alcohol (1:1), and the resulting precipitate was separated by filtration to thereby purify a product. The recovered precipitate was dried under a reduced pressure, was dissolved in 30 ml of n-butyl acetate, and the above precipitation and purification procedures were repeated to thereby yield 7.46 g of the target resin. The recovered polymer had a weight average molecular weight (Mw) of 9700 and a molecular weight distribution (Mw/Mn) of 2.49 as determined by GPC analysis. In $^1$H-NMR (in DMSO-d6) spectrum, signals were observed at 1.0–3.1 (broad), 1.5, 1.9, 2.2, 2.8, 3.7, 4.2 and 4.6 ppm.

Test Example

A total of 100 parts by weight of each of the polymers obtained in the examples, 10 parts by weight of triphenylsulfonium hexafluoroantimonate and a solvent, ethyl lactate, were mixed to thereby yield a photoresist resin composition having a polymer concentration of 17% by weight. This photoresist resin composition was applied onto a silicon wafer by spin coating to form a photosensitive layer 1.0-μm thick. The photosensitive layer was subjected to prebaking on a hot plate at a temperature of 100° C. for 150 seconds and was exposed to light through a mask using KrF excimer laser having a wavelength of 247 nm at an irradiance of 30 mJ/cm². The exposed layer was then subjected to post-exposure baking at a temperature of 100° C. for 60 seconds; was subjected to development in a 0.3 M aqueous tetramethylammonium hydroxide solution for 60 seconds; and was rinsed with pure water to yield a pattern with a 0.25-μm line and space in any case.

What is claimed is:

1. A polymeric compound for photoresist, comprising a monomer unit represented by following Formula (I):

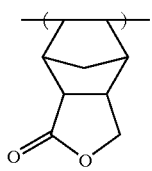
(I)

and having a weight average molecular weight (Mw) of from about 5000 to about 50000.

2. The polymeric compound for photoresist according to claim 1, having a molecular weight distribution (Mw/Mn) of from about 1.8 to about 3.5.

3. The polymeric compound for photoresist according to claim 1, comprising the monomer unit represented by Formula (I) and at least one selected from monomer units represented by following Formulae (IIa) to (IIg):

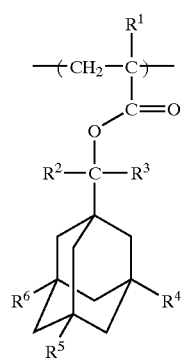
(IIa)

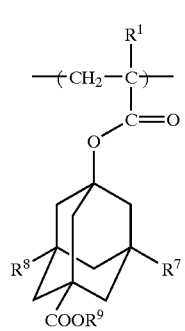
(IIb)

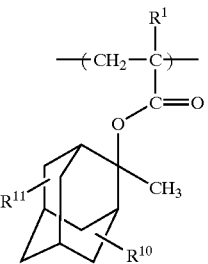
(IIc)

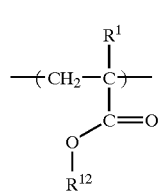
(IId)

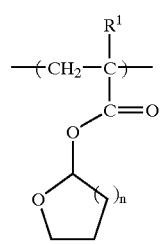
(IIe)

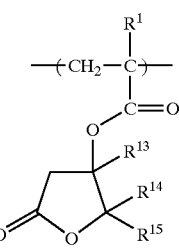
(IIf)

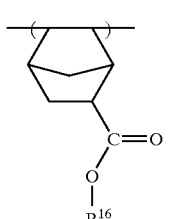
(IIg)

wherein $R^1$ is a hydrogen atom or a methyl group; $R^2$ and $R^3$ are the same or different and are each a hydrocarbon group having from 1 to 8 carbon atoms; $R^4$, $R^5$ and $R^6$ are the same or different and are each a hydrogen atom, a hydroxyl group or a methyl group; $R^7$ and $R^8$ are the same or different and are each a hydrogen atom, a hydroxyl group or a —COOR⁹ group, where $R^9$ is a t-butyl group, a 2-tetrahydrofuranyl group, a 2-tetrahydropyranyl group or an 2-oxepanyl group; $R^{10}$ and $R^{11}$ are the same or different and are each a hydrogen atom, a hydroxyl group or an oxo group; $R^{12}$ is a hydrocarbon group having a tertiary carbon atom at a bonding site with an oxygen atom indicated in the formula; $R^{13}$, $R^{14}$ and $R^{15}$ are the same or different and are each hydrogen atom or a methyl group; $R^{16}$ is a t-butyl group, a 2-tetrahydrofuranyl group, a 2-tetrahydropyranyl group or an 2-oxepanyl group; and n denotes an integer from 1 to 3.

4. The polymeric compound for photoresist according to claim 1, 2 or 3, further comprising at least one selected from monomer units represented by following Formulae (IIIa) to (IIIg)

(IIIa)
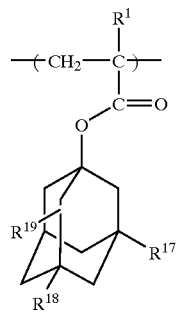

(IIIb)
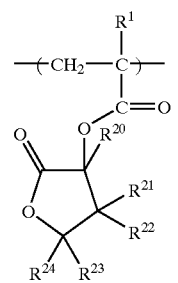

(IIIc)
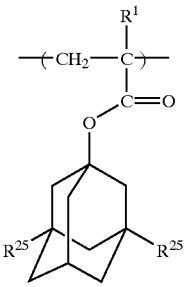

(IIId)
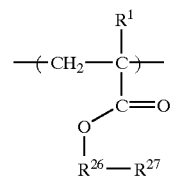

(IIIe)
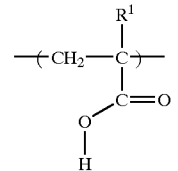

(IIIf)
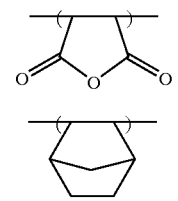

(IIIg)
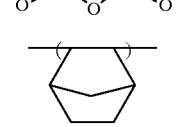

wherein $R^1$ is a hydrogen atom or a methyl group; $R^{17}$ and $R^{18}$ are the same or different and are each a hydrogen atom, a hydroxyl group or a carboxyl group; $R^{19}$ is a hydroxyl group, an oxo group or a carboxyl group; $R^{20}$, $R^{21}$, $R^{22}$ $R^{23}$ and $R^{24}$ are the same or different and are each a hydrogen atom or a methyl group; $R^{25}$ is a hydrogen atom or a methyl group; $R^{26}$ is a tricyclo[5.2.1.0$^{26}$]decylmethyl group, a tetracyclo[4.4.0.1$^{2,5}$.1$^{7,10}$]dodecylmethyl group, a norbornyl group, an isobornyl group or a 2-norbornylmethyl group; and $R^{27}$ is a substituent of $R^{26}$ and is a hydrogen atom, a hydroxyl group, a hydroxymethyl group, a carboxyl group or a —COOR$^{28}$ group, where $R^{28}$ is a t-butyl group, a 2-tetrahydrofuranyl group, a 2-tetrahydropyranyl group or an 2-oxepanyl group.

5. A resin composition for photoresist, comprising the polymeric compound for photoresist as claimed in any one of claims 1 to 3 and a light-activatable acid generator.

6. A method of manufacturing a semiconductor, the method comprising the steps of applying the resin composition for photoresist as claimed in claim 4 onto a base or substrate to thereby form a resist film; and subjecting the resist film to exposure and development to thereby produce a pattern.

7. A polymeric compound for photoresist, comprising a monomer unit represented by following Formula (I):

(I)
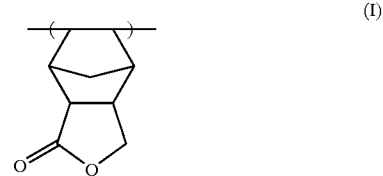

and having a weight average molecular weight (Mw) of from about 5000 to about 50000;

wherein the polymeric compound further comprises at least one monomer unit selected from Formulae (IIa) to (IIg):

(IIa)
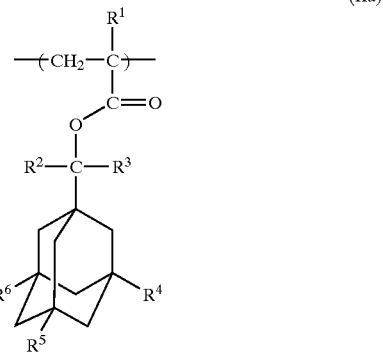

(IIb)
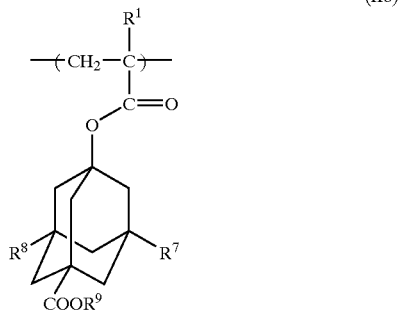

-continued (IIc) 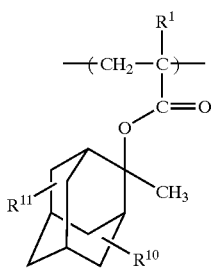

(IId) 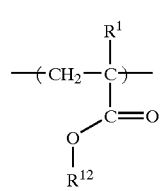

(IIe) 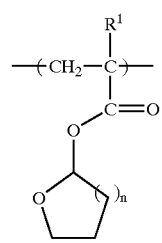

(IIf) 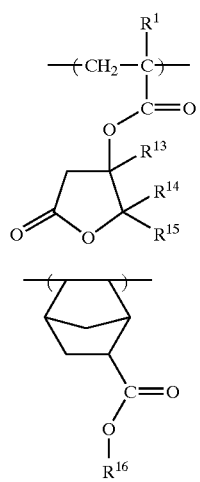

(IIg)

wherein $R^1$ is a hydrogen atom or a methyl group; $R^2$ and $R^3$ are the same or different and are each a hydrocarbon group having from 1 to 8 carbon atoms; $R^4$, $R^5$ and $R^6$ are the same or different and are each a hydrogen atom, a hydroxyl group or a methyl group; $R^7$ and $R^8$ are the same or different and are each a hydrogen atom, a hydroxyl group or a —$COOR^9$ group, where $R^9$ is a t-butyl group, a 2-tetrahydrofuranyl group, a 2-tetrahydropyranyl group or an 2-oxepanyl group; $R^{10}$ and $R^{11}$ are the same or different and are each a hydrogen atom, a hydroxyl group or an oxo group; $R^{12}$ is a hydrocarbon group having a tertiary carbon atom at a bonding site with an oxygen atom indicated in the formula; $R^{13}$, $R^{14}$ and $R^{15}$ are the same or different and are each hydrogen atom or a methyl group; $R^{16}$ is a t-butyl group, a 2-tetrahydrofuranyl group, a 2-tetrahydropyranyl group or an 2-oxepanyl group; and n denotes an integer from 1 to 3;

with the proviso that when the polymeric compound contains a monomer unit of Formulae (IIg), the polymeric compound further comprises at least one of Formulae (IIa), (IIb), (IIc), (IId), (IIe), (IIf), (IIIa), (IIIb), (IIIc), (IIId), (IIIe), (IIIf) and (IIIg)

wherein Formulae (IIIa) to (IIIg) have the following formulae:

(IIIa) 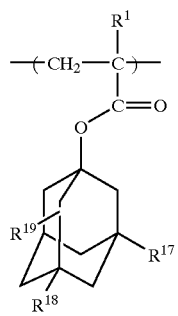

(IIIb) 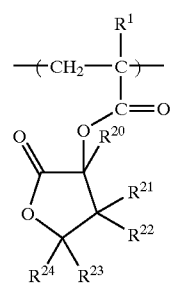

(IIIc) 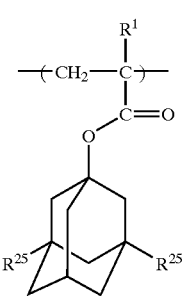

(IIId) 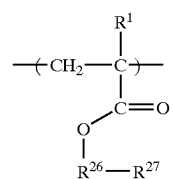

(IIIe) 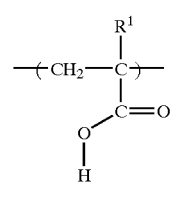

(IIIf)

(IIIg) 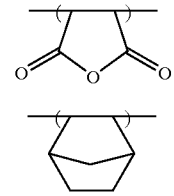

wherein $R^1$ is a hydrogen atom or a methyl group; $R^{17}$ and $R^{18}$ are the same or different and are each a hydrogen atom, a hydroxyl group or a carboxyl group; $R^{19}$ is a hydroxyl group, an oxo group or a carboxyl group; $R^{20}$, $R^{21}$, $R^{22}$, $R^{23}$ and $R^{24}$ are the same or different and are each a hydrogen atom or a methyl group; $R^{25}$ is a hydrogen atom or a methyl group; $R^{26}$ is a tricyclo[5.2.1.0$^{2,6}$]decylmethyl group, a tetracyclo[4.4.0.1$^{2,5}$.1$^{7,10}$]dodecylmethyl group, a norbornyl group, an isobornyl group or a 2-norbornylmethyl group; and $R^{27}$ is a substituent of $R^{26}$ and is a hydrogen atom, a hydroxyl group, a hydroxymethyl group, a carboxyl group or a —COOR$^{28}$ group, where $R^{28}$ is a t-butyl group, a 2-tetrahydrofuranyl group, a 2-tetrahydropyranyl group or an 2-oxepanyl group.

8. The polymeric compound for photoresist according to claim 7, having a molecular weight distribution (Mw/Mn) of from about 1.8 to about 3.5.

9. A method of manufacturing a semiconductor, the method comprising the steps of applying the resin composition for photoresist as claimed in claim 7 onto a base or substrate to thereby form a resist film; and subjecting the resist film to exposure and development to thereby produce a pattern.

* * * * *